(12) United States Patent
Murofushi et al.

(10) Patent No.: US 8,399,569 B2
(45) Date of Patent: Mar. 19, 2013

(54) REACTIVE URETHANE COMPOUND HAVING ETHER BOND, CURABLE COMPOSITION, AND CURED MATERIAL

(75) Inventors: Katsumi Murofushi, Minato-ku (JP); Nobuaki Ishii, Minato-ku (JP); Miyuki Tomita, Minato-ku (JP); Yotaro Hattori, Minato-ku (JP); Yoshifumi Urakawa, Minato-ku (JP)

(73) Assignee: Showa Denko K.K., Tokyo (JP)

( * ) Notice: Subject to any disclaimer, the term of this patent is extended or adjusted under 35 U.S.C. 154(b) by 488 days.

(21) Appl. No.: 12/600,794

(22) PCT Filed: May 21, 2008

(86) PCT No.: PCT/JP2008/059370
§ 371 (c)(1),
(2), (4) Date: Nov. 18, 2009

(87) PCT Pub. No.: WO2008/146685
PCT Pub. Date: Dec. 4, 2008

(65) Prior Publication Data
US 2010/0160557 A1 Jun. 24, 2010

(30) Foreign Application Priority Data
May 23, 2007 (JP) .................. 2007-136665

(51) Int. Cl.
C08F 273/00 (2006.01)
(52) U.S. Cl. .......... 525/291; 525/55; 525/127; 525/296; 526/312
(58) Field of Classification Search .......... 525/55, 525/127, 291, 296; 526/312
See application file for complete search history.

(56) References Cited

U.S. PATENT DOCUMENTS

| | | | |
|---|---|---|---|
| 4,732,951 A | 3/1988 | Ahne et al. | |
| 5,206,417 A | 4/1993 | Boettcher et al. | |
| 5,270,431 A | 12/1993 | Blum | |
| 7,550,556 B1 | 6/2009 | Nakamura et al. | |
| 7,579,066 B2 | 8/2009 | Nozawa et al. | |
| 2005/0038187 A1 | 2/2005 | Mano et al. | |
| 2006/0135707 A1 | 6/2006 | Inomata | |

FOREIGN PATENT DOCUMENTS

| | | |
|---|---|---|
| EP | 1 076 070 A2 | 2/2001 |
| JP | 61-296029 A | 12/1986 |
| JP | 62-000513 A | 1/1987 |
| JP | 64-040513 A | 2/1989 |
| JP | 02-040351 A | 2/1990 |
| JP | 02-150410 A | 6/1990 |
| JP | 02150410 A * | 6/1990 |
| JP | 04-161447 A | 6/1992 |
| JP | 08-311138 A | 11/1996 |
| JP | 10-334731 A | 12/1998 |
| JP | 2003-280187 A | 10/2003 |
| JP | 2003280187 A * | 10/2003 |
| JP | 2007-326045 A | 12/2007 |
| WO | 2006/049264 A1 | 5/2006 |

OTHER PUBLICATIONS

Chemical Abstracts, Chemical Abstracts Service (C A S ), US, Mar. 23, 1992, XP000373751; ISSN: 0009-2258; Abstract No. 116:107062n re JP-A-3-250014, (Nov. 7, 1991).
Extended European Search Report for Application No. 08753047.3—2115 / 2154162 PCT/JP2008059370 dated Jan. 4, 2013.

* cited by examiner

*Primary Examiner* — David W Wu
*Assistant Examiner* — Marie Reddick
(74) *Attorney, Agent, or Firm* — Sughrue Mion, PLLC

(57) ABSTRACT

An object of the present invention is to provide a reactive urethane compound having superior curability, adhesion to substrates, transparency, molecular flexibility, and mechanical properties, a curable composition containing the compound, and a cured material formed from the composition. An ethylenically-unsaturated-group containing reactive urethane compound of the present invention is represented by formula (I):

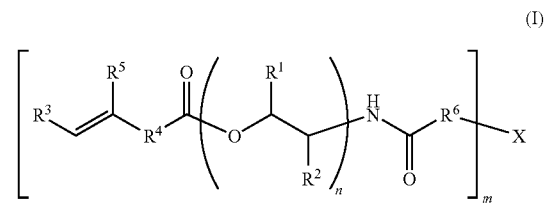

wherein $R^1$ and $R^2$ are each independently a hydrogen atom or an alkylene group; $R^3$ is a hydrogen atom, a alkyl group, or an aryl group; $R^4$ is a single bond or an alkylene group; $R^5$ is a hydrogen atom or a methyl group; $R^6$ is an oxygen atom, a sulfur atom, or an imino group; n is 2 to 12; m is 1 to 300; and X is an aliphatic, aromatic or heterocyclic compound residue.

4 Claims, 14 Drawing Sheets

REACTIVE URETHANE COMPOUND HAVING ETHER BOND, CURABLE COMPOSITION, AND CURED MATERIAL

TECHNICAL FIELD

The present invention relates to novel urethane compounds for use in, for example, coating materials, UV-curable paints, thermosetting paints, molding materials, adhesives, inks, resists, optical materials, photo-shaping materials, printing board materials, dental materials and polymer battery materials, and particularly relates to ethylenically-unsaturated-group containing reactive urethane compounds suitable for use in, for example, coating materials, UV-curable paints, thermosetting paints, adhesives and resists, and to curable compositions containing such reactive urethane compounds and cured materials thereof.

BACKGROUND ART

Resins having reactivity introduced therein are used in various fields, and typical methods for producing such resins include a method of allowing an isocyanate compound to react with various compounds having active hydrogen. Ethylenically-unsaturated-group containing isocyanate compounds are useful compounds that can be used for production of such resins. For example, an ethylenically unsaturated group or an isocyanate group can be introduced into a resin by allowing the isocyanate compound to react with a functional group in the main chain of the resin. It is also possible to form an ethylenically-unsaturated-group containing reactive urethane compound having an unsaturated group in the molecule thereof by forming various bonds such as a urethane bond, a thiourethane bond, a urea bond or an amide bond by allowing the isocyanate compound to react with a compound having active hydrogen.

In addition, the above ethylenically-unsaturated-group containing reactive urethane compounds are required to have functions such as flexibility, high adhesion strength and transparency, and are also required to have high purity in some application fields such as optical materials and polymer electrolytes.

On the other hand, monomers, oligomers or polymers having a urethane bond derived from an isocyanate compound containing a reactive ethylenically unsaturated group are used in a wide variety of fields, including coating materials, UV-curable paints, thermosetting paints, molding materials, adhesives, inks, resists, optical materials, photo-shaping materials, printing board materials, dental materials, polymer battery materials, and raw materials for polymers. Applications of optical materials can be exemplified by antireflection film materials such as for optical lenses, films and CRT glass, cladding materials for optical fibers, and optical adhesives such as for optical fibers and optical lenses.

Patent Document 1 discloses a high-refractive-index resin material, particularly serving as a material for plastic lenses, produced using a compound formed by allowing an unsaturated-group containing isocyanate compound to react with an active hydrogen compound having at least one aromatic compound residue. Patent Document 1, however, discloses no method for imparting or improving the properties, including adhesion to substrates and flexibility, important for applications such as coating materials, UV-curable paints, thermosetting paints, adhesives, and resists.

[Patent Document 1] Japanese Unexamined Patent Application Publication No. HEI-2-150410

DISCLOSURE OF INVENTION

Problems to be Solved by the Invention

An object of the present invention is to provide an ethylenically-unsaturated-group containing reactive urethane compound having a urethane bond, a thiourethane bond or an imino group and having superior curability, adhesion to substrates, transparency, molecular flexibility and mechanical properties, a curable composition containing the ethylenically-unsaturated-group containing reactive urethane compound, and a cured material formed from the curable composition, to provide a reactive polymer having such properties, and to provide production methods and applications thereof. The term "imino group" herein means the group represented by —NH—.

Means for Solving the Problems

The present inventors have found that the above problem can be solved using a reactive urethane compound, a reactive thiourethane compound or a reactive urea compound formed by allowing an unsaturated-group containing isocyanate compound having an ether bond to react with a compound having an aliphatic, aromatic or heterocyclic compound residue containing one or more hydroxyl, mercapto or amino groups as active-hydrogen containing functional groups, or using a reactive polymer formed by allowing the above isocyanate compound to react with a polymer compound including repeating units having active-hydrogen containing functional groups bonded thereto, thus completing the present invention. That is, the present invention is as follows.

[1] An ethylenically-unsaturated-group containing reactive urethane compound represented by formula (I):

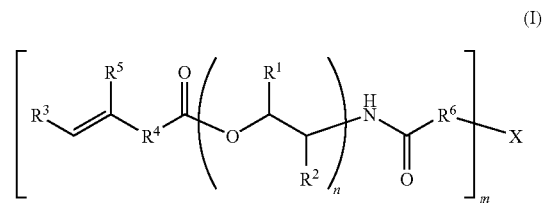

In the formula, $R^1$ and $R^2$ are each independently a hydrogen atom or a linear or branched alkyl group having 1 to 6 carbon atoms; $R^3$ is a hydrogen atom, a linear or branched alkyl group having 1 to 6 carbon atoms, or an aryl group; $R^4$ is a single bond or a linear or branched alkylene group having 1 to 5 carbon atoms; $R^5$ is a hydrogen atom or a methyl group; $R^6$ is an oxygen atom, a sulfur atom, or an imino group; n is an integer of 2 to 12; m is an integer of 1 to 300; and X is an aliphatic compound residue, an aromatic compound residue having no phenolic hydroxyl group, or a heterocyclic compound residue.

[2] The ethylenically-unsaturated-group containing reactive urethane compound according to Item [1], represented by formula (II):

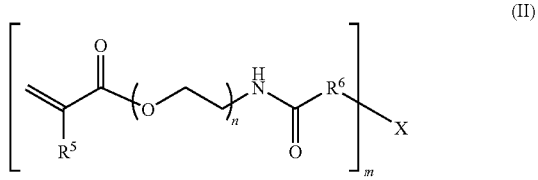

(II)

In the formula, $R^5$, $R^6$, n, m, and X are synonymous with $R^5$, $R^6$, n, m, and X, respectively, in formula (I).

[3] The ethylenically-unsaturated-group containing reactive urethane compound according to Item [2], wherein n is 2 in formula (II).

[4] The ethylenically-unsaturated-group containing reactive urethane compound according to Item [3], wherein $R^6$ is an oxygen atom, X is a fluorine-containing residue, and m is 1 or 2 in formula (II).

[5] The ethylenically-unsaturated-group containing reactive urethane compound according to Item [4], wherein, in formula (II), $R^6$ is an oxygen atom and X is a residue represented by formula (III) or (IV):

(III)

(IV)

In the formulas, a is an integer of 1 to 12 and * is a bonding point.

[6] The ethylenically-unsaturated-group containing reactive urethane compound according to Item [3], wherein $R^6$ is an oxygen atom, X is an aromatic compound residue having no phenolic hydroxyl group, and m is 2 in formula (II).

[7] The ethylenically-unsaturated-group containing reactive urethane compound according to Item [6], wherein, in formula (II), $R^6$ is an oxygen atom and X is a residue represented by formula (V) or (VI):

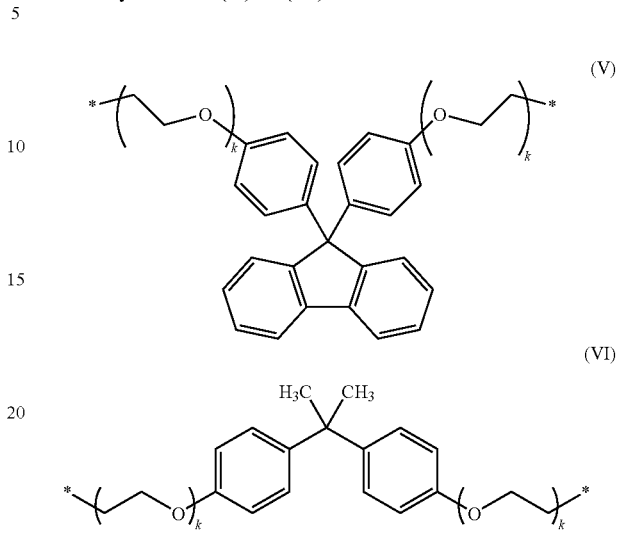

(V)

(VI)

In the formulas, k is each independently an integer of 1 to 4 and * is a bonding point.

[8] The ethylenically-unsaturated-group containing reactive urethane compound according to Item [3], wherein, in formula (II), $R^6$ is an oxygen atom and X is an alcohol residue of an alkylene glycol having an alkylene group that may be branched and that has 2 to 10 carbon atoms, diethylene glycol, dipropylene glycol, glycerol, trimethylolpropane, pentaerythritol, dipentaerythritol, cyclohexanediol, cyclohexane dimethanol, norbornene dimethanol, hydrogenated bisphenol A, tris-2-hydroxyethyl isocyanurate, 2-hydroxyethyl(meth)acrylate, 4-hydroxybutyl(meth)acrylate, norbornene methanol, or an alkylene monool having an alkylene group that may be branched or cyclic and that has 2 to 10 carbon atoms.

[9] An ethylenically-unsaturated-group containing reactive urethane compound represented by formula (XIV):

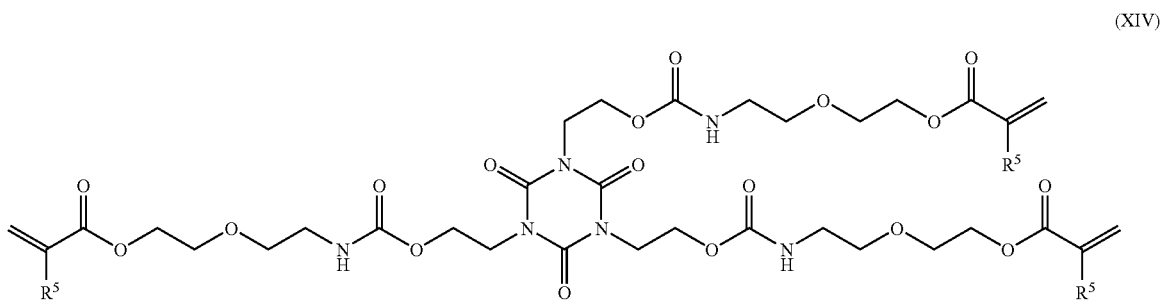

(XIV)

In the formula, $R^5$ is a hydrogen atom or a methyl group.

[10] The ethylenically-unsaturated-group containing reactive urethane compound according to Item [3], wherein $R^6$ is an oxygen atom and X is a structure containing an unsaturated group in formula (II).

[11] The ethylenically-unsaturated-group containing reactive urethane compound according to Item [2], wherein formula (II) is represented by formula (VII):

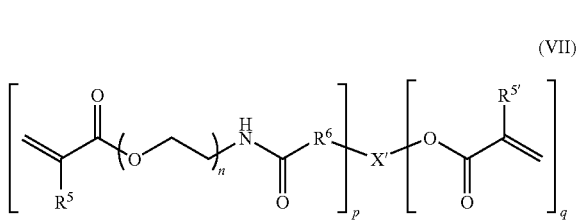
(VII)

In the formula, $R^5$ and $R^{5'}$ are each independently a hydrogen atom or a methyl group; $R^6$ is an oxygen atom, a sulfur atom, or —NH—; n is synonymous with n in formula (II); p is an integer of 2 to 12; q is an integer of 2 to 12; and X' is an aliphatic compound residue, an aromatic compound residue having no phenolic hydroxyl group, or a heterocyclic compound residue.

[12] An ethylenically-unsaturated-group containing reactive urethane compound represented by formula (XV) or (XVI):

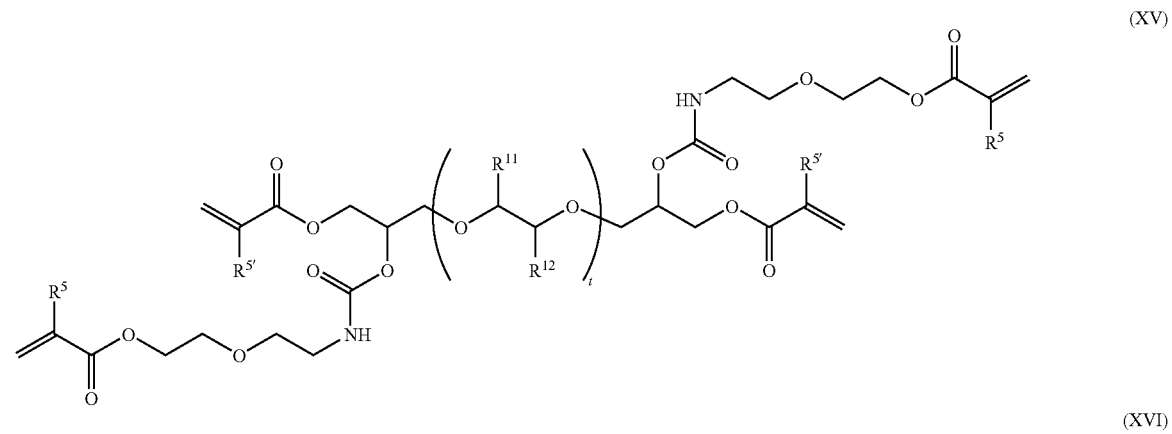
(XV)

(XVI)

In the formulas, $R^{11}$, $R^{12}$, $R^{13}$, and $R^{14}$ are each independently a hydrogen atom or a linear or branched alkyl group having 1 to 6 carbon atoms; $R^5$ and $R^{5'}$ are a hydrogen atom or a methyl group; and t is an integer of 0 or 1 to 4.

[13] The ethylenically-unsaturated-group containing reactive urethane compound according to Item [3], wherein $R^6$ is a sulfur atom and X is an aliphatic compound residue in formula (II).

[14] The ethylenically-unsaturated-group containing reactive urethane compound according to Item [3], wherein, in formula (II), $R^6$ is a sulfur atom and X is a thiol residue of a mercapto-group containing ester compound formed by reaction between an alcohol compound and a carboxyl-group containing thiol compound represented by formula (X):

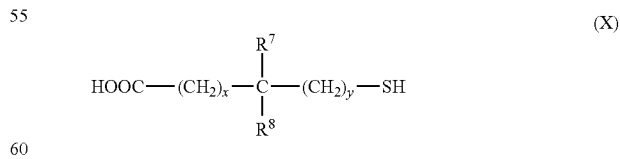
(X)

In the formula, $R^7$ and $R^8$ are each independently a hydrogen atom, an alkyl group having 1 to 10 carbon atoms, or an aromatic ring; x is an integer of 0 or 1 to 2; and y is 0 or 1.

[15] An ethylenically-unsaturated-group containing reactive urethane compound represented by formula (XVII) or (XVIII):

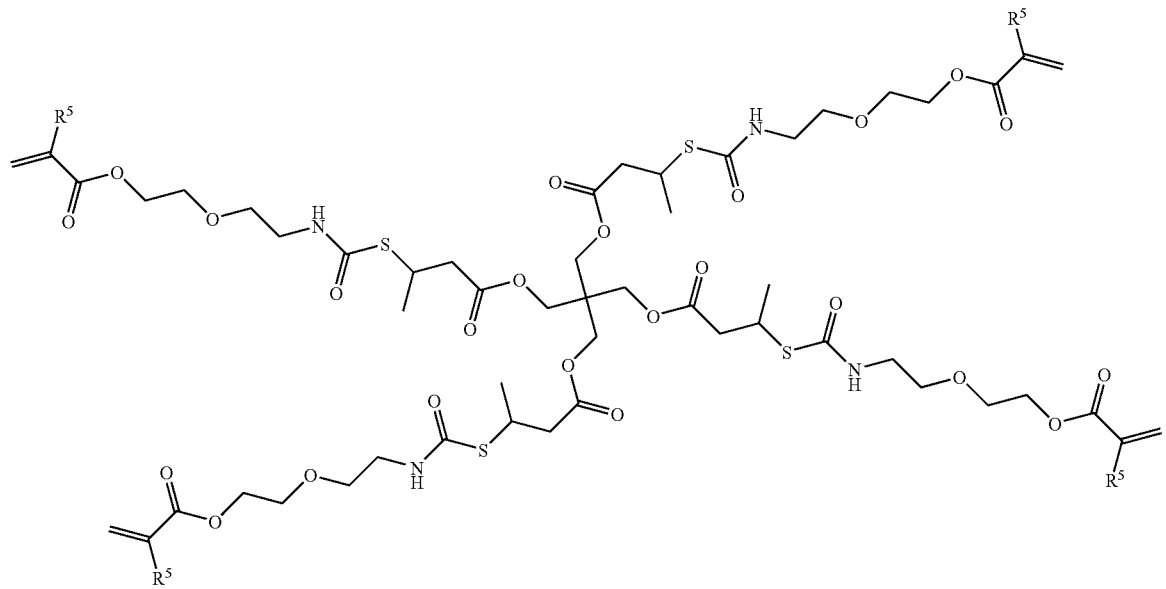
(XVII)

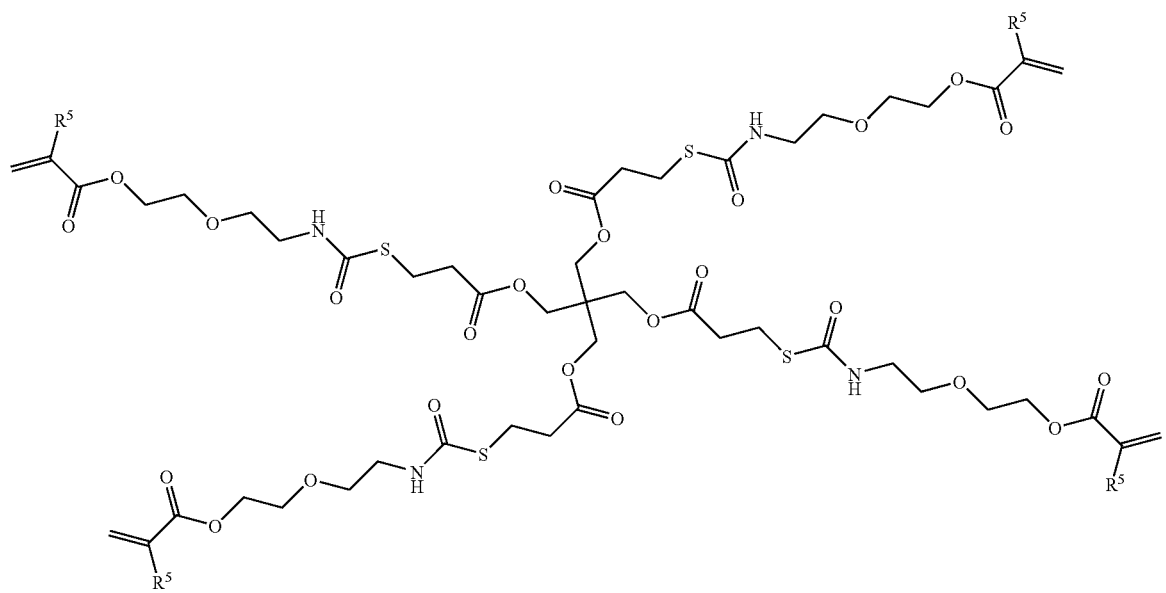
(XVIII)

In the formulas, $R^5$ is a hydrogen atom or a methyl group.

[16] The ethylenically-unsaturated-group containing reactive urethane compound according to Item [3], wherein $R^6$ is an imino group and X is an aliphatic compound residue in formula (II).

[17] The ethylenically-unsaturated-group containing reactive urethane compound according to Item [3], wherein, in formula (II), X is a polymer compound residue that has repeating units containing a functional group having active hydrogen and that has a molecular weight of 2,000 to 100,000.

[18] The ethylenically-unsaturated-group containing reactive urethane compound according to Item [17], wherein the functional group having active hydrogen is a hydroxyl group, and the polymer compound is a polyhydroxy compound.

[19] The ethylenically-unsaturated-group containing reactive urethane compound according to Item [18], wherein the polyhydroxy compound is a polyester polyol compound, a polycarbonate polyol compound, a polyether polyol compound, a polyurethane polyol compound, a homopolymer or copolymer of a hydroxyalkyl(meth)acrylate, or an epoxy (meth)acrylate compound.

[20] The ethylenically-unsaturated-group containing reactive urethane compound according to Item [18], wherein the polyhydroxy compound contains a carboxyl group.

[21] A curable composition containing the ethylenically-unsaturated-group containing reactive urethane compound (A) according to Item [1] and a polymerization initiator (B).

[22] The curable composition according to Item [21], further containing a reactive monomer (C).

[23] The curable composition according to Item [21], wherein the SP of the ethylenically-unsaturated-group containing reactive urethane compound (A) is 10.5 to 11.0.

[24] The curable composition according to Item [22], wherein the total SP of the ethylenically-unsaturated-group containing reactive urethane compound (A) and the reactive monomer (C) is 10.5 to 11.0.

[25] A cured material formed by curing the curable composition according to Item [21].

Effect of the Invention

According to the present invention, an unsaturated-group containing isocyanate compound having an ether bond can be used to provide a cured material having superior properties such as flexibility and adhesion strength.

According to the present invention, additionally, a curable composition having superior sensitivity and developability can be provided as a photosensitive composition for color filters that is used for production of optical color filters for use in, for example, color televisions, liquid crystal display devices, solid-state imaging devices and cameras.

In addition, a curable composition having superior flexibility, heat resistance, chemical resistance, plating resistance and the like can be provided as a photosensitive composition for solder resists that is used, for example, for an insulating protective film on a printed circuit board.

Furthermore, a reactive polymer of the present invention formed by reaction between an isocyanate compound and a polyhydroxy compound having repeating units can be used to provide, for example, a curable composition that has superior curing rate and sensitivity when cured with ultraviolet light or heat, or a curable composition having high adhesion, high heat-resistance temperature and superior chemical resistance.

BEST MODES FOR CARRYING OUT THE INVENTION

Figure 1:
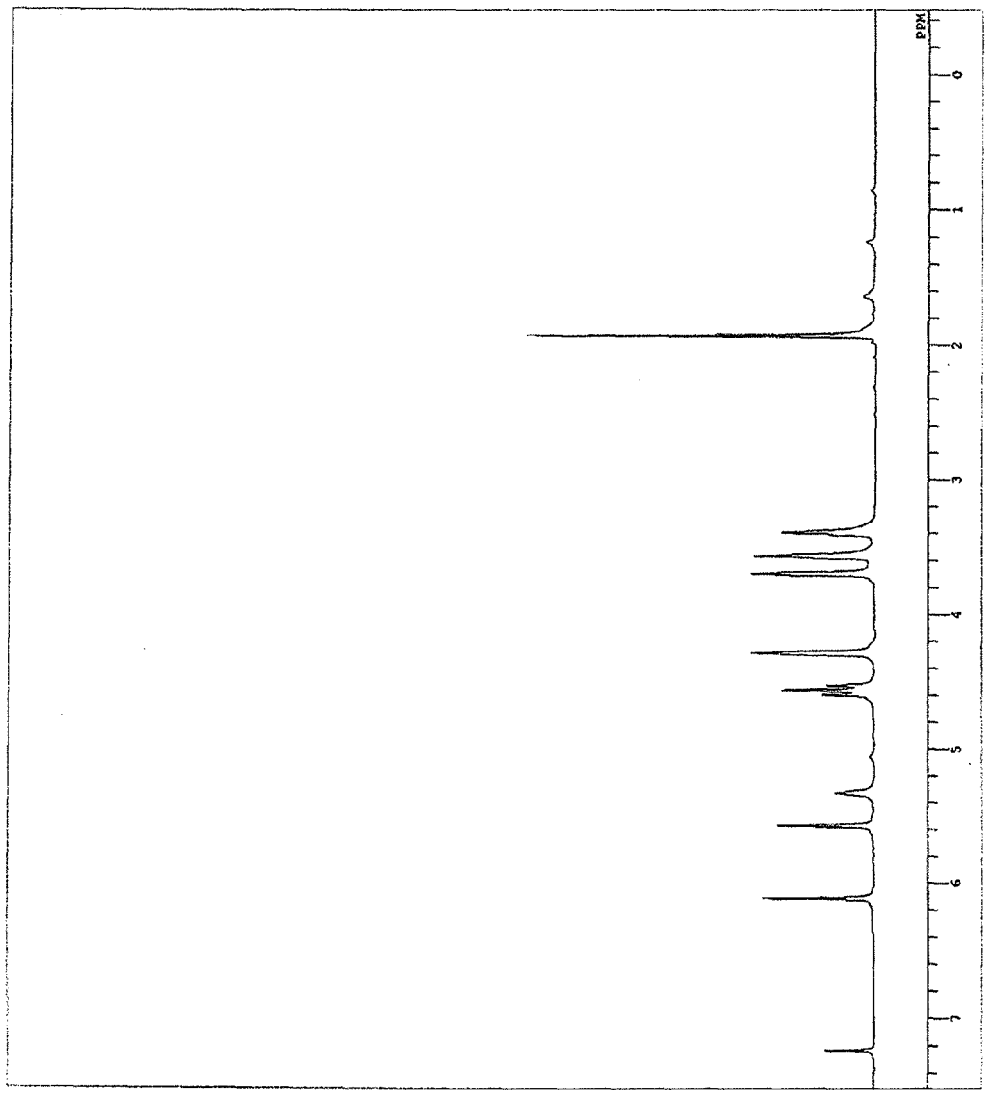
FIG. 1 shows the $^1$H-NMR spectrum of a reactive urethane compound (M-1) of the present invention synthesized in the examples.
Figure 2:
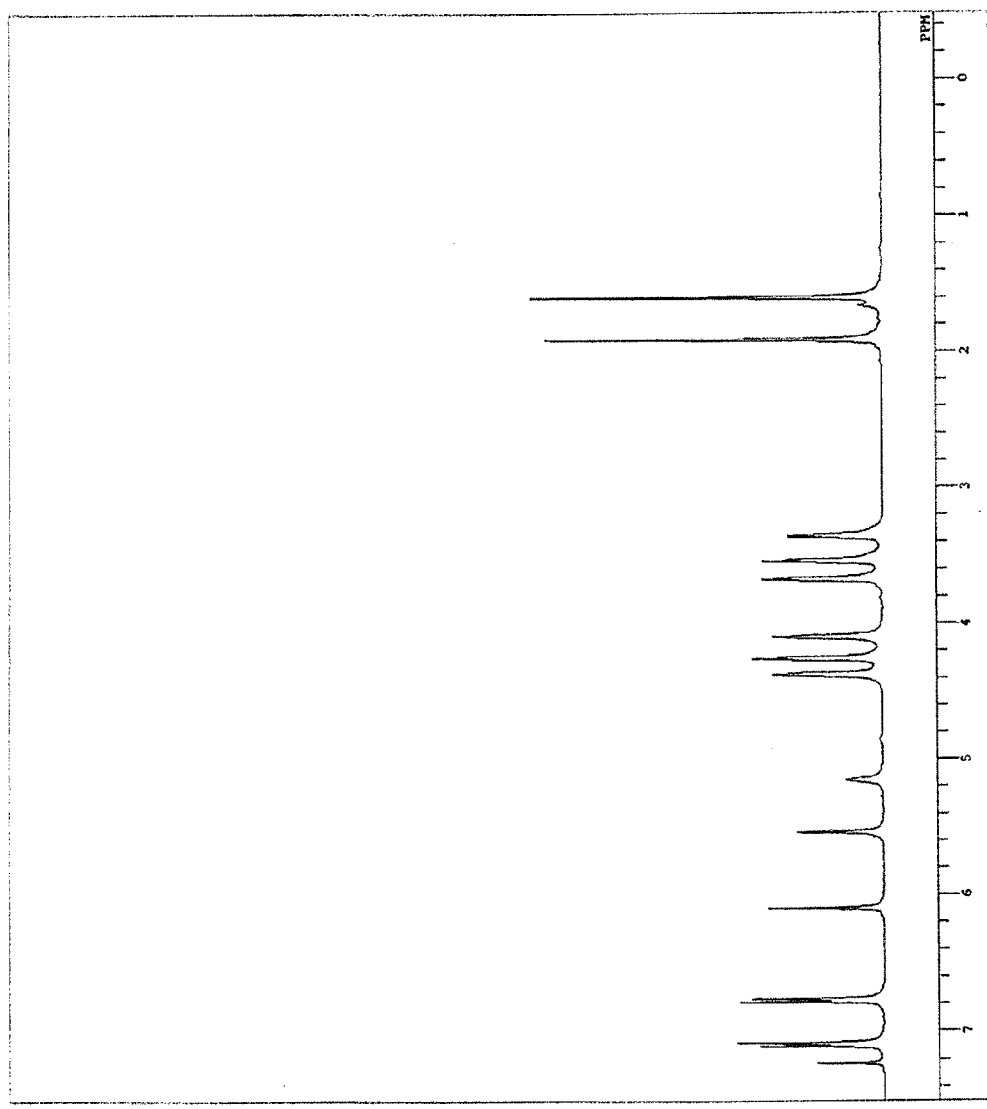
FIG. 2 shows the $^1$H-NMR spectrum of a reactive urethane compound (M-2) of the present invention synthesized in the examples.
Figure 3:
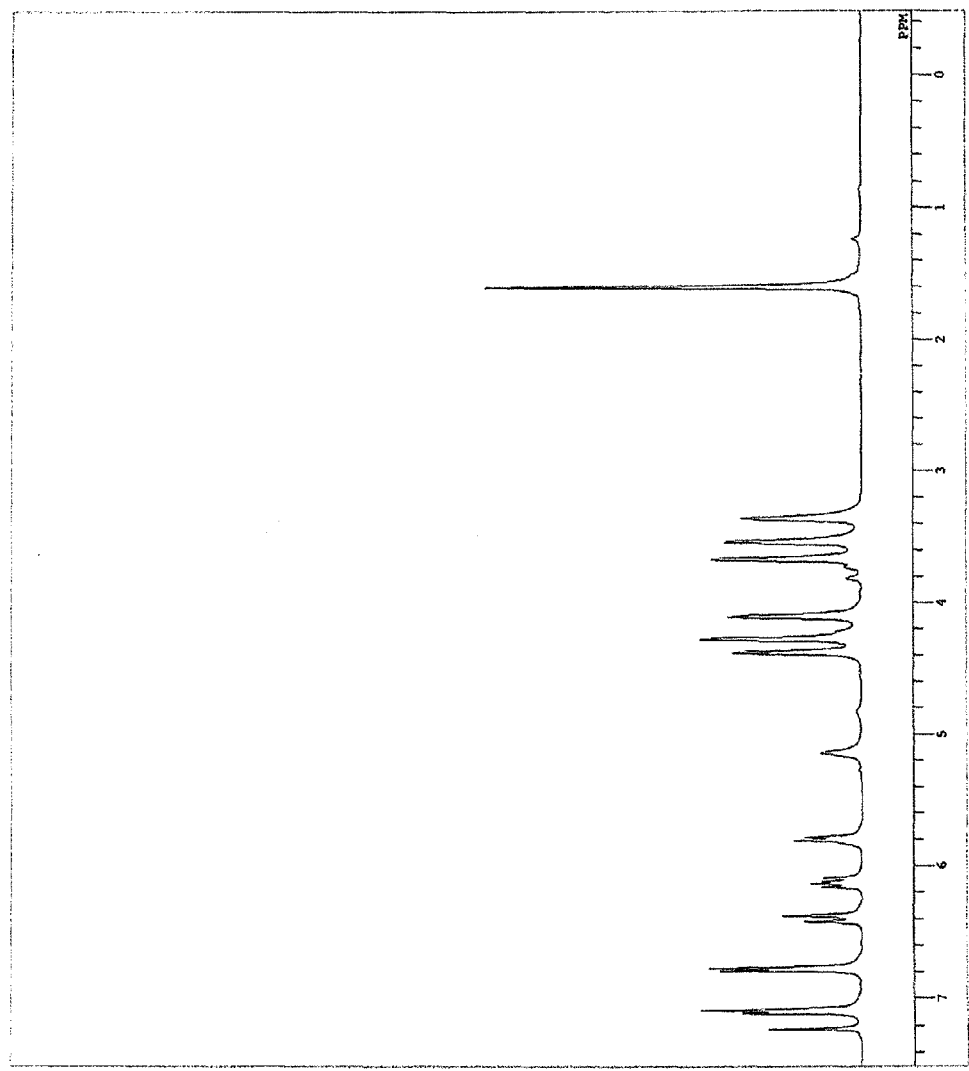
FIG. 3 shows the $^1$H-NMR spectrum of a reactive urethane compound (M-3) of the present invention synthesized in the examples.
Figure 4:
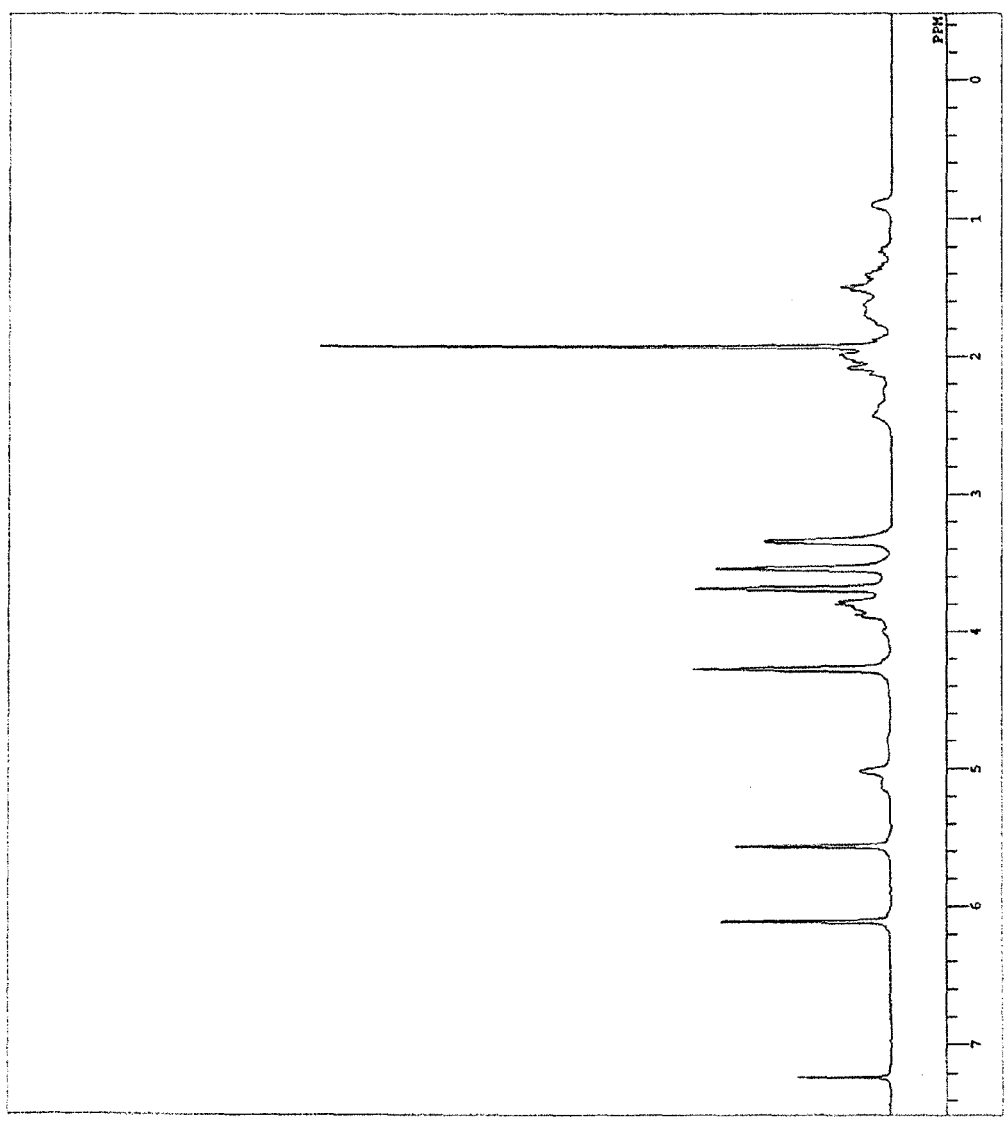
FIG. 4 shows the $^1$H-NMR spectrum of a reactive urethane compound (M-4) of the present invention synthesized in the examples.
Figure 5:
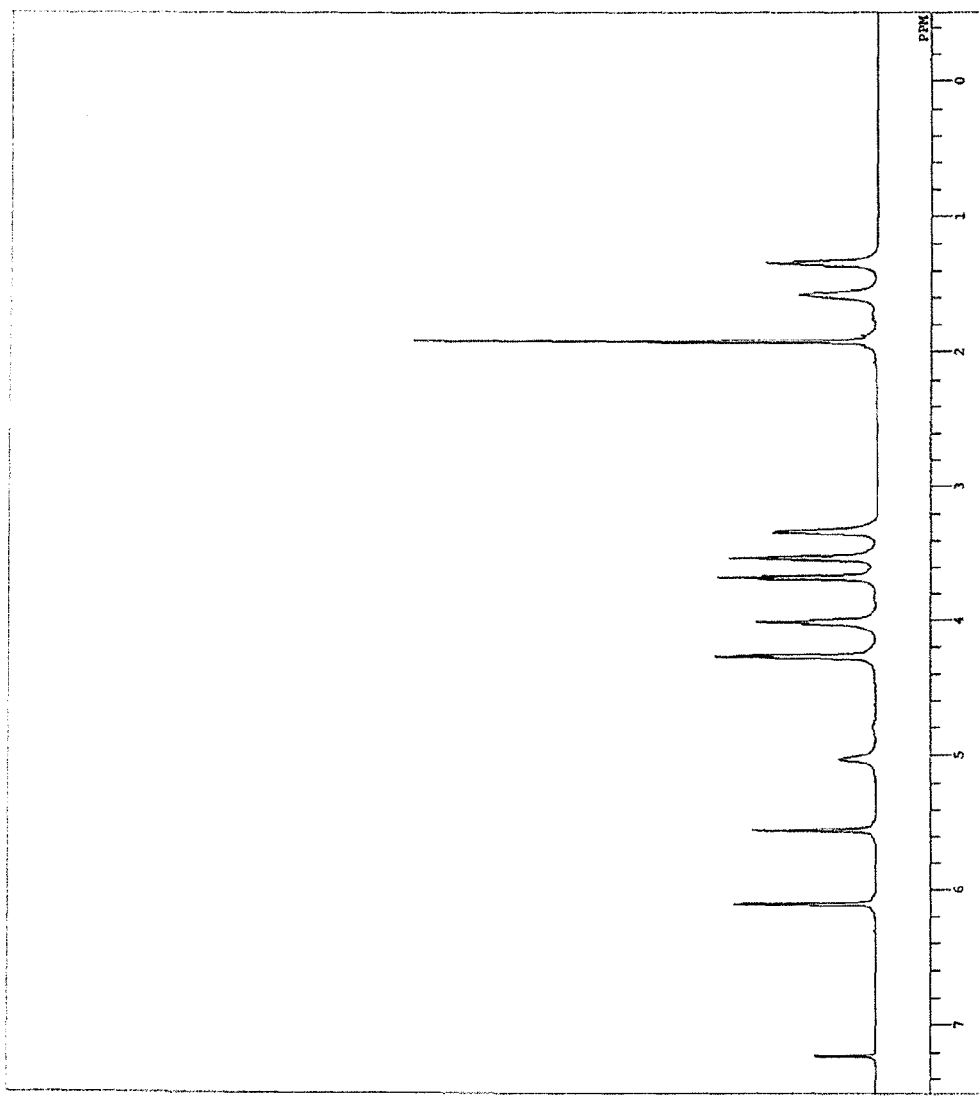
FIG. 5 shows the $^1$H-NMR spectrum of a reactive urethane compound (M-5) of the present invention synthesized in the examples.
Figure 6:
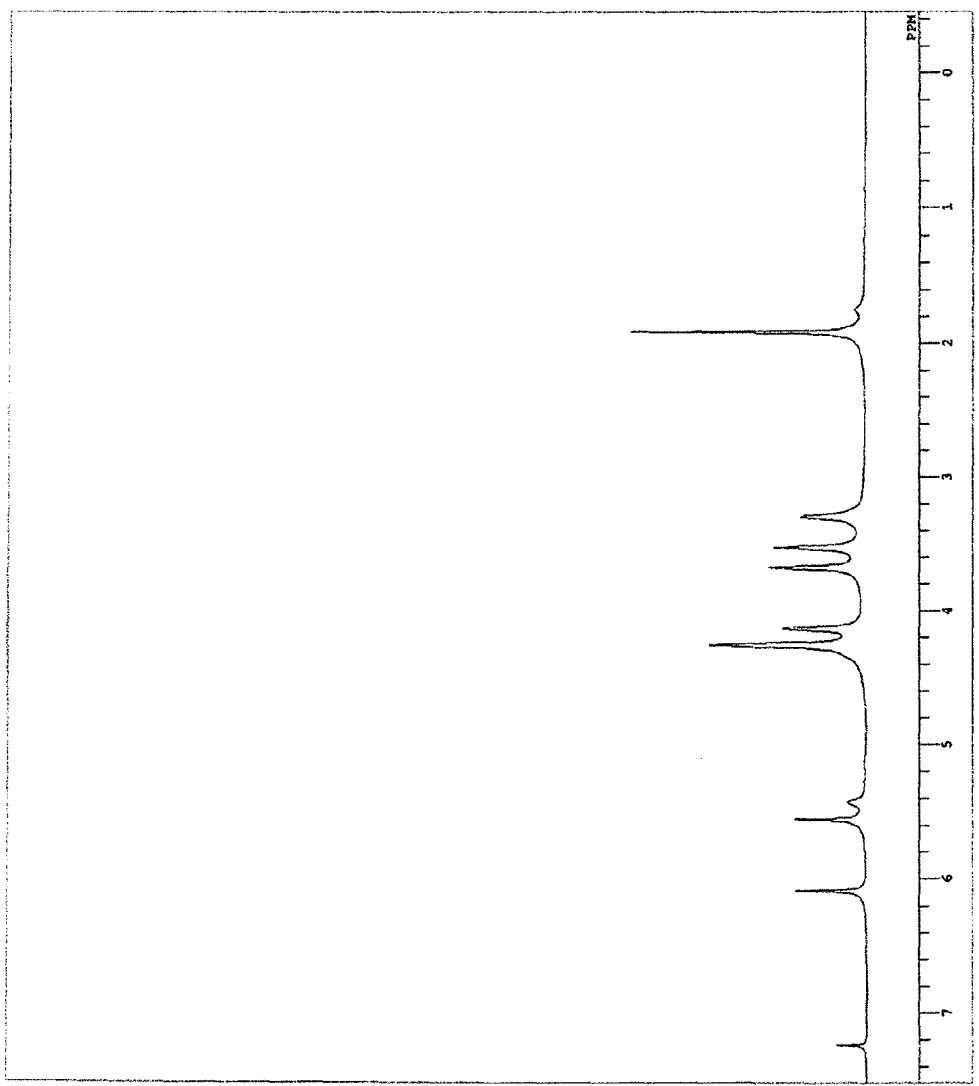
FIG. 6 shows the $^1$H-NMR spectrum of a reactive urethane compound (M-6) of the present invention synthesized in the examples.
Figure 7:
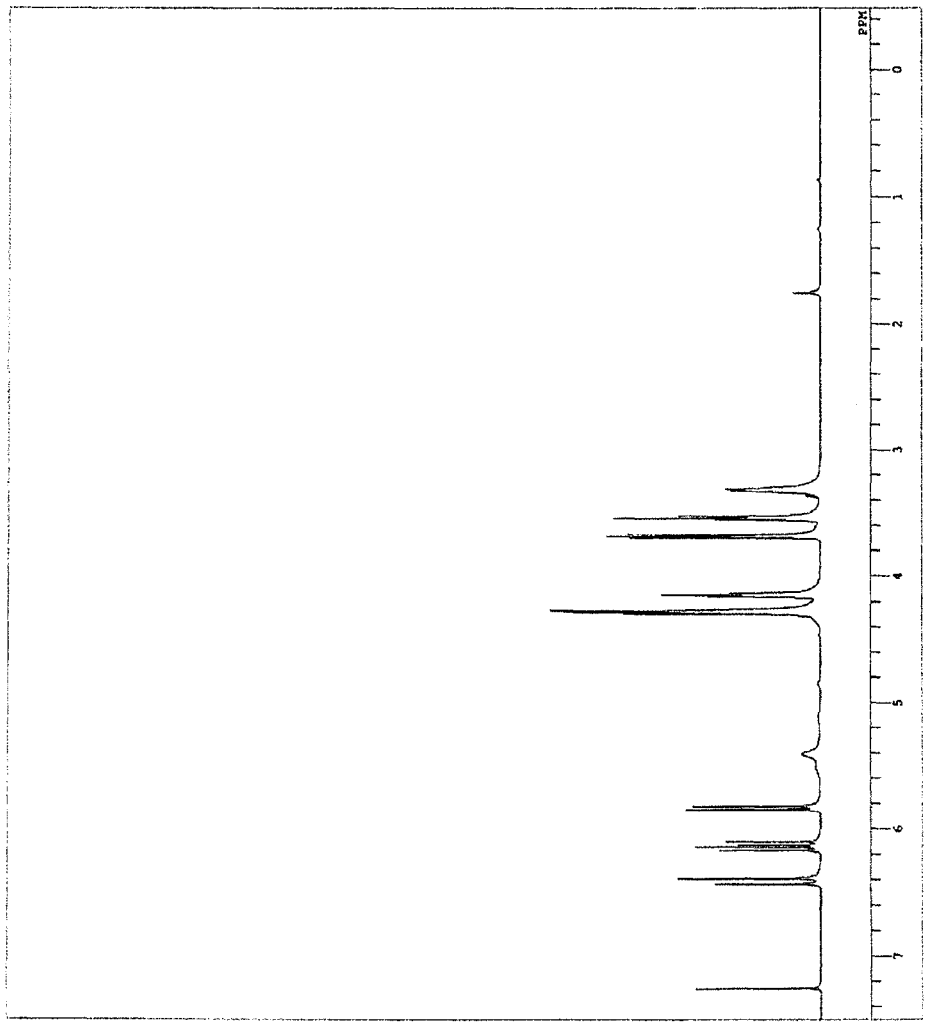
FIG. 7 shows the $^1$H-NMR spectrum of a reactive urethane compound (M-7) of the present invention synthesized in the examples.
Figure 8:
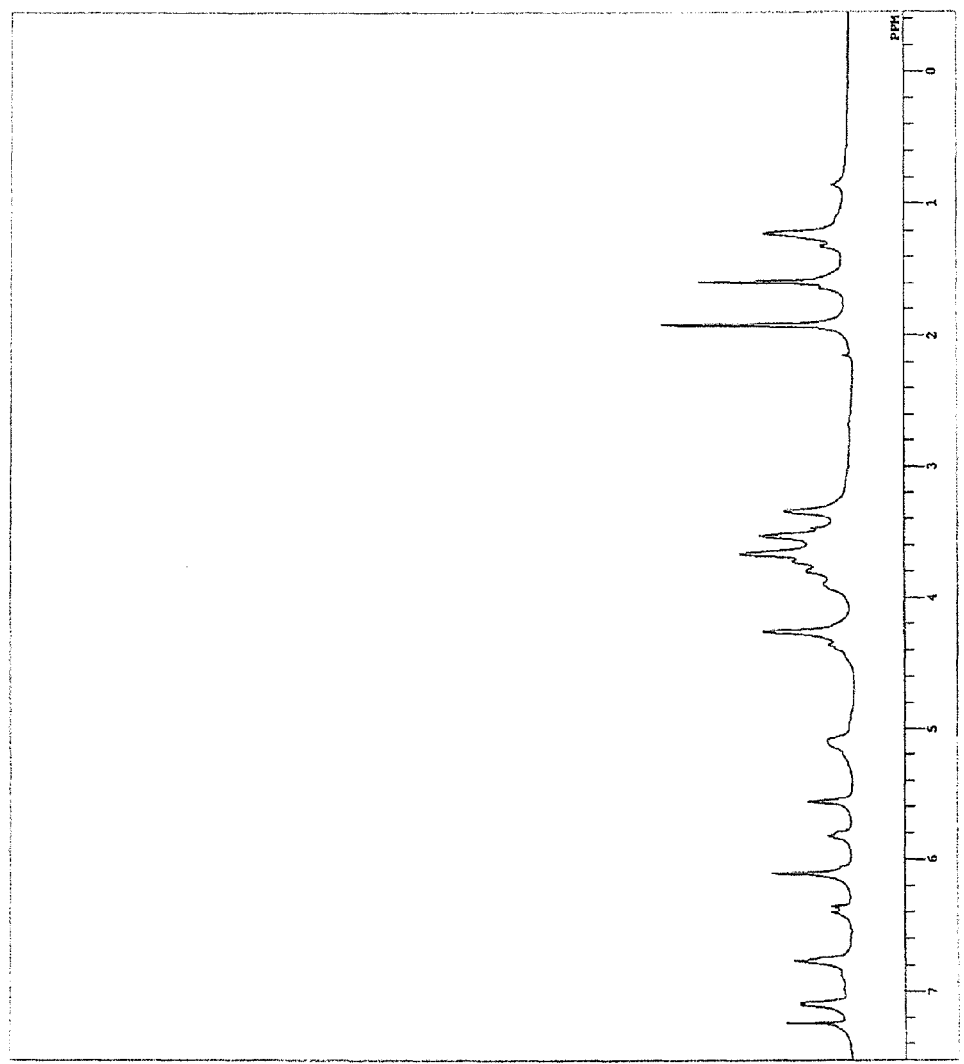
FIG. 8 shows the $^1$H-NMR spectrum of a reactive urethane compound (M-8) of the present invention synthesized in the examples.
Figure 9:
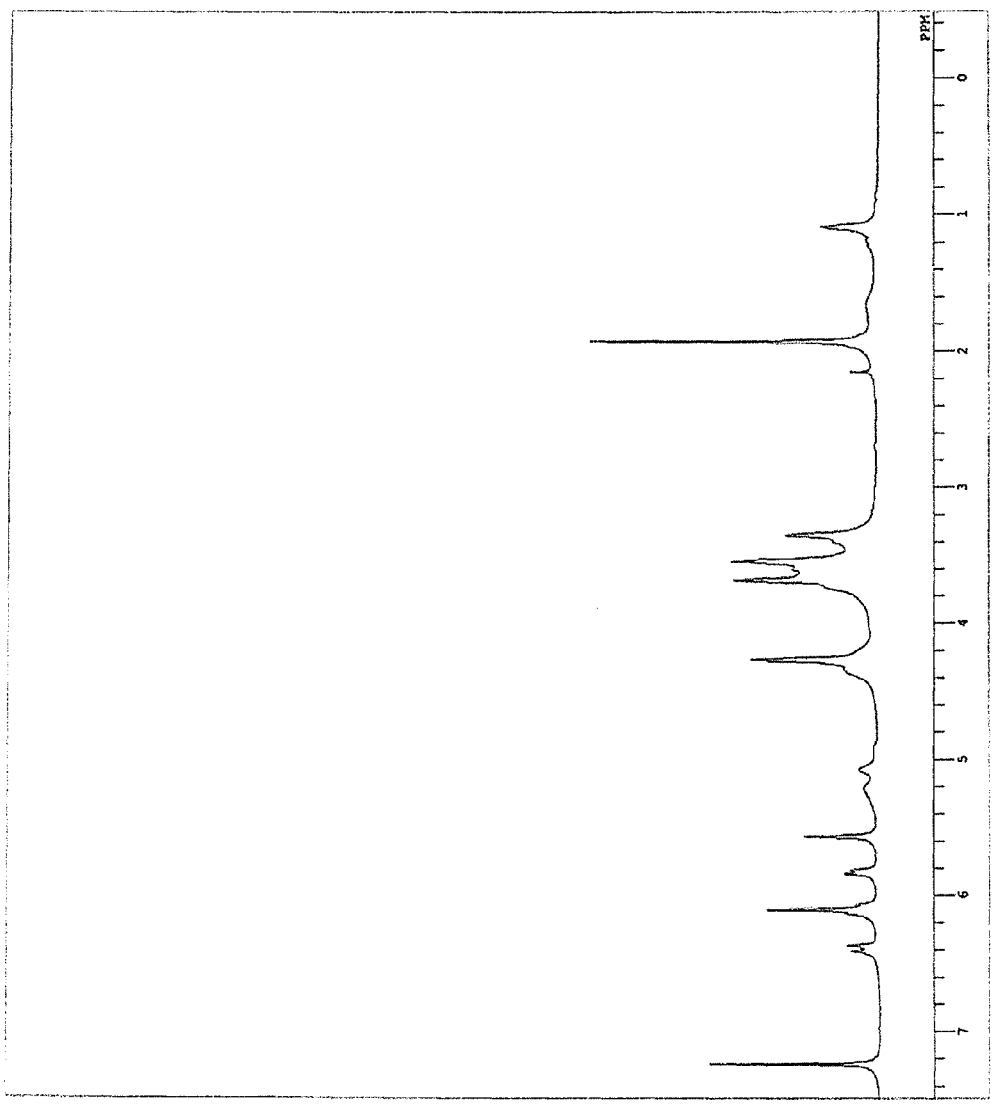
FIG. 9 shows the $^1$H-NMR spectrum of a reactive urethane compound (M-9) of the present invention synthesized in the examples.
Figure 10:
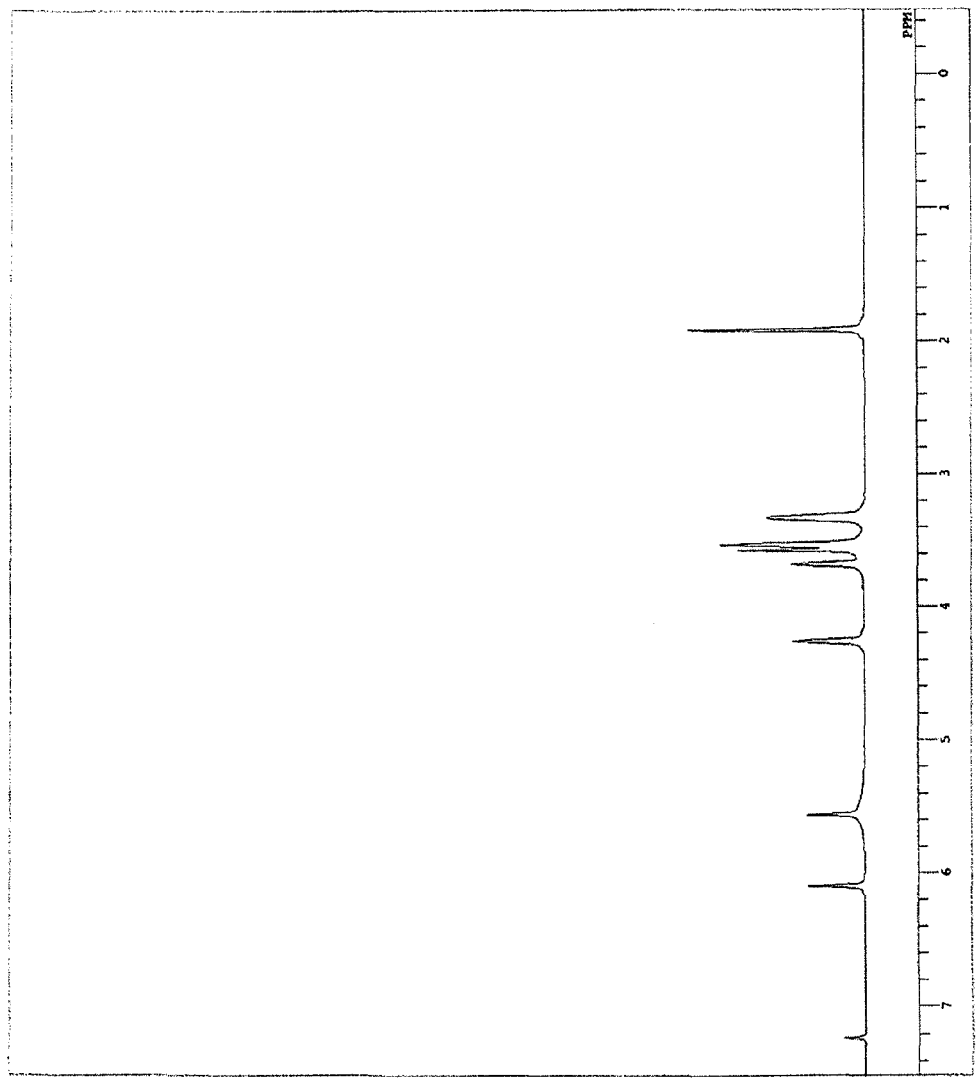
FIG. 10 shows the $^1$H-NMR spectrum of a reactive urethane compound (M-10) of the present invention synthesized in the examples.
Figure 11:
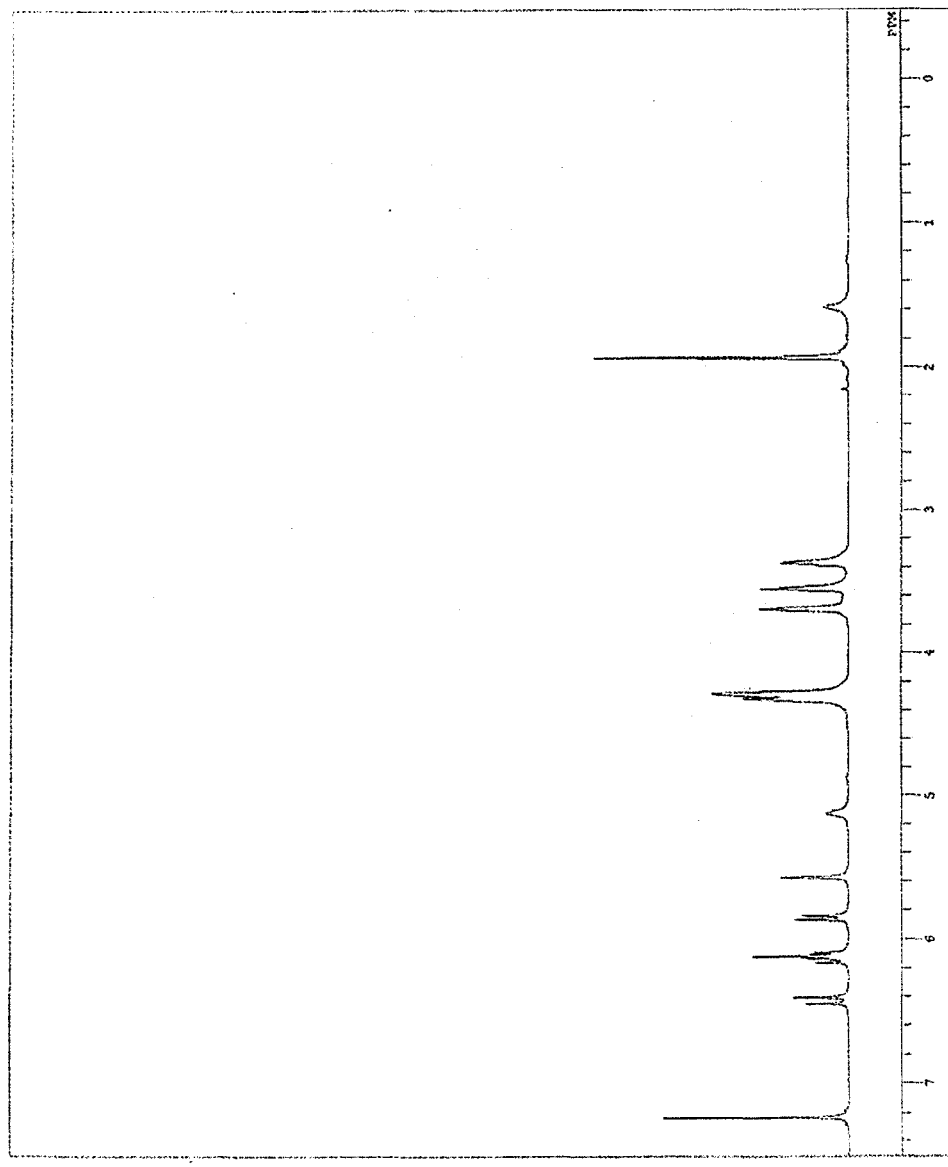
FIG. 11 shows the $^1$H-NMR spectrum of a reactive urethane compound (M-11) of the present invention synthesized in the examples.
Figure 12:
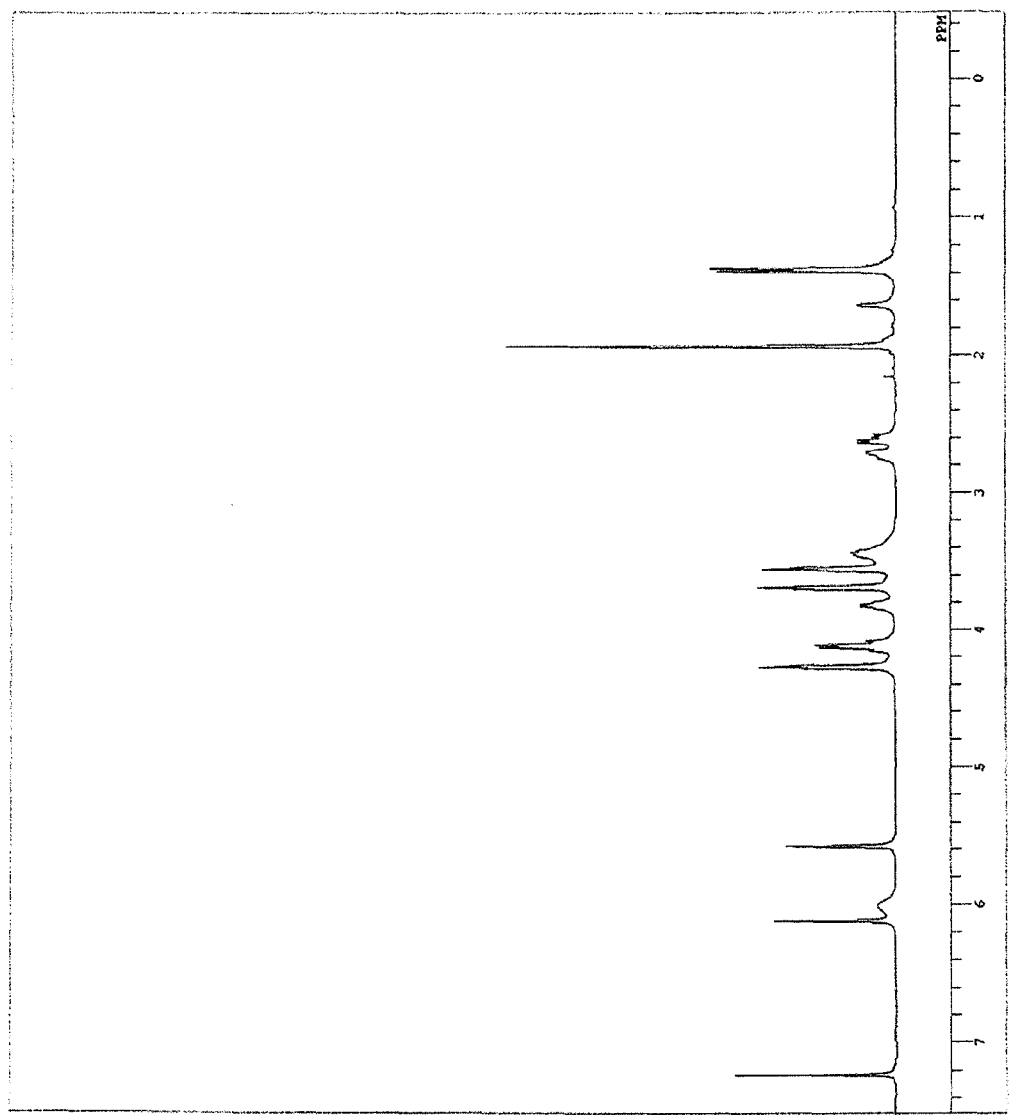
FIG. 12 shows the $^1$H-NMR spectrum of a reactive urethane compound (M-12) of the present invention synthesized in the examples.

The present invention will now be described in detail. The expressions like (meth)acrylates herein all mean methacrylates and/or acrylates. In addition, the cis-trans relationship describing configuration is not particularly distinguished; both are encompassed.

i) Ethylenically-Unsaturated-Group Containing Reactive Urethane Compound (A)

An ethylenically-unsaturated-group containing reactive urethane compound (A) of the present invention (hereinafter also referred to in a simplified manner such as "the urethane compound (A) of the present invention" or "the reactive urethane compound (A)") is represented by formula (I):

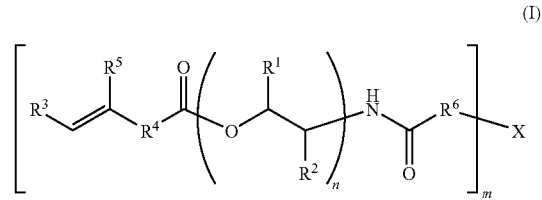

In formula (I), $R^1$ and $R^2$ are each independently a hydrogen atom or a linear or branched alkyl group having 1 to 6 carbon atoms, preferably, a hydrogen atom or a methyl group. $R^3$ is a hydrogen atom, a linear or branched alkyl group having 1 to 6 carbon atoms, or an aryl group, preferably, a hydrogen atom, a methyl group or an aryl group. $R^4$ is a single bond or a linear or branched alkylene group having 1 to 5 carbon atoms, preferably, a single bond. $R^5$ is a hydrogen atom or a methyl group. $R^6$ is an oxygen atom, a sulfur atom, or an imino group. The subscript n is an integer of 2 to 12, preferably 2 to 6, more preferably 2 to 4. The subscript m is an integer of 1 to 300, preferably 2 to 200, more preferably 2 to 100, particularly preferably 2 to 20. The value of m is equal to the number of bonds of X; for example, if m=2, formula (I) takes the form of [ ]—X—[ ]. X is an aliphatic compound residue, an aromatic compound residue having no phenolic hydroxyl group, or a heterocyclic compound residue, preferably, an aliphatic compound residue.

The aliphatic compound residue for the above substituent X is a group including a linear, branched, or cyclic carbon chain and having 1 to 300 substitutable positions. Examples of the aliphatic compound residue include linear or branched alkyl groups, linear or branched alkylene groups, and cyclic alkylene groups. In addition, the aliphatic compound residue may have a structure having a heteroatom in the molecule thereof, for example, may contain an ester bond, an ether bond, or an amide bond. In addition, the molecule may contain, for example, a heterocycle, an unsaturated group, or a perfluoro group.

The aromatic compound residue, having no phenolic hydroxyl group, for the above substituent X has 1 to 4 substitutable positions, and examples include a phenyl group, a naphthyl group, an anthryl group, and groups having a fluorene backbone or a bisphenol-A backbone.

The heterocyclic compound residue for the above substituent X is a heterocyclic compound residue having 1 to 4 substitutable positions, and examples include a pyridyl group, a thienyl group, a furyl group, a piperidyl group, an imidazolyl group, and a quinolyl group.

The urethane compound (A) of the present invention can be formed by allowing a compound having active hydrogen to react with an unsaturated-group containing isocyanate compound having an ether bond and represented by formula (XII):

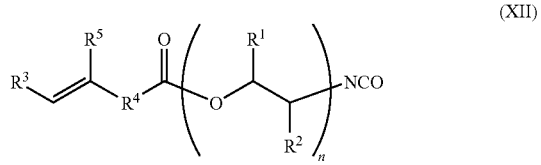

In the formula, $R^1$ to $R^5$ and n are synonymous with $R^1$ to $R^5$ and n, respectively, in formula (I) above.

A preferred specific example of the urethane compound (A) of the present invention is a compound represented by formula (II):

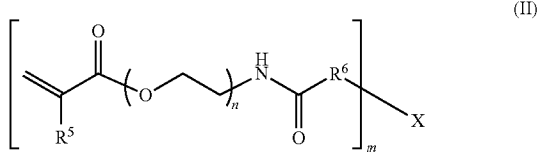

In the formula, $R^5$, $R^6$, m, n, and X are synonymous with $R^5$, $R^6$, m, n, and X, respectively, in formula (I) above. Particularly preferably, n is 2 in formula (II) above.

The urethane compound (A) of the present invention, having an ethylenically unsaturated group, can be optically or thermally cured by, for example, radical polymerization or cationic polymerization. In addition, because the urethane compound (A) has an oxyalkylene group in the molecule thereof, the resultant adduct has relatively low viscosity. Thus, curing a curable composition containing the urethane compound (A) of the present invention yields a cured material with high flexibility and also results in superior adhesion strength because the urethane compound (A) relieves stress occurring on the substrate during the curing.

Preferred specific examples of the urethane compound (A) of the present invention will now be described. The essence of the present invention lies in the fact that it provides the effects attributable to the presence of an oxyalkylene group between an ethylenically unsaturated group and a urethane bond, a thiourethane bond or a urea bond; therefore, the substituent X is not limited to the examples below.

i-a) Reactive Urethane Compound (A) where $R^6$ in Formula (I) is Oxygen Atom
i-a-a) Reactive Urethane Compound (A) Containing Perfluoro Group An example of a reactive urethane compound (A) containing a perfluoro group is a compound where X in formula (I) above is a fluorine-containing residue. An example of the fluorine-containing residue X is a residue represented by formula (III) or (IV):

In the formulas, a is an integer of 1 to 12, and * is a site (bonding point) bonded to $R^6$ in formula (I).

The above reactive urethane compound (A) containing a perfluoro group can be synthesized using a perfluoroalcohol (polyol).

A specific example of a perfluoro group where m=1 in formula (I) above is a fluoroalkyl group. The fluoroalkyl group preferably has 1 to 20 carbon atoms, more preferably 1 to 10 carbon atoms, may have a linear structure (such as —$CF_2CF_3$, —$CH_2(CF_2)_8CF_3$, or —$CH_2CH_2(CF_2)_8F$), a branched structure (such as —$CH(CF_3)_2$ or —$CH_2CF(CF_3)_2$), or an alicyclic structure (preferably a five- or six-membered ring such as a perfluorocyclohexyl group, a perfluorocyclopentyl group, or an alkyl group substituted thereby), and may have an ether bond.

Examples of the above fluoroalkyl group having an ether bond include —$CH_2OCH_2CF_2CF_3$, —$CH_2CH_2OCH_2C_4F_8H$, —$CH_2CH_2OCH_2CH_2C_8F_{17}$, and —$CH_2CH_2OCF_2CF_2OCF_2CF_2H$. Among others, a particularly preferred example is a group represented by —$(CH_2)_g(CF_2)_hF$ (where g is an integer of 0 to 2, h is an integer of 0 to 8, and g and h are not simultaneously 0).

Examples of perfluoro groups where m=2 in formula (I) above include perfluoroalkyldiols such as 2,2,3,3,4,4,5,5-octafluoro-1,6-hexanediol and 2,2,3,3,4,4,5,5,6,6,7,7-dodecafluoro-1,8-octanediol; perfluoroalkylene glycols such as perfluorotriethylene glycol and perfluorotetraethylene glycol; polyperfluoroalkylene ether diols such as α-(1,1-difluoro-2-hydroxyethyl)-ω-(2,2-difluoroethanol)poly(oxy-1,1,2,2-tetrafluoroethylene), α-(1,1-difluoro-2-hydroxyethyl)-ω-(2,2-difluoroethanol)poly(oxy-difluoromethylene) and α-(1,1-difluoro-2-hydroxyethyl)-ω-(2,2-difluoroethanol)poly(oxy-difluoromethylene)(oxy-1,1,2,2-tetrafluoroethylene); ring-opened diols from fluoroalkyl epoxides such as 3-perfluorobutyl-1,2-epoxypropane, 3-perfluorooctyl-1,2-epoxypropane and 3-perfluorobutyl-1,2-epoxypropane; and an alcohol residue of 2,2-bis(4-hydroxycyclohexyl)hexafluoropropane. The term "alcohol residue" herein means a structure left after removing an OH group from an alcohol. Also available are groups resulting from diols formed by adding an alkylene oxide such as ethylene oxide or propylene oxide to the above fluorine-containing diols.

The fluorine content of the above reactive urethane compound (A) containing a perfluoro group is preferably 30% by weight or more, more preferably 40% by weight or more, still more preferably 50% by weight or more, based on the total amount of the reactive urethane compound (A). If the fluorine content is low, the reactive urethane compound (A) has a high refractive index and may therefore fail to provide the properties to serve as a low-refractive-index material when used as antireflection films or cladding materials. For example, if the fluorine content is low, the refractive index may be 1.45 or more; such a refractive index is inappropriate for a low-refractive-index material. Preparing a composition using the above reactive urethane compound (A) containing a perfluoro group as a component allows the fluorine content to be 50% by weight or more based on the total amount of the composition.

The above reactive urethane compound (A) containing a perfluoro group, yielding a material with a very low refractive index, is suitable for use in, for example, coating agents.

i-a-b) Reactive Urethane Compound (A) Containing Aromatic Compound Residue having no Phenolic Hydroxyl Group An example of a reactive urethane compound (A) containing an aromatic compound residue having no phenolic hydroxyl group is a compound where X in formula (I) is a group having, for example, a fluorene backbone or a bisphenol-A backbone and where m=2 to 4. An example of such a substituent X is a group represented by formula (V) or (VI):

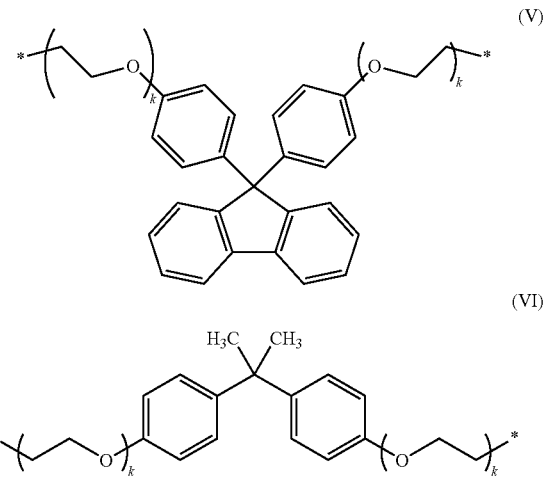

In the formulas, k is each independently an integer of 1 to 4, more preferably an integer of 1 to 2, and * is a bonding point.

The above reactive urethane compound (A) containing an aromatic compound residue has a high refractive index and high heat resistance originating from the aromatic ring and is suitable for use in, for example, antireflection films and resist compositions.

i-a-c) Reactive Urethane Compound (A) Containing Aliphatic Compound Residue

An example of a reactive urethane compound (A) containing an aliphatic compound residue is a compound where the substituent X is an alcohol residue of an alkylene glycol having an alkylene group that may be branched and that has 2 to 10 carbon atoms, diethylene glycol, dipropylene glycol, glycerol, trimethylolpropane, pentaerythritol, dipentaerythritol, cyclohexanediol, cyclohexane dimethanol, tricyclodecane dimethanol, norbornene dimethanol, hydrogenated bisphenol A, norbornene methanol, or an alkylene monool having an alkylene group that may be branched or cyclic and that has 2 to 10 carbon atoms, and where n=2 to 6.

Of the above, a reactive urethane compound (A) where the substituent X is an alcohol residue of 1,4-butanediol, ethylene glycol, trimethylolpropane, pentaerythritol, dipentaerythritol, or tricyclodecane dimethanol is preferred for ease of handling.

i-a-d) Reactive Urethane Compound (A) Formed from Alcohol Compound Containing Unsaturated Group An example of a reactive urethane compound (A) formed from an alcohol compound containing an unsaturated group is a compound represented by formula (VII):

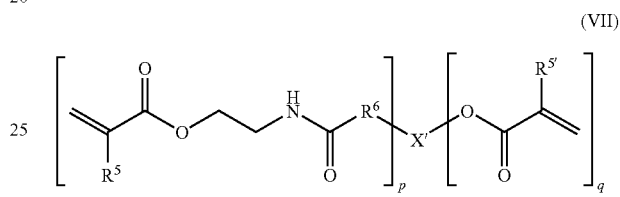

In the formula, $R^5$ and $R^{5'}$ are each independently a hydrogen atom or a methyl group; $R^6$ is an oxygen atom, a sulfur atom, or —NH—; n is synonymous with n in formula (II); p is an integer of 2 to 12; q is an integer of 2 to 12; and X' is an aliphatic compound residue, an aromatic compound residue having no phenolic hydroxyl group, or a heterocyclic compound residue. X' is a partial structure constituting the substituent X in formula (I) above together with q unsaturated groups ($CH_2$=C($R^{5'}$)COO—).

A more specific example of the reactive urethane compound (A) formed from an alcohol compound containing an unsaturated group is a reactive urethane compound (A) where the substituent X in formula (I) above is an alcohol residue of 2-hydroxyethyl(meth)acrylate, 2-hydroxypropyl(meth)acrylate, 2-hydroxybutyl(meth)acrylate, 2-hydroxy-3-phenoxypropyl(meth)acrylate, 4-hydroxybutyl(meth)acrylate, 2-(meth)acryloyloxyethyl-2-hydroxypropyl phthalate, glycerol di(meth)acrylate, 2-hydroxy-3-(meth)acryloyloxypropyl(meth)acrylate, o-phenylphenoxy glycidyl ether(meth)acrylate, pentaerythritol triacrylate, or a compound represented by formula (VIII) or (IX):

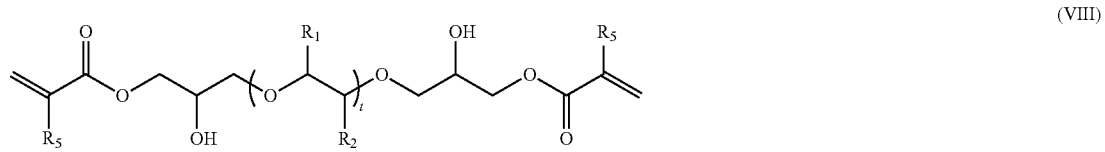

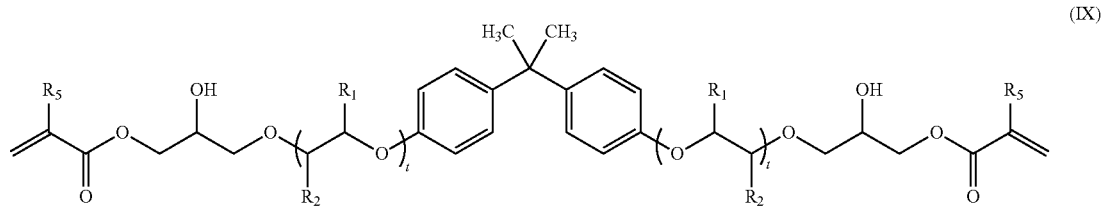

In the formulas, $R^1$ and $R^2$ are each independently a hydrogen atom or a linear or branched alkylene group having 1 to 6 carbon atoms, $R^5$ is a hydrogen atom or a methyl group, and t is an integer of 0 or 1 to 4.

The reactive urethane compound (A) formed from an alcohol compound containing an unsaturated group, having a crosslinking point in the substituent X, provides a material with high curability, hardness and strength. In view of the above effect, an alcohol compound having two or more unsaturated groups is preferably used. On the other hand, a reactive urethane compound (A) formed from a compound having one unsaturated group and one hydroxyl group has low viscosity and is suitable for use as a diluent monomer.

i-a-e) Reactive Urethane Compound (A) Containing Isocyanurate Backbone

A preferred example of a reactive urethane compound (A) containing an isocyanurate backbone is one where the substituent X is an alcohol residue of tris(2-hydroxyethyl)isocyanurate, and the residue structure is represented by formula (XI):

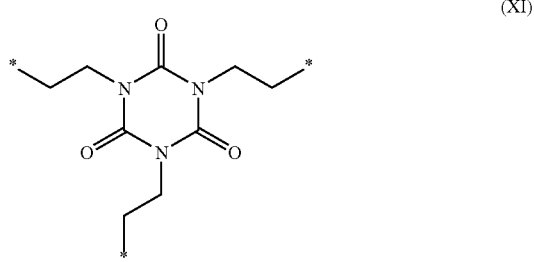

i-a-f) Reactive Urethane Compound (A) having Repeating Units

An example of a reactive urethane compound (A) having repeating units is a compound where the substituent X is a polymer compound residue that has repeating units containing a functional group having active hydrogen and that has a number average molecular weight (value determined on a polystyrene basis by gel permeation chromatography (mass PC)) of 2,000 to 100,000. The number average molecular weight of the polymer compound is preferably 4,000 to 60,000, more preferably 6,000 to 40,000. If the number average molecular weight is low, the coating strength tends to decrease; if the number average molecular weight is extremely high, developability and flexibility may decrease.

An example of the above polymer compound containing active hydrogen is a polyhydroxy compound having repeating units. Specific examples of the polyhydroxy compound include polyester polyol compounds, polycarbonate polyol compounds, polyether polyol compounds, polyurethane polyol compounds, homopolymers and copolymers of hydroxyalkyl(meth)acrylates, and epoxy(meth)acrylate compounds.

The term "repeating units" herein refers to repeating units having a particular structure derived from some monomer and serving as the structural base of the compound, and a monomer is polymerized to form the above polymer compound. The polymer compound may be a homopolymer of the same monomer or a copolymer of different monomers.

The above reactive urethane compound (A) having repeating units can be formed by allowing the unsaturated-group containing isocyanate compound having an ether bond, represented by formula (XII) above, to react with a polyhydroxy compound having repeating units as described below.

i-a-f-1) Polyester Polyol Compound

A polyester polyol compound used in the present invention is a compound having two or more hydroxyl groups and one or more ester bonds in one molecule, and specific examples include polyester-based polyols formed from polyalcohols and polybasic acid esters and polylactone-based diols such as polycaprolactone diol and polybutyrolactone diol. Polyester polyol compounds synthesized so that a carboxyl group remains can also be used.

i-a-f-2) Polycarbonate Polyol Compound

A polycarbonate polyol used in the present invention is a compound having two or more hydroxyl groups and one or more carbonate bonds in one molecule. Preferred among others is a compound represented by formula (XIII):

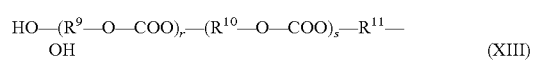

In formula (XIII), $R^9$, $R^{10}$, and $R^{11}$ are each independently a linear, branched or cyclic hydrocarbon group that has 2 to 30 carbon atoms and that may have a hydroxyl group and/or a carboxyl group, and r and s are each independently an integer of 0 to 100.

Preferably, $R^9$, $R^{10}$, and $R^{11}$ are alkylene groups having 2 to 12 carbon atoms, and specific examples include an ethylene group, a trimethylene group, a tetramethylene group, a pentamethylene group, a hexamethylene group, a propylene group, a 2,2-dimethyl-1,3-propylene group, a 1,2-cyclohexylene group, a 1,3-cyclohexylene group, and a 1,4-cyclohexylene group.

The above polycarbonate polyol compound can be formed by, for example, reaction between a diaryl carbonate such as diphenyl carbonate and a polyol such as ethylene glycol, tetramethylene glycol, hexamethylene glycol, trimethylolethane, trimethylolpropane, glycerol, or sorbitol.

i-a-f-3) Polyether Polyol Compound

A polyether polyol compound used in the present invention is preferably a compound having a structure formed by dehydration condensation of two or more alkylene glycols. Such a compound is produced by, for example, condensation of alkylene glycols or ring-opening polymerization of alkylene oxides.

Specific examples of alkylene glycols include ethylene glycol, propylene glycol, 1,4-butanediol, 1,3-butanediol, 1,5-pentanediol, neopentyl glycol, 3-methyl-1,5-pentanediol, 1,6-hexanediol, and 1,4-cyclohexane dimethanol.

Specific examples of alkylene oxides include ethylene oxide, propylene oxide, tetrahydrofuran, styrene oxide, and phenyl glycidyl ether.

Specific examples of polyether polyol compounds include polyethylene glycol, polypropylene glycol, ethylene oxide/propylene oxide copolymer, polytetramethylene glycol, and polyhexamethylene glycol.

i-a-f-4) Polyurethane Polyol Compound

A polyurethane polyol compound used in the present invention has two or more hydroxyl groups and one or more urethane bonds in one molecule. It is formed by allowing a polyisocyanate to react with a polyol by any method. During the reaction, the isocyanate compound represented by formula (XII) above may be fed together to produce the above reactive urethane compound (A).

Specific examples of polyisocyanates include diisocyanates such as 2,4-toluene diisocyanate, 2,6-toluene diisocyanate, isophorone diisocyanate, hexamethylene diisocyanate, diphenylmethylene diisocyanate, (o, m, or p)-xylene diisocyanate, methylene bis(cyclohexylisocyanate), trimethylhexamethylene diisocyanate, cyclohexane-1,3-dimethylene diisocyanate, cyclohexane-1,4-dimethylene diisocyanate, and 1,5-naphthalene diisocyanate. These polyisocyanates may be used singly or in a combination of two or more.

Specific examples of polyols include diol compounds such as ethylene glycol, propylene glycol, 1,4-butanediol, 1,3-butanediol, 1,5-pentanediol, neopentyl glycol, 3-methyl-1,5-pentanediol, 1,6-hexanediol, and 1,4-cyclohexane dimethanol; triol compounds such as glycerol and trimethylolpropane; pentaerythritol; dipentaerythritol; and diglycerol.

The polyol compound used can also be a polyol compound having a carboxyl group, such as a dihydroxy aliphatic carboxylic acid; it is preferred in that a carboxyl group can be introduced into the above reactive urethane compound (A) to impart alkali developability.

Examples of such a polyol compound having a carboxyl group include dimethylolpropionic acid and dimethylolbutanoic acid. These may be used singly or in a combination of two or more.

The polyol used may also be the polyester polyol compound of (i-a-f-1) above, the polycarbonate polyol compound of (i-a-f-2) above, or the polyether polyol compound of (i-a-f-3) above.

i-a-f-5) Homopolymer or Copolymer of hydroxyalkyl(meth)acrylate

A homopolymer or copolymer of a hydroxyalkyl(meth) acrylate used in the present invention is a polymer formed by homopolymerization or copolymerization of one or more hydroxyalkyl(meth)acrylates by any method. Specific examples of the hydroxyalkyl(meth)acrylates used herein include 2-hydroxyethyl(meth)acrylate, hydroxypropyl (meth)acrylate, hydroxybutyl(meth)acrylate, glycerol mono (meth)acrylate, glycerol di(meth)acrylate, trimethylolpropane mono(meth)acrylate, pentaerythritol mono(meth) acrylate, dipentaerythritol mono(meth)acrylate, ditrimethylolpropane mono(meth)acrylate, trimethylolpropane-alkylene-oxide-adduct mono(meth)acrylate, 2-hydroxy-3-phenoxypropyl acrylate, polyethylene glycol(meth) acrylate, and 6-hydroxyhexanoyloxyethyl(meth)acrylate.

Of these, 2-hydroxyethyl(meth)acrylate, hydroxypropyl (meth)acrylate, and hydroxybutyl(meth)acrylate are preferable, and 2-hydroxyethyl(meth)acrylate is more preferable. These (meth)acrylates having a hydroxyl group may be used singly or in a combination of two or more.

A component constituting the copolymer other than the hydroxyalkyl(meth)acrylates is an unsaturated compound capable of copolymerization therewith, and specific examples include alkyl(meth)acrylates such as methyl(meth) acrylate, ethyl(meth)acrylate, propyl(meth)acrylate, butyl (meth)acrylate, isobutyl(meth)acrylate, sec-butyl(meth) acrylate, tert-butyl(meth)acrylate, hexyl(meth)acrylate, octyl (meth)acrylate, isooctyl(meth)acrylate, 2-ethylhexyl(meth) acrylate, decyl(meth)acrylate, lauryl(meth)acrylate, and stearyl(meth)acrylate; alicyclic(meth)acrylates such as cyclohexyl(meth)acrylate, bornyl(meth)acrylate, isobornyl (meth)acrylate, dicyclopentenyl(meth)acrylate, and dicyclopentenyloxyethyl(meth)acrylate; aromatic (meth)acrylates such as benzyl(meth)acrylate, phenyl(meth)acrylate, phenylcarbitol(meth)acrylate, nonylphenyl(meth)acrylate, nonylphenylcarbitol(meth)acrylate, and nonylphenoxy(meth) acrylate; (meth)acrylates having an amino group, such as 2-dimethylaminoethyl(meth)acrylate, 2-diethylaminoethyl (meth)acrylate, and 2-tert-butylaminoethyl(meth)acrylate; methacrylates having a phosphorus atom, such as methacryloxyethyl phosphate, bis-methacryloxyethyl phosphate, and methacryloxyethylphenyl acid phosphate (phenyl-P); glycidyl(meth)acrylate; allyl(meth)acrylate; phenoxyethyl acrylate; and morpholinyl(meth)acrylate.

In addition, unsaturated compounds having a carboxyl group or an acid anhydride group may be used, including (meth)acrylic acid, itaconic acid, maleic anhydride, itaconic anhydride, polycaprolactone(meth)acrylate, (meth)acryloyloxyethyl phthalate, and (meth)acryloyloxyethyl succinate.

Also suitable are N-vinyl compounds such as N-vinylpyrrolidone, N-vinylformamide, and N-vinylacetamide and vinyl aromatic compounds such as styrene and vinyltoluene.

i-a-f-6) Epoxy(meth)acrylate Compound

An epoxy(meth)acrylate compound is an epoxy resin having an unsaturated monocarboxylic acid added to an epoxy group; in some cases, it is formed by further allowing a polybasic acid anhydride to react therewith. Specific examples of epoxy resins that can be used herein include bisphenol-A epoxy resin, bisphenol-F epoxy resin, bisphenol-S epoxy resin, novolac epoxy resin, (o, m, p-)cresol novolac epoxy resin, phenolic novolac epoxy resin, naphthol-modified novolac epoxy resin, and halogenated phenolic novolac epoxy resin.

Of these, preferred in terms of photosensitivity are epoxy (meth)acrylate resins having a carboxylic acid group that are formed using as a starting material a novolac-type epoxy resin such as novolac epoxy resin, (o, m, p-)cresol novolac epoxy resin, phenolic novolac epoxy resin, naphthol-modified novolac epoxy resin, or halogenated phenolic novolac epoxy resin.

If the reactive urethane compound (A) of the present invention having repeating units is to be used for a resist, the acid value thereof is preferably 5 to 150 mgKOH/g, more preferably 30 to 120 mgKOH/g. If the acid value falls below 5 mgKOH/g, alkali developability may decrease. On the other hand, if the acid value exceeds 150 mgKOH/g, the properties of a cured film such as alkali resistance and electrical characteristics may be impaired.

Of the above polyhydroxy compounds having repeating units, a compound having a carboxyl group causes the isocyanate represented by formula (XII) above to react with the carboxyl group to form an amide bond, depending on the reaction conditions. This reaction also allows the compound of formula (XII) to be added.

In addition, the isocyanate compound of formula (XII) may be used in combination with an isocyanate compound containing one reactive ethylenically unsaturated group for the reaction with the polymer compound containing a hydroxyl group (or an amino group or a mercapto group). Specific examples of such an isocyanate compound containing one reactive ethylenically unsaturated group include 2-methacryloyloxyethyl isocyanate, 2-acryloyloxyethyl isocyanate, 2-(2-ethylbutenoyloxy)ethyl isocyanate, 2-(2-propylbutenoyloxy)ethyl isocyanate, methacryloyloxymethyl isocyanate, acryloyloxymethyl isocyanate, (2-ethylbutenoyloxy)methyl isocyanate, (2-propylbutenoyloxy)methyl isocyanate, 3-methacryloyloxypropyl isocyanate, 3-acryloyloxypropyl isocyanate, 3-(2-ethylbutenoyloxy)propyl isocyanate, 3-(2-propylbutenoyloxy)propyl isocyanate, 4-methacryloyloxybutyl isocyanate, 4-acryloyloxybutyl isocyanate, 4-(2-ethylbutenoyloxy)butyl isocyanate and 4-(2-propylbutenoyloxy)butyl isocyanate.

i-b) Reactive Urethane Compound (A) Where $R^6$ in Formula (I) is Sulfur Atom i-b-a) Reactive Urethane Compound (A) Formed from Alkylthiol An example of the substituent X where $R^6$ in formula (I) above is a sulfur atom is a group similar to the substituent X, described above, where $R^6$ is an oxygen atom. An example of the compound, containing the substituent X, used in this case is a compound having one or more mercapto groups.

Examples of such a compound having one or more mercapto groups include methylmercaptan, ethylmercaptan, propylmercaptan, butylmercaptan, amylmercaptan, hexylmercaptan, heptylmercaptan, octylmercaptan, nonylmercaptan, cyclopentylmercaptan, cyclohexylmercaptan, furfurylmercaptan, thiophenol, thiocresol, ethylthiophenol, benzylmercaptan, 1,2-ethanedithiol, 1,2-propanedithiol, 1,3-propanedithiol, 1,4-butanedithiol, 1,6-hexanedithiol, 1,2,3-propanetrithiol, 1,1-cyclohexanedithiol and 1,2-cyclohexanedithiol. Of these, octylmercaptan, 1,6-hexanedithiol, 2-mercaptoethyl sulfide and 1,4-dimercaptobenzene are preferred.

i-b-b) Reactive Urethane Compound (A) Formed from Thiol Compound Containing Ester Structure An example of a reactive urethane compound (A) formed from a thiol compound containing an ester structure is a compound where the substituent X is a thiol residue of a mercapto-group containing ester compound formed of a carboxyl-group containing thiol compound represented by formula (X) below and an alcohol compound. The term "thiol residue" herein means a structure left after removing an SH group from a thiol compound.

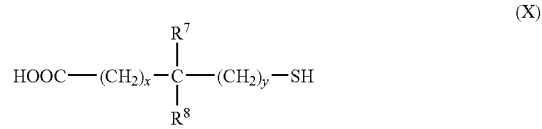

(X)

In the formula, $R^7$ and $R^8$ are each independently a hydrogen atom, an alkyl group having 1 to 10 carbon atoms, or an aromatic ring; x is an integer of 0 or 1 to 2; and y is 0 or 1.

Preferred examples of the above carboxyl-group containing thiol compound include 2-mercaptoglycolic acid, 3-mercaptopropionic acid, 3-mercaptobutyric acid, 2-mercaptoisobutyric acid, 3-mercaptoisobutyric acid, 3-mercaptopropionic acid, 3-mercapto-3-phenylpropionic acid and 3-mercapto-3-methylbutyric acid.

Examples of the above alcohol compound include multifunctional alcohols such as alkylene glycols having an alkylene group that may be branched and that has 2 to 10 carbon atoms, diethylene glycol, dipropylene glycol, glycerol, trimethylolpropane, pentaerythritol, dipentaerythritol, cyclohexanediol, cyclohexane dimethanol, norbornene dimethanol, 2,2-bis[4-(2-hydroxyethyloxy)phenyl]propane, hydrogenated bisphenol A, 4,4'-(9-fluorenylidene)bis(2-phenoxyethanol), and tris-2-hydroxyethyl isocyanurate.

Of the above multifunctional alcohol compounds, 1,4-butanediol, trimethylolpropane, pentaerythritol and tris-2-hydroxyethyl isocyanurate are preferred.

More specific examples of the above reactive urethane compound (A) formed from a thiol compound containing an ester structure are shown below.

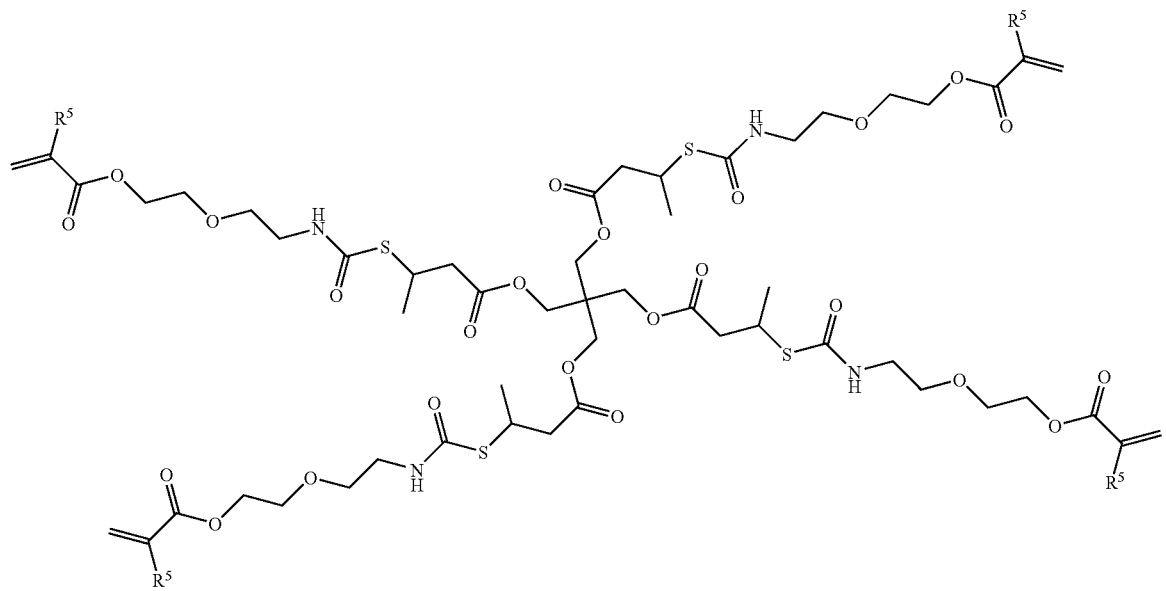

(XVII)

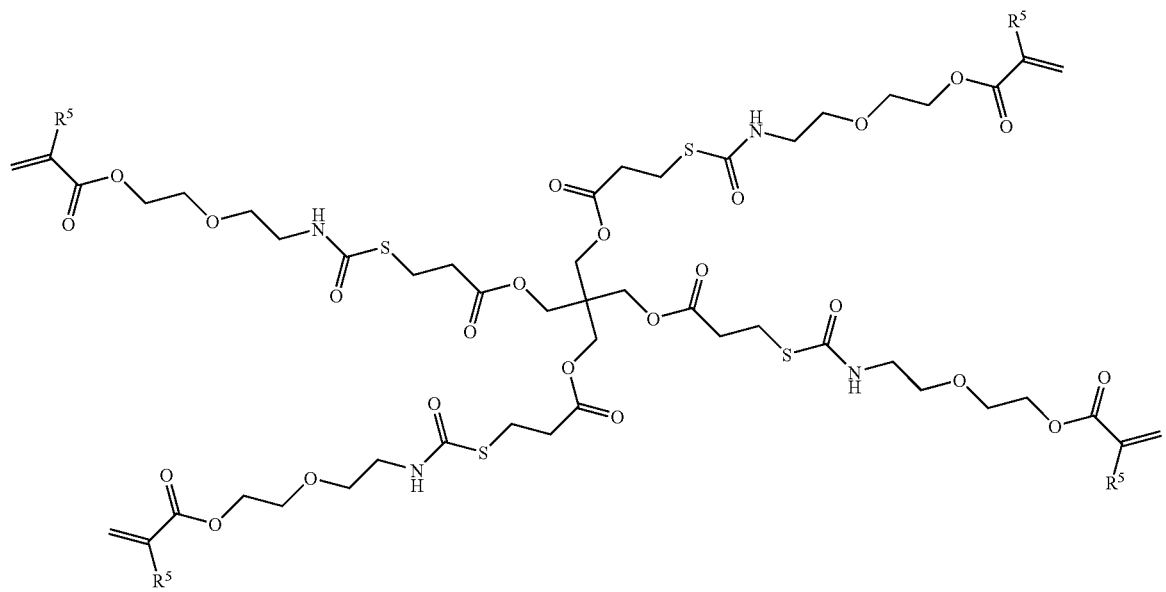

(XVIII)

In the formulas, $R^5$ is a hydrogen atom or a methyl group.

i-c) Reactive Urethane Compound (A) Where $R^6$ in Formula (I) is Imino Group

An example of the substituent X where $R^6$ in formula (I) above is an imino group is a group similar to the substituent X, described above, where $R^6$ is an oxygen atom or a sulfur atom. An example of the compound, containing the substituent X, used in this case is a compound having one or more amino groups.

Examples of such a compound having one or more amino groups include hexamethylenediamine, bis(aminomethyl)cyclohexane, 1,2-bis(2-aminoethoxy)ethane, bis(2-aminoethoxy)ethane, bis(aminomethyl)norbornene, and 2,2-bis(4-aminocyclohexyl)propane.

ii) Method for Producing Ethylenically-Unsaturated-Group Containing Reactive Urethane Compound (A)

The urethane compound (A) of the present invention can be formed by allowing the unsaturated-group containing isocyanate compound, having an ether bond, represented by formula (XII) above to react with the compound having active hydrogen. The reaction method is not particularly limited; for example, the urethane compound (A) of formula (I) can be formed simply by mixing.

A urethanization catalyst is preferably used if the ethylenically-unsaturated-group containing isocyanate compound of formula (XII) is to react with a compound having a hydroxyl group or a mercapto group. The use of the urethanization catalyst significantly facilitates the reaction.

Examples of the urethanization catalyst include dibutyltin dilaurate, copper naphthenate, cobalt naphthenate, zinc naphthenate, triethylamine, 1,4-diazabicyclo[2.2.2]octane, and 2,6,7-trimethyl-1,4-diazabicyclo[2.2.2]octane. These urethanization catalysts may be used singly or in a combination of two or more.

The amount of urethanization catalyst added is preferably 0.01 to 5 parts by weight, more preferably 0.1 to 1 part by weight, based on 100 parts by weight of the isocyanate compound. If the amount added falls below 0.01 part by weight, the reactivity may decrease significantly. On the other hand, if the amount added exceeds 5 parts by weight, a side reaction can occur during the reaction.

The reaction temperature at which the ethylenically-unsaturated-group containing isocyanate compound of formula (XII) is allowed to react with the compound having active hydrogen is preferably −10° C. to 100° C., more preferably 0° C. to 80° C. If the isocyanate compound is allowed to react with a compound having an amino group, the reaction proceeds quickly, and the urethane compound (A) can be synthesized simply by mixing without using a catalyst. However, if the reaction temperature is extremely high, the isocyanate can further react with the resultant imino group to form a by-product.

In addition, the isocyanate compound of formula (XII) above may be used in combination with an isocyanate compound containing one ethylenically unsaturated group for the reaction with the compound containing a hydroxyl group, an amino group or a mercapto group. Specific examples of such an isocyanate compound containing one ethylenically unsaturated group include 2-(meth)acryloyloxyethyl isocyanate, 3-(meth)acryloyloxypropyl isocyanate, 4-(meth)acryloyloxybutyl isocyanate, 5-(meth)acryloyloxypentyl isocyanate, 6-(meth)acryloyloxyhexyl isocyanate, 1,3-bis(meth)acryloyloxy-2-methylpropane-2-isocyanate, 1,3-(meth)bisacryloyloxypropane-2-isocyanate and 3-(meth)acryloyloxyphenyl isocyanate.

iii) Curable Composition

A curable composition of the present invention contains at least the above reactive urethane compound (A) of the present invention and a polymerization initiator (B), and may optionally contain a reactive monomer (C) and other additives.

iii-a) Polymerization Initiator (B)

The polymerization initiator (B) used can be a photoinitiator (B'), which induces polymerization reaction of the ethylenically-unsaturated-group containing reactive urethane compound (A) when irradiated with activation energy radiation such as ultraviolet light or visible light to form a cured material. Specific examples of such a photoinitiator (B') are not particularly limited, and a wide variety of known photoinitiators can be used. Preferred examples include polymerization initiators such as 1-hydroxycyclohexyl phenyl ketone, 2,2'-dimethoxy-2-phenylacetophenone, 1-(4-isopropylphenyl)-2-hydroxy-2-methylpropan-1-one, 2-hydroxy-2-methyl-1-phenylpropan-1-one, 2-methyl-1-[4-(methylthio)phenyl]-2-morpholinopropan-1-one, 2,4,6-trimethylbenzoyldiphenylphosphine oxide, 2-benzyl-2-dimethylamino-1-(4-morpholinophenyl)butan-1-one and 1-[4-(2-hydroxyethoxy)-phenyl]-2-hydroxy-2-methylpropan-1-one; hexaarylbiimidazole-based compounds; triazine-based compounds; aminoacetophenone-based compounds; combinations of sensitizing dyes and organic-boron-salt-based compounds; quinone-based compounds; titanocene-based compounds; oxadiazole-based compounds; glyoxy-ester-based compounds; and bisacylphosphine-oxide-based compounds.

Specific examples of hexaarylbiimidazole-based compounds include 2,2'-bis(o-chlorophenyl)-4,4',5,5'-tetraphenyl-1,2'-biimidazole, 2,2'-bis(o-bromophenyl)-4,4',5,5'-tetraphenyl-1,2'-biimidazole, 2,2'-bis(o-chlorophenyl)-4,4',5,5'-tetra(o,p-dichlorophenyl)-1,2'-biimidazole, 2,2'-bis(o,p-dichlorophenyl)-4,4',5,5'-tetra(o,p-dichlorophenyl)-1,2'-biimidazole, 2,2'-bis(o-chlorophenyl)-4,4',5,5'-tetra(m-methoxyphenyl)-1,2'-biimidazole, and 2,2'-bis(o-methylphenyl)-4,4',5,5'-tetraphenyl-1,2'-biimidazole.

Specific examples of triazine-based compounds include 2,4,6-tris(trichloromethyl)-s-triazine, 2,4,6-tris(tribromomethyl)-s-triazine, 2-propionyl-4,6-bis(trichloromethyl)-s-triazine, 2-benzoyl-4,6-bis(trichloromethyl)-s-triazine, 2-(4-chlorophenyl)-4,6-bis(trichloromethyl)-s-triazine, 2,4-bis(4-methoxyphenyl)-6-trichloromethyl-s-triazine, 2-(4-methoxyphenyl)-2,6-bis(trichloromethyl)-s-triazine, 2-(4-methoxystyryl)-4,6-bis(trichloromethyl)-s-triazine, 2-(4-chlorostyryl)-4,6-bis(trichloromethyl)-s-triazine, 2-(4-aminophenyl)-4,6-bis(trichloromethyl)-s-triazine, 2,4-bis(3-chlorophenyl)-6-trichloromethyl-s-triazine, and 2-(4-aminostyryl)-4,6-bis(dichloromethyl)-s-triazine.

Specific examples of aminoacetophenone-based compounds include 2-methyl-1-[4-(methylthio)phenyl]-2-morpholinopropan-1-one and 2-benzyl-2-dimethylamino-1-(4-morpholinophenyl)-butanone-1.

Specific examples of quinone-based compounds include 2-ethylanthraquinone and 9,10-phenanthrenequinone.

Specific examples of titanocene-based compounds include titanocene compounds disclosed in, for example, Japanese Unexamined Patent Application Publication Nos. S59-152396, S61-151197, S63-10602, S63-41484, H2-291, H3-12403, H3-20293, H3-27393, H3-52050, H4-221958 and H4-21975. Specific examples include dicyclopentadienyl-titanium-dichloride, dicyclopentadienyl-titanium-diphenyl, dicyclopentadienyl-titanium-bis(2,3,4,5,6-pentafluorophenyl), dicyclopentadienyl-titanium-bis(2,3,5,6-tetrafluorophenyl), dicyclopentadienyl-titanium-bis(2,4,6-trifluorophenyl), dicyclopentadienyl-titanium-bis(2,6-difluorophenyl), dicyclopentadienyl-titanium-bis(2,4-difluorophenyl), bis(methylcyclopentadienyl)-titanium-bis(2,3,4,5,6-pentafluorophenyl), bis(methylcyclopentadienyl)-titanium-bis(2,3,5,6-tetrafluorophenyl), and bis(methylcyclopentadienyl)-titanium-bis(2,6-difluorophenyl).

Specific examples of oxadiazole-based compounds include those having a halomethyl group, such as 2-phenyl-5-trichloromethyl-1,3,4-oxadiazole, 2-(p-methylphenyl)-5-trichloromethyl-1,3,4-oxadiazole, 2-(p-methoxyphenyl)-5-trichloromethyl-1,3,4-oxadiazole, 2-styryl-5-trichloromethyl-1,3,4-oxadiazole, 2-(p-methoxystyryl)-5-trichloromethyl-1,3,4-oxadiazole and 2-(p-butoxystyryl)-5-trichloromethyl-1,3,4-oxadiazole.

Specific examples of glyoxy-ester-based compounds include benzyl dimethyl ketal, benzoin ethyl ether, and benzoin isopropyl ether.

Specific examples of bisacylphosphine-oxide-based compounds include bis(2,6-dimethoxybenzoyl)-2,4,4-trimethylpentylphosphine oxide, bis(2,6-dichlorobenzoyl)-phenylphosphine oxide, bis(2,6-dichlorobenzoyl)-2,5-dimethylphenylphosphine oxide, bis(2,4,6-trimethylbenzoyl)phenylphosphine oxide and 2,4,6-trimethylbenzoylphenylphosphine oxide.

For improved sensitivity, a sensitizer may be added, such as a benzophenone-based compound such as benzophenone, 2,4,6-trimethylbenzophenone, 4-phenylbenzophenone, 4,4'-bis(dimethylamino)benzophenone or 4,4'-bis(diethylamino)benzophenone, or a thioxanthone-based compound such as 2,4-diethylthioxanthone, isopropylthioxanthone, 2,4-diisopropylthioxanthone or 2-chlorothioxanthone.

Specific examples of benzophenone-based compounds include benzophenone, 4-methylbenzophenone, 2,4,6-trimethylbenzophenone, benzoylbenzoic acid, 4-phenylbenzophenone, 3,3'-dimethyl-4-methoxybenzophenone, 4-benzoyl-4'-methyldiphenyl sulfide, 4,4'-bis(dimethylamino)benzophenone, 4,4'-bis(diethylamino)benzophenone, (2-acryloyloxyethyl)(4-benzoylbenzyl)dimethylammonium bromide, 4-(3-dimethylamino-2-hydroxypropoxy)-benzophenone methochloride monohydrate, and (4-benzoylbenzyl)trimethylammonium chloride.

Specific examples of thioxanthone-based compounds include thioxanthone, 2,4-diethylthioxanthone, isopropylthioxanthone, 2,4-diisopropylthioxanthone, 2-chlorothioxanthone, 1-chloro-4-propoxythioxanthone, and 2-(3-dimethylamino-2-hydroxypropoxy)-3,4-dimethyl-9H-thioxanthen-9-one methochloride.

In the present invention, the polymerization initiator (B) used can also be a thermal initiator (B"). With the thermal initiator (B"), the polymerization reaction of the reactive urethane compound (A) can be induced by heat to form a cured material. That is, the thermal initiator (B") can be added to the reactive urethane compound (A) to prepare a thermosetting composition. Examples of such a thermal initiator (B") include diacyl peroxides, ketone peroxides, hydroperoxides, dialkyl peroxides, peroxy esters, azo-based compounds, and persulfate salts. These may be used singly or in a combination of two or more.

The amount of polymerization initiator used is preferably 0.1 to 100 parts by mass, more preferably 0.5 to 50 parts by mass, based on 100 parts by mass of the reactive urethane compound (A). If the amount of polymerization initiator used falls below 0.1 part by mass, the polymerization rate of the reactive urethane compound (A) may decrease. In addition, there may be a higher tendency of polymerization inhibition due to, for example, oxygen. On the other hand, if the amount of polymerization initiator used exceeds 100 parts by mass, the polymerization reaction may be suppressed, and the strength, adhesion strength and heat resistance of a resultant cured film may decrease. In addition, it contributes to coloration.

iii-b) Reactive Monomer (C)

The curable composition of the present invention may contain the reactive monomer (C). The reactive monomer (C) in the present invention refers to a compound having at least one ethylenically unsaturated group and encompasses not only monomers but also dimers and trimers, where the reactive urethane compound (A) of formula (I) is excluded. Such a reactive monomer (C) can be added to adjust the viscosity of the composition and to adjust the properties of a resultant cured material, including mechanical properties such as reactivity, hardness, elasticity and adhesion and optical properties such as transparency.

Specific examples of the above reactive monomer (C) include ethylenically unsaturated aromatic compounds such as styrene, α-methylstyrene, o-methylstyrene, m-methylstyrene, p-methylstyrene, p-tert-butylstyrene, diisopropenylbenzene, o-chlorostyrene, m-chlorostyrene, p-chlorostyrene, 1,1-diphenylethylene, p-methoxystyrene, N,N-dimethyl-p-aminostyrene, N,N-diethyl-p-aminostyrene, ethylenically unsaturated pyridine, and ethylenically unsaturated imidazole; carboxyl-group containing compounds such as (meth)acrylic acid, crotonic acid, maleic acid, fumaric acid, and itaconic acid; alkyl(meth)acrylates such as methyl(meth)acrylate, ethyl(meth)acrylate, propyl(meth)acrylate, isopropyl(meth)acrylate, butyl(meth)acrylate, isobutyl(meth)acrylate, tert-butyl(meth)acrylate, pentyl(meth)acrylate, amyl(meth)acrylate, isoamyl(meth)acrylate, hexyl(meth)acrylate, heptyl(meth)acrylate, octyl(meth)acrylate, isooctyl(meth)acrylate, 2-ethylhexyl(meth)acrylate, nonyl(meth)acrylate, decyl(meth)acrylate, isodecyl(meth)acrylate, undecyl(meth)acrylate, dodecyl(meth)acrylate, lauryl(meth)acrylate, stearyl(meth)acrylate, and isostearyl(meth)acrylate; fluoroalkyl(meth)acrylates such as trifluoroethyl(meth)acrylate, tetrafluoropropyl(meth)acrylate, hexafluoroisopropyl(meth)acrylate, octafluoropentyl(meth)acrylate, and heptadecafluorodecyl(meth)acrylate; hydroxyalkyl(meth)acrylates such as hydroxyethyl(meth)acrylate, hydroxypropyl(meth)acrylate, and hydroxybutyl(meth)acrylate; phenoxyalkyl(meth)acrylates such as phenoxyethyl(meth)acrylate and 2-hydroxy-3-phenoxypropyl(meth)acrylate; alkoxyalkyl(meth)acrylates such as methoxyethyl(meth)acrylate, ethoxyethyl(meth)acrylate, propoxyethyl(meth)acrylate, butoxyethyl(meth)acrylate, and methoxybutyl(meth)acrylate; polyethylene glycol(meth)acrylates such as polyethylene glycol mono(meth)acrylate, ethoxydiethylene glycol(meth)acrylate, methoxypolyethylene glycol(meth)acrylate, phenoxypolyethylene glycol(meth)acrylate, and nonylphenoxypolyethylene glycol(meth)acrylate; polypropylene glycol(meth)acrylates such as polypropylene glycol mono(meth)acrylate, methoxypolypropylene glycol(meth)acrylate, ethoxypolypropylene glycol(meth)acrylate, and nonylphenoxypolypropylene glycol(meth)acrylate; cycloalkyl(meth)acrylates such as cyclohexyl(meth)acrylate, 4-butylcyclohexyl(meth)acrylate, dicyclopentanyl(meth)acrylate, dicyclopentenyl(meth)acrylate, dicyclopentadienyl(meth)acrylate, bornyl(meth)acrylate, isobornyl(meth)acrylate, and tricyclodecanyl(meth)acrylate; and other (meth)acrylates such as benzyl(meth)acrylate, tetrahydrofurfuryl(meth)acrylate, ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, neopentyl glycol di(meth)acrylate, 1,3-propanediol di(meth)acrylate, 1,4-butanediol di(meth)acrylate, 1,6-hexanediol di(meth)acrylate, hydroxypivalate ester neopentyl glycol di(meth)acrylate, bisphenol-A di(meth)acrylate, trimethylolpropane tri(meth)acrylate, pentaerythritol tri(meth)acrylate, trimethylolpropanetrioxyethyl(meth)acrylate, tris(2-hydroxyethyl)isocyanurate tri(meth)acrylate, and dipentaerythritol hexa(meth)acrylate. These reactive monomers may be used singly or in a combination of two or more.

The curable composition of the present invention can be formulated and prepared by mixing the reactive urethane compound (A) of formula (I) and the polymerization initiator (B) at room temperature or under heated conditions using a mixing machine such as a mixer, a ball mill or a three-roll mill, or by dissolving them by adding a diluent such as the above reactive monomer or a solvent.

Specific examples of solvents include esters such as ethyl acetate, butyl acetate, and isopropyl acetate; ketones such as acetone, methyl ethyl ketone, methyl isobutyl ketone, and cyclohexanone; cyclic ethers such as tetrahydrofuran and dioxane; amides such as N,N-dimethylformamide; aromatic hydrocarbons such as toluene; and halogenated hydrocarbons such as methylene chloride.

The curable composition of the present invention can be cured by, for example, applying the curable composition onto a substrate and irradiating with radiation or heating the coating formed thereon. The curing may be performed by both irradiation with radiation and heating.

The thickness of the coating is preferably 1 to 200 μm for evaluation, although it is appropriately determined depending on applications. Examples of the application method include application using a die coater, a spin coater, a spray coater, a curtain coater, a roll coater or the like, application by screen printing, and application by dipping.

The radiation used for curing is preferably an electron beam or light in the ultraviolet to infrared wavelength range. For ultraviolet light, for example, an ultrahigh-pressure mercury light source or a metal halide light source can be used. For visible light, a metal halide light source or a halogen light source can be used. For infrared light, a halogen light source can be used. Other light sources such as a laser and an LED can also be used. The amount of radiation applied is appropriately determined depending on, for example, the type of light source and the thickness of the coating.

The curable composition of the present invention can be used for applications including resists (such as solder resists, etching resists, color filter resists, and spacers), sealing (such as waterproof sealing), paints (antifouling paints, fluorocarbon paints, and water-based paints), tackiness agents and adhesives (such as adhesives and dicing tape), printing plates (such as CTP plates and offset plates), print proof (such as color proof), lenses (contact lenses, microlenses, and optical waveguides), dental materials, surface treatment (such as optical fiber coatings and disk coats), and battery materials (such as solid electrolytes). Depending on such applications, other components may be added to the curable composition of the present invention as needed.

Next, compositions suitable for color filters, solder resists and coating agents will be described as specific examples of the curable composition of the present invention.

iii-c) Curable Composition Suitable for Color Filters

An example of a curable composition suitable for color filters is a curable composition containing the reactive urethane compound (A) of the present invention, the photoinitiator (B'), the reactive monomer (C), a pigment (D), an organic solvent (E), and a multifunctional thiol (F).

iii-c-a) Reactive Urethane Compound (A)

The content of the reactive urethane compound (A) in the above curable composition for color filters is preferably 10% to 40% by mass, more preferably 15% to 35% by mass, based on the total amount of the composition excluding the organic solvent (E). The mass ratio of the reactive urethane compound (A) to the other curable components, including the reactive monomer (C), is preferably 30/70 to 90/10, more preferably 40/60 to 85/15, in view of the balance of strength and photosensitivity. If the mass ratio of the reactive urethane compound (A) falls below 30/70, the coating strength may decrease. On the other hand, if the mass ratio of the reactive urethane compound (A) exceeds 90/10, curing contraction tends to be more noticeable.

iii-c-b) Photoinitiator (B')

As the photoinitiator (B'), those shown in iii-a) can be used singly or in a combination of two or more.

The content of the photoinitiator (B') in the above curable composition for color filters is preferably 2% to 25% by mass, more preferably 5% to 20% by mass, based on the total amount of the composition excluding the organic solvent (E). If the content falls below 2% by mass, the photosensitivity may be insufficient. On the other hand, if the content exceeds 25% by mass, the resolution may decrease due to excessive photosensitivity.

iii-c-c) Reactive Monomer (C)

As the reactive monomer (C), those shown in iii-b) can be used singly or in a combination of two or more.

The content of the reactive monomer (C) in the above curable composition for color filters is preferably 5% to 20% by mass, more preferably 8% to 18% by mass, based on the total amount of the composition excluding the organic solvent (E). If the content falls below 5% by mass, the photosensitivity may be insufficient. On the other hand, if the content exceeds 20% by mass, the photosensitivity may be insufficient.

iii-c-d) Pigment (D)

The pigment (D) used can be a red, green, or blue pigment. An example of a pigment most capable of blocking radiation is a black pigment. As such a pigment, known pigments can be used, and specific examples include carbon black, acetylene black, lamp black, carbon nanotubes, graphite, iron black, iron-oxide-based black pigments, aniline black, cyanine black, and titanium black. A mixture of red, green, and blue organic pigments can also be used as a black pigment.

Of these, carbon black and titanium black are preferable, and carbon black is particularly preferable in view of light-shielding rate and image characteristics.

The carbon black used can be a commercial product and preferably has a particle size of 5 to 200 nm, more preferably 10 to 100 nm, in view of dispersibility and resolution. If the particle size falls below 5 nm, homogeneous dispersion is difficult; if the particle size exceeds 200 nm, the resolution tends to decrease.

Specific examples of carbon black include Special Black 550, Special Black 350, Special Black 250, Special Black 100, and Special Black 4, manufactured by Deggusa AG; MA100, MA220, and MA230, manufactured by Mitsubishi Chemical Corporation; BLACK PEARLS 480, manufactured by Cabot Corporation; and RAVEN 410, RAVEN 420, RAVEN 450, and RAVEN 500, manufactured by Columbian Chemicals Company.

The content of the pigment (D) in the above curable composition for color filters is preferably 25% to 60% by mass, more preferably 30% to 55% by mass, based on the total amount of the composition excluding the organic solvent (E). If the content falls below 25% by mass, the optical density may be insufficient. On the other hand, if the content exceeds 60% by mass, the coating strength may decrease.

iii-c-e) Organic Solvent (E)

Specific examples of the organic solvent (E) include ethers such as diisopropyl ether, ethyl isobutyl ether, and butyl ether; esters such as ethyl acetate, isopropyl acetate, butyl acetate (n, sec, and tert), amyl acetate, ethyl 3-ethoxypropionate, methyl 3-methoxypropionate, ethyl 3-methoxypropionate, propyl 3-methoxypropionate, and butyl 3-methoxypropionate; ketones such as methyl ethyl ketone, isobutyl ketone, diisopropyl ketone, ethyl amyl ketone, methyl butyl ketone, methyl hexyl ketone, methyl isoamyl ketone, methyl isobutyl ketone, and cyclohexanone; glycols such as ethylene glycol monomethyl ether, ethylene glycol monoethyl ether, ethylene glycol diethyl ether, ethylene glycol monomethyl ether acetate, ethylene glycol monoethyl ether acetate, diethylene glycol monoethyl ether acetate, propylene glycol mono-t-butyl ether, propylene glycol monomethyl ether, propylene glycol monoethyl ether, propylene glycol monomethyl ether acetate, propylene glycol monoethyl ether acetate, dipropylene glycol monoethyl ether, dipropylene glycol monomethyl ether, dipropylene glycol monomethyl ether acetate, dipropylene glycol monoethyl ether acetate, ethylene glycol monobutyl ether, and tripropylene glycol methyl ether; and mixtures thereof.

The organic solvent (E) is capable of dissolving or dispersing the other components and preferably has a boiling point of 100° C. to 200° C., more preferably 120° C. to 170° C. The amount of organic solvent (E) used is such that the solid content of the curable composition is 5% to 50% by mass, preferably 10% to 30% by mass.

iii-c-f) Multifunctional Thiol (F)

The curable composition of the present invention for color filters may contain the multifunctional thiol (F). The multifunctional thiol (F) may be any compound having a mercapto group in the molecule thereof, although a compound having two or more mercapto groups in one molecule is preferred. A more preferable example of the multifunctional thiol (F) is a compound having two or more structures represented by general formula (XIX):

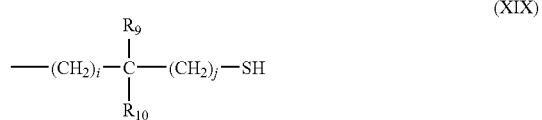

(XIX)

In the formula, $R_9$ and $R_{10}$ are each independently a hydrogen atom, an alkyl group having 1 to 10 carbon atoms, or an aryl group; i is an integer of 0 to 2; j is 0 or 1; and $R_9$ and $R_{10}$ are not simultaneously hydrogen atoms.

Specific examples include multifunctional thiols represented by formulas (XX) to (XXIV):

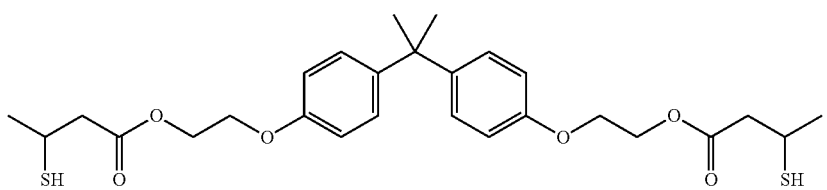

(XX)

-continued

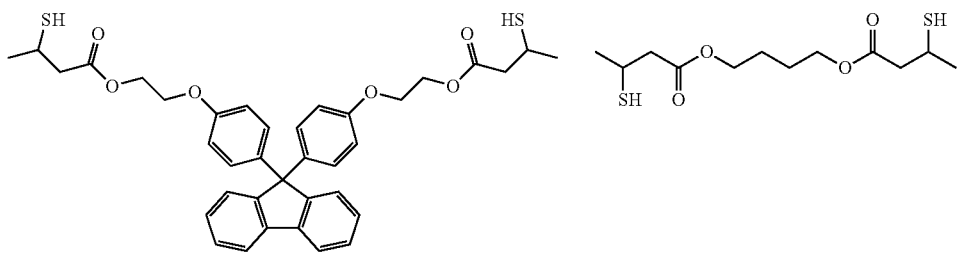
(XXI) (XXII)

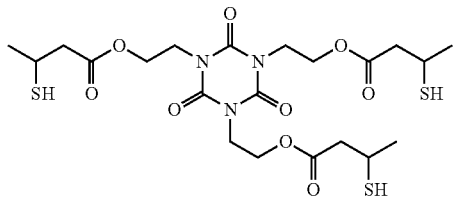
(XXIII)

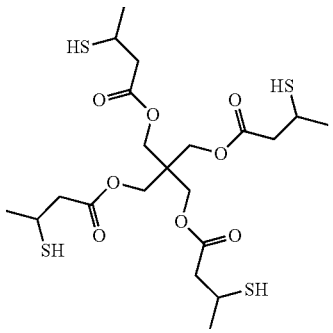
(XXIV)

The above multifunctional thiols (F) can be used singly or in a combination of two or more.

The molecular weight of the above multifunctional thiol (F) is preferably, but not limited to, 200 to 2,000. If the molecular weight falls below 200, the curable composition may have an odor; if the molecular weight exceeds 2,000, the reactivity and curability of the curable composition may decrease.

The amount of multifunctional thiol (F) used is preferably, but not limited to, 1 to 100 parts by mass, more preferably 1 to 50 parts by mass, still more preferably 4 to 10 parts by mass, based on 100 parts by mass of the reactive urethane compound (A). If the amount of multifunctional thiol (F) used falls within the above range, the curability of the composition can be improved. This is because the addition of the multifunctional thiol (F) reduces inhibition of radical polymerization due to oxygen. It is also possible to adjust the properties of a resultant cured material, including mechanical properties such as reactivity, hardness, elasticity and adhesion and optical properties such as transparency.

If the multifunctional thiol (F) is to be added, the content of the photoinitiator (B') is preferably 2% to 20% by mass, more preferably 3% to 15% by mass, based on the total amount of the composition excluding the organic solvent (E). If the content falls below 2% by mass, the photosensitivity may be insufficient. On the other hand, if the content exceeds 20% by mass, the resolution may decrease due to excessive photosensitivity.

iii-c-g) Other Components

In addition to the above components, for example, a pigment dispersant, an adhesion promoter, a leveling agent, a development improver, an antioxidant, and a polymerization inhibitor can be added to the above curable composition for color filters. As the polymerization inhibitor, known compounds can be used, and specific examples include hydroquinone, hydroquinone monomethyl ether, tert-butylcatechol, pyrogallol, and phenothiazine. In particular, a pigment dispersant is preferably added where needed because it is important in view of quality stabilization to finely disperse the colorant material and to stabilize the dispersion state.

iii-c-h) Method for Producing Curable Composition for Color Filters

The above curable composition for color filters can be produced by mixing the above components by any method. The mixing method may be either simultaneous mixing of the components or sequential mixing of the components.

If all components to be added are mixed and dispersed, heat generated during the dispersion may denature highly reactive components. Accordingly, it is preferable to disperse the pigment (D), such as a black pigment, in the organic solvent (E) and the pigment dispersant, or in a mixture of these and the reactive urethane compound (A), in advance before mixing the remaining components.

The dispersion may be performed using, for example, a paint conditioner, a bead mill, a ball mill, a three-role mill, a stone mill, a jet mill, or a homogenizer.

If the dispersion is performed using a bead mill, glass beads or zirconia beads having diameters of 0.1 to several millimeters are preferably used. The temperature during the dispersion is typically 0° C. to 100° C., preferably room temperature to 80° C. An appropriate dispersion time is determined depending on, for example, the components of the colored composition (colorant material, solvent, dispersant, and binder polymer) and the device size of the bead mill.

If the dispersion is performed using a three-roll mill, the temperature during the dispersion is typically 0° C. to 60° C. If the rolls generate a large amount of frictional heat and the temperature exceeds 60° C., the interiors of the rolls are cooled with circulating water. The number of times of the composition being passed through the three-roll mill is, for example, 2 to 10 times, depending on conditions such as the linear velocity of the rolls, the pressure between the rolls, and the viscosity of the materials. The composition subjected to the dispersion is mixed with the remaining components by any method to produce a curable composition.

iii-c-i) Method for Producing Color Filter

A color filter can be produced by applying the above curable composition for color filters onto a transparent substrate, drying the solvent in, for example, an oven, forming a pattern by exposure and development, and performing postbaking.

Examples of the above transparent substrate include films or sheets of inorganic glass such as quartz glass, borosilicate glass, and silica-coated lime soda glass; thermoplastics such as polyesters such as polyethylene terephthalate, polyolefins such as polypropylene and polyethylene, polycarbonate, polymethyl methacrylate, and polysulfone; and thermosetting plastics such as epoxy polymer and polyester polymer. To improve the physical properties, such as surface adhesion, of the transparent substrate, it may be subjected in advance to, for example, corona discharge treatment, ozone treatment, or thin-film treatment using a silane coupling agent or various polymers such as urethane polymer.

The curable composition can be applied onto the transparent substrate using an application device such as a dip coater, a roll coater, a wire bar, a flow coater, a die coater, a spray coater, or a spin coater.

The solvent can be dried by any method after the application, and a drying device such as a hot plate, an IR oven, or a convection oven can be used. The drying temperature is preferably 40° C. to 150° C., and the drying time is preferably 10 seconds to 60 minutes. The solvent may also be dried in a vacuum.

The exposure is performed by placing a photomask on the sample and subjecting it to image exposure through the photomask. Specific examples of the light source used for exposure include lamp light sources such as a xenon lamp, a high-pressure mercury lamp, an ultrahigh-pressure mercury lamp, a metal halide lamp, a medium-pressure mercury lamp, and a low-pressure mercury lamp; and laser light sources such as an argon ion laser, a YAG laser, an excimer laser, and a nitrogen laser. An optical filter may be used if only irradiation light of a particular wavelength is used.

In the development, a developer is used to perform, for example, dip development, shower development, or puddle development of the resist. The developer used can be a solvent capable of dissolving unexposed portions of the resist film, and specific examples include organic solvents such as acetone, methylene chloride, trichlene, and cyclohexanone.

The developer used can also be an alkali developer. Specific examples of such an alkali developer include aqueous solutions containing inorganic alkalis such as sodium carbonate, potassium carbonate, sodium silicate, potassium silicate, sodium hydroxide, and potassium hydroxide; and organic alkalis such as diethanolamine, triethanolamine, and tetraalkylammonium hydroxide salts. The alkali developer may optionally contain, for example, a surfactant, a water-soluble organic solvent, or a low-molecule-weight compound having a hydroxyl group or a carboxyl group. In particular, because many surfactants have the effect of improving developability and resolution and alleviating greasing, it is preferable to add such a surfactant.

Specific examples of the surfactant used for the developer include anionic surfactants having a sodium naphthalenesulfonate group or a sodium benzenesulfonate group, nonionic surfactants having a polyalkyleneoxy group, and cationic surfactants having a tetraalkylammonium group.

The development is usually performed at a development temperature of 10° C. to 50° C., preferably 15° C. to 45° C., by a method such as dip development, spray development, blush development, or ultrasonic development.

The postbaking is usually performed at 150° C. to 300° C. for 1 to 120 minutes using a device similar to that used for solvent drying. The thickness of the resultant matrix is preferably 0.1 to 2 μm, more preferably 0.1 to 1.5 μm, still more preferably 0.1 to 1 μm. To achieve the function to serve as a matrix, the optical density is preferably 3 or more for such thicknesses.

The black matrix pattern produced by the above method usually has openings measuring about 20 to 200 μm within the pattern, and R, G and B pixels are formed in the spaces in the subsequent process. The colors of the pixels are usually R, G, and B; as with the black matrix, they can be formed using curable compositions containing the reactive urethane compound (A) and colored with the pigments described above or dyes.

iii-d) Curable Composition Suitable for Solder Resists

An example of a curable composition suitable for solder resists is a curable composition containing the reactive urethane compound (A) of the present invention, the photoinitiator (B'), the reactive monomer (C), a thermosetting polymer (G), and a thermal polymerization catalyst (H).

iii-d-a) Reactive Monomer (C)

The reactive monomer (C) used can be a reactive monomer as used for the curable composition, described above, suitable for color filters. The mixing ratio of the reactive urethane compound (A) to the reactive monomer (C) other than the compound (A), is preferably 95:5 to 50:50, more preferably 90:10 to 60:40, still more preferably 85:15 to 70:30, in mass ratio. If the mixing ratio of the reactive urethane compound (A) exceeds 95, the heat resistance of a cured film of the composition may decrease. On the other hand, if the mixing ratio of the reactive urethane compound (A) falls below 5, the alkali solubility of the composition tends to decrease.

An epoxy(meth)acrylate compound having a carboxyl group may optionally be used as a curing component. As an example of an epoxy(meth)acrylate compound having a carboxyl group, those shown in i-a-f-6) above can be used. The acid value is preferably 10 mgKOH/g or more, more preferably 45 to 160 mgKOH/g, still more preferably 50 to 140 mgKOH/g. The use of an epoxy(meth)acrylate compound having such an acid value improves the balance of the alkali solubility of the composition and the alkali resistance of the cured film. If the acid value falls below 10 mgKOH/g, the alkali solubility decreases. On the other hand, if the acid value is excessive, the properties of the cured film to serve as a resist, including alkali resistance and electrical characteristics, may be degraded, depending on the components of the composition. If an epoxy(meth)acrylate compound having a carboxyl group is to be used, it is preferably used in an amount of 100 parts by mass or less based on 100 parts by mass of the reactive urethane compound (A).

iii-d-b) Thermosetting Polymer (G)

The thermosetting polymer (G), contained in the composition as a thermosetting component, may itself be cured by heat or may react with carboxyl groups in the reactive urethane compound (A) by heat.

Specific examples of the thermosetting polymer (G) include epoxy polymers; phenolic polymers; silicone polymers; melamine derivatives such as hexamethoxymelamine, hexabutoxymelamine, and condensed hexamethoxymelamine; urea compounds such as dimethylolurea; bisphenol-A-based compounds such as tetramethylol bisphenol A; oxazoline compounds; and oxetane compounds. These may be used singly or in a combination of two or more.

Of these, epoxy polymers are preferred. Specific examples of epoxy polymers include epoxy compounds having two or more epoxy groups in one molecule, such as bisphenol-A epoxy polymer, hydrogenated bisphenol-A epoxy polymer, brominated bisphenol-A epoxy polymer, bisphenol-F epoxy polymer, novolac epoxy polymer, phenolic novolac epoxy polymer, cresol novolac epoxy polymer, N-glycidyl epoxy polymer, bisphenol-A novolac epoxy polymer, chelate epoxy polymer, glyoxal epoxy polymer, amino-group containing epoxy polymer, rubber-modified epoxy polymer, dicyclopentadiene phenolic epoxy polymer, silicone-modified epoxy polymer, and ε-caprolactone-modified epoxy polymer; and other epoxy polymers such as bisphenol-S epoxy polymer, diglycidyl phthalate polymer, heterocyclic epoxy polymer, bixylenol epoxy polymer, biphenyl epoxy polymer, and tetraglycidylxylenoylethane polymer.

To impart flame resistance, it is possible to use epoxy polymers having atoms of, for example, a halogen such as chlorine or bromine, or of phosphorus, introduced in the structure thereof in such a bonding state that they are not susceptible to decomposition by heat or water. These epoxy polymers may be used singly or in a combination of two or more.

The content of the thermosetting polymer (G) is preferably 10 to 150 parts by mass, more preferably 10 to 50 parts by mass, based on 100 parts by mass of the total amount of photocurable components. If the content of the thermosetting polymer (G) falls below 10 parts by mass, the solder heat resistance of the cured film may be insufficient. On the other hand, if the content of the thermosetting polymer (G) exceeds 150 parts by mass, the cured film experiences a large amount of contraction and therefore tends to undergo noticeable warping deformation when used as an insulating protective film for FPC boards.

iii-d-c) Photoinitiator (B')

The photoinitiator (B') used can be a photoinitiator as used for the curable composition, described above, suitable for color filters.

The content of the photoinitiator (B') is preferably 0.1 to 20 parts by mass, more preferably 0.2 to 10 parts by mass, based on 100 parts by mass of the total amount of the reactive urethane compound (A), the reactive monomer (C), and the epoxy(meth)acrylate compound having a carboxyl group, which is optionally added. If the content of the photoinitiator (B') falls below 0.1 part by mass, the curing of the composition may be insufficient.

iii-d-d) Thermal Polymerization Catalyst (H)

The thermal polymerization catalyst (H) functions to cause thermal curing of the thermosetting polymer (G), and specific examples include amines; amine salts or quaternary ammonium salts, including chlorides of the amines; acid anhydrides such as alicyclic acid anhydrides, aliphatic acid anhydrides, and aromatic acid anhydrides; nitrogen-containing heterocyclic compounds such as polyamides, imidazoles, and triazine compounds; and organometallic compounds. These may be used singly or in a combination of two or more.

Specific examples of amines include primary, secondary, and tertiary aliphatic or aromatic amines.

Specific examples of aliphatic amines include polymethylenediamine, polyetherdiamine, diethylenetriamine, triethylenetetramine, tetraethylenepentamine, triethylenetetramine, dimethylaminopropylamine, menthenediamine, aminoethylethanolamine, bis(hexamethylene)triamine, 1,3,6-trisaminomethylhexane, tributylamine, 1,4-diazabicyclo[2,2,2]octane, and 1,8-diazabicyclo[5,4,0]undecen-7-ene.

Specific examples of aromatic amines include metaphenylenediamine, diaminodiphenylmethane, and diaminodiphenylsulfone. Specific examples of acid anhydrides include aromatic acid anhydrides such as phthalic anhydride, trimellitic anhydride, benzophenonetetracarboxylic anhydride, ethylene glycol bis(anhydrotrimellitate), and glycerol tris(anhydrotrimellitate); and other acid anhydrides such as maleic anhydride, succinic anhydride, methylnadic anhydride, hexahydrophthalic anhydride, tetrahydrophthalic anhydride, polyadipic anhydride, chlorendic anhydride, and tetrabromophthalic anhydride.

Specific examples of polyamides include polyaminoamides having a primary or secondary amino group that are formed by inducing condensation reaction of a dimer acid with a polyamine such as diethylenetriamine or triethylenetetramine.

Specific examples of imidazoles include imidazole, 2-ethyl-4-methylimidazole, N-benzyl-2-methylimidazole, 1-cyanoethyl-2-undecylimidazolium trimellitate, and 2-methylimidazolium isocyanurate.

A triazine compound is a compound having a six-membered ring containing three nitrogen atoms, and specific examples include melamine compounds such as melamine, N-ethylenemelamine and N,N',N"-triphenylmelamine; cyanuric acid compounds such as cyanuric acid, isocyanuric acid, trimethyl cyanurate, isocyanurate, triethyl cyanurate, trisethyl isocyanurate, tri(n-propyl)cyanurate, tris(n-propyl) isocyanurate, diethyl cyanurate, N,N'-diethyl isocyanurate, methyl cyanurate, and methyl isocyanurate; and cyanuric acid melamine compounds such as equimolar reaction products of melamine compounds and cyanuric acid compounds.

Specific examples of organometallic compounds include metal salts of organic acids such as dibutyltin dilaurate, dibutyltin maleate, and zinc 2-ethylhexanoate; 1,3-diketone metal complex salts such as nickel acetylacetonate and zinc acetylacetonate; and metal alkoxides such as titanium tetrabutoxide, zirconium tetrabutoxide, and aluminum butoxide.

The amount of thermal polymerization catalyst (H) used is preferably 0.5 to 20 parts by mass, more preferably 1 to 10 parts by mass, based on 100 parts by mass of the thermosetting polymer (G). If the amount of thermal polymerization catalyst (H) used falls below 0.5 part by mass, the heat resistance may decrease because the curing reaction does not proceed sufficiently. In addition, because the curing must be performed at high temperature for an extended period of time, work efficiency may decrease. On the other hand, if the amount of thermal polymerization catalyst (H) used exceeds 20 parts by mass, it tends to cause gelation through reaction with carboxyl groups in the composition and may therefore cause a problem such as decreased storage stability.

iii-d-e) Method for Producing Curable Composition for Solder Resists

As with the curable composition, described above, for color filters, the curable composition for solder resists can be produced by mixing the above components by a common method. The mixing method is not particularly limited, and it is possible to mix some components before mixing them with the other components or to mix all components at the same time.

For viscosity adjustment, for example, an organic solvent may optionally be added to the composition. The viscosity adjustment allows the composition to be more readily applied onto a target by, for example, roller coating, spin coating, screen coating, or curtain coating or by printing.

Examples of organic solvents include ketone solvents such as ethyl methyl ketone, methyl isobutyl ketone, and cyclohexanone; ester solvents such as ethyl acetoacetate, γ-butyrolactone, and butyl acetate; alcohol solvents such as butanol and benzyl alcohol; cellosolve solvents, carbitol solvents, and ester and ether derivatives thereof, such as carbitol acetate and methylcellosolve acetate; amide solvents such as N,N-dimethylformamide, N,N-dimethylacetamide, N,N-dimethylformamide, and N-methyl-2-pyrrolidone; dimethylsulfoxide; phenol solvents such as phenol and cresol; nitro compound solvents; and aromatic or alicyclic hydrocarbon solvents such as toluene, xylene, hexamethylbenzene, cumene aromatic solvents, tetralin, decalin, and dipentene. These may be used singly or in a combination of two or more.

The amount of organic solvent used is preferably such that the composition has a viscosity of 500 to 500,000 mPa·s, more preferably 1,000 to 500,000 mPa·s (measured at 25° C. using a B-type viscometer (Brookfield Viscometer). If the composition has such a viscosity, it is more suitable and can be more readily used for application onto a target and for printing. To achieve such a viscosity, the amount of organic solvent used is preferably 1.5 or less times by mass the solid content excluding the organic solvent. If the amount used exceeds 1.5 times by mass, the solid content is so low that, when the composition is used for printing on, for example, a substrate, a sufficient thickness may be impossible to reach by single printing, thus requiring multiple printing.

In addition, a colorant can be added to the composition to use it as an ink. Specific examples of colorants include phthalocyanine blue, phthalocyanine green, iodine green, disazo yellow, crystal violet, titanium oxide, carbon black, and naphthalene black. When used as an ink, the composition preferably has a viscosity of 500 to 500,000 mPa·s.

In addition, a fluidity modifier can be added to the composition to adjust the fluidity thereof. The addition of a fluidity modifier allows the fluidity of the composition to be appropriately adjusted when, for example, applied onto a target by roller coating, spin coating, screen coating, or curtain coating.

Specific examples of fluidity modifiers include inorganic or organic fillers, wax, and surfactants. Specific examples of inorganic fillers include talc, barium sulfate, barium titanate, silica, alumina, clay, magnesium carbonate, calcium carbonate, aluminum hydroxide, and silicate salt compounds. Specific examples of organic fillers include silicone resin, silicone rubber, and fluororesin. Specific examples of wax include polyamide wax and oxidized polyethylene wax. Specific examples of surfactants include silicone oil, higher fatty acid esters, and amides. These fluidity modifiers may be used singly or in a combination of two or more.

In addition, additives such as a thermal polymerization inhibitor, a viscosity improver, an antifoaming agent, a leveling agent and an adhesion promoter can optionally be added to the composition. Specific examples of thermal polymerization inhibitors include hydroquinone, hydroquinone monomethyl ether, tert-butyl catechol, pyrogallol, and phenothiazine. Specific examples of viscosity improvers include asbestos, Orben, Benton, and montmorillonite. An antifoaming agent is used to eliminate bubbles occurring during printing, application or curing, and specific examples include surfactants such as acrylic and silicone surfactants. A leveling agent is used to eliminate irregularities occurring on a coating surface during printing or application, and specific examples include surfactants such as acrylic and silicone surfactants. Specific examples of adhesion promoters include imidazoles, triazoles, triazoles, and silane coupling agents.

Other additives such as an ultraviolet protective agent and a plasticizer for storage stability can also be added.

iii-d-f) Applications of Curable Composition for Solder Resists

A coating film is formed by applying the above curable composition for solder resists to an appropriate thickness on, for example, a substrate by screen printing and drying the coating by heat treatment. The coating film can then be subjected to exposure, development, and thermal curing to form a cured material.

The above curable composition for solder resists can be used for a variety of applications and is particularly suitable for use as an insulating protective film for printed circuit boards because it has superior photosensitivity and developability and is also superior in terms of adhesion to substrates, insulation, heat resistance, warping deformation resistance, flexibility, and external appearance when cured to form a thin film.

To form an insulating protective film, the composition or ink is applied to a thickness of 10 to 100 µm on a substrate having a circuit formed thereon and is dried to a thickness of 5 to 70 µm by heat treatment at 60° C. to 100° C. for about 5 to 30 minutes. The coating is then exposed through a negative mask having a desired exposure pattern and is subjected to development using a developer to remove unexposed portions. Subsequently, the coating is thermally cured at 100° C. to 180° C. for about 10 to 40 minutes.

This curable composition provides particularly superior flexibility when cured to form a cured material, and because the cured material has superior flexibility, it is particularly suitable for use as an insulating protective film for an FPC board, making it resistant to curling and easy to handle. The cured material may also be used as, for example, an interlayer insulating resin layer for multilayer printed circuit boards.

The active light source used for exposure is active light emitted from a known active light source, for example, a carbon arc, a mercury vapor arc, or a xenon arc.

The developer used can be an alkaline aqueous solution of, for example, potassium hydroxide, sodium hydroxide, sodium carbonate, potassium carbonate, sodium phosphate, sodium silicate, ammonia, or an amine.

This curable composition can also be used for a photosensitive layer of a dry film resist. The dry film resist has a photosensitive layer formed of the composition on a support such as a polymer film. The photosensitive layer preferably has a thickness of 10 to 70 µm. Specific examples of the polymer film used as the support include films of polyester resins such as polyethylene terephthalate and aliphatic polyesters and polyolefin resins such as polypropylene and low-density polyethylene.

The dry film resist is formed by applying the curable composition onto the support and drying the coating to form the photosensitive layer. A dry film resist having films on both sides of a photosensitive layer can also be produced by providing a cover film on the formed photosensitive layer such that the support, the photosensitive layer, and the cover film are sequentially stacked. The cover film, provided on the photosensitive layer, protects the photosensitive layer until being removed when the dry film resist is used, thus providing the dry film resist with a long pot life.

To form an insulating protective film on a printed circuit board using the dry film resist, first, the photosensitive layer of the dry film resist is bonded to the board. If the dry film resist used has a cover film, the photosensitive layer is exposed by removing the cover film before being brought into contact with the board.

Next, the photosensitive layer is laminated on the board by thermally bonding them together at about 40° C. to 120° C. using, for example, a pressure roller. The photosensitive layer is then exposed through a negative mask having a desired exposure pattern, the support is removed therefrom, and the photosensitive layer is subjected to development using a developer to remove unexposed portions and is thermally cured, thus producing a printed circuit board having an insulating protective film disposed thereon. The dry film resist may also be used to form an insulating resin layer in a multilayer printed circuit board.

iii-e) Curable Composition Suitable for Coating

An example of a curable composition suitable for coating (hereinafter also simply referred to as the "coating composition") is a curable composition containing the reactive urethane compound (A) of the present invention, the polymerization initiator (B), and at least one material selected from the group consisting of the reactive monomer (C), the multifunctional thiol (F) and an urethane oligomer (I).

iii-e-a) Polymerization Initiator (B)

The polymerization initiator (B) used can be a compound as described in iii-a) above.

The content of the polymerization initiator (B) in the above coating composition is preferably 1 to 50 parts by mass, more preferably 2 to 20 parts by mass, still more preferably 2 to 10 parts by mass, based on 100 parts by mass of the reactive urethane compound (A). If the amount of polymerization initiator used falls within the above range, the polymerization rate of the reactive urethane compound (A), the reactive monomer (C) and the urethane oligomer (I) increases, and the curable composition does not suffer polymerization inhibition due to, for example, oxygen. In addition, a resultant cured film achieves high strength, adhesion strength, and heat resistance and is hardly colored.

iii-e-b) Reactive Monomer (C)

The coating composition of the present invention may contain the reactive monomer (C). The reactive monomer (C) used can be a compound as described in iii-b) above.

The amount of reactive monomer (C) used for the above coating composition is preferably, but not limited to, 1 to 200 parts by mass, more preferably 10 to 180 parts by mass, still more preferably 20 to 150 parts by mass, particularly preferably 50 to 100 parts by mass, based on 100 parts by mass of the reactive urethane compound (A). If the reactive monomer (C) is used in an amount within the above range, it is possible to adjust the viscosity of the composition and to adjust the properties of the resultant cured material, including mechanical properties such as reactivity, hardness, elasticity and adhesion and optical properties such as transparency.

iii-e-c) Multifunctional Thiol (F)

The coating composition of the present invention may contain the multifunctional thiol (F). The multifunctional thiol (F) used can be a compound as described in iii-c-f) above.

If the coating composition contains the multifunctional thiol (F), the curability and curling resistance of the curable composition can be improved. The curability can be improved because the addition of the multifunctional thiol reduces inhibition of radical polymerization due to oxygen, whereas the curling resistance can be improved because the addition of the multifunctional thiol facilitates ene-thiol addition reaction to lower the degree of polymerization and therefore crosslinking density. A higher curability means a smaller amount of energy radiation required for curing the curable composition per unit amount. Hence, based on the fact that the time for irradiation with energy radiation can be reduced, the present invention contributes to an increase in the productivity of the cured material and a cost reduction due to energy conservation, thus having a great industrial importance.

iii-e-d) Urethane Oligomer (I)

The coating composition of the present invention may contain the urethane oligomer (I). The use of the urethane oligomer (I) allows adjustment of the surface hardness of the cured material formed by curing the curable composition and reduces curling during the curing.

The above urethane oligomer (I) is an oligomer having a urethane bond, although the ethylenically-unsaturated-group containing reactive urethane compound (A) is excluded. Specific examples include the trade names BEAMSET 102, 502H, 505A-6, 510, 550B, 551B, 575, 575CB, EM-90, and EM92, manufactured by Arakawa Chemical Industries, Ltd.; the trade names PHOTOMER 6008 and 6210, manufactured by San Nopco Limited; the trade names NK OLIGO U-2PPA, U-4HA, U-6HA, U-15HA, UA-32P, U-324A, U-4H, U-6H, UA-160TM, UA-122P, UA-2235PE, UA-340P, UA-5201, and UA-512, manufactured by Shi-Nakamura Chemical Co., Ltd.; the trade names ARONIX M-1100, M-1200, M-1210, M-1310, M-1600, M-1960, and M-5700 and ARON OXETANE OXT-101, manufactured by Toagosei Co., Ltd.; the trade names AH-600, AT606, UA-306H, and UF-8001, manufactured by Kyoeisha Chemical Co., Ltd.; the trade names KAYARAD UX-2201, UX-2301, UX-3204, UX-3301, UX-4101, UX-6101, and UX-7101, manufactured by Nippon Kayaku Co., Ltd.; the trade names SHIKOH UV-1700B, UV-3000B, UV-6100B, UV-6300B, UV-7000, UV-7600B, UV-7605B, UV-2010B, UV-6630B, UV-7510B, UV-7461TE, UV-3310B, and UV-6640B, manufactured by The Nippon Synthetic Chemical Industry Co., Ltd.; the trade names ART RESIN UN-1255, UN-5200, UN-7700, UN-333, UN-905, HDP-4T, HMP-2, UN-901T, UN-3320HA, UN-3320HB, UN-3320HC, UN-3320HS, H-61, HDP-M20, UN-5500, and UN-5507, manufactured by Negami Chemical Industrial Co., Ltd.; and the trade names EBECRYL 6700, 204, 205, 220, 254, 1259, 1290K, 1748, 2002, 2220, 4833, 4842, 4866, 5129, 6602, and 8301, manufactured by Dalcel-UCB Co., Ltd.

In view of imparting hardness, the urethane oligomer (I) preferably has three or more (meth)acrylate groups, more preferably six or more (meth)acrylate groups, and specific examples include the trade names U-6HA, U-15HA, UA-32P, UV-1700B, UV-7600B, and UV-7605B, described above.

In view of imparting flexibility, preferred examples of the urethane oligomer (I) include the trade names UA-160TM, UA-122P, UA-5201, UV-6630B, UV-7000B, UV-6640B, UN-905, UN-901T, and UN-7700, described above.

The molecular weight of the above urethane oligomer (I) is preferably, but not limited to, 500 to 15,000, more preferably 1,000 to 3,000.

The above urethane oligomers (I) can be used singly or in a combination of two or more. In addition, the amount of urethane oligomer (I) used is preferably, but not limited to, 1 to 1,000 parts by mass, more preferably 2 to 500 parts by mass, still more preferably 5 to 300 parts by mass, based on 100 parts by mass of the reactive urethane compound (A).

iii-e-e) Other Components

The coating composition of the present invention may contain a polymerization inhibitor in an amount of 0.1 part by mass or less based on 100 parts by mass of the curable composition. The polymerization inhibitor is used to prevent the components of the curable composition from causing polymerization reaction during storage. Examples of the polymerization inhibitor include hydroquinone, hydroquinone monomethyl ether, benzoquinone, p-t-butylcatechol, and 2,6-di-t-butyl-4-methylphenol.

In addition, a leveling agent, a filler, a pigment, an inorganic filler, a solvent, and other modifiers may be added to the curable composition of the present invention.

Examples of leveling agents include polyether-modified dimethylpolysiloxane copolymer, polyester-modified dimethylpolysiloxane copolymer, polyether-modified methylalkylpolysiloxane copolymer, aralkyl-modified methylalkylpolysiloxane copolymer and polyether-modified methylalkylpolysiloxane copolymer.

Examples of fillers and pigments include calcium carbonate, talc, mica, clay, silica (such as colloidal silica and AEROZIL (registered trademark)), barium sulfate, aluminum hydroxide, zinc stearate, Chinese white, colcothar, and azo pigments.

Examples of inorganic fillers include conductive metal microparticles and metal oxide microparticles. Specific examples of metals include gold, silver, copper, platinum, aluminum, antimony, selenium, titanium, tungsten, tin, zinc, indium, and zirconia, whereas specific examples of metal oxides include alumina, antimony oxide, selenium oxide, titanium oxide, tungsten oxide, tin oxide, antimony-doped tin oxide (ATO (tin oxide doped with antimony)), phosphorus-doped tin oxide, zinc oxide, zinc antimonate, and tin-doped indium oxide.

Examples of other modifiers include polyolefin resins, chlorinated polyolefin resins, unsaturated polyester resins, vinyl ester resins, vinyl urethane resins, vinyl ester urethane resins, polyisocyanates, polyepoxides, epoxy-terminated polyoxazolidone, acrylic resins, alkyd resins, urea resins, melamine resins, polydiene elastomers, saturated polyesters, saturated polyethers, cellulose derivatives such as nitrocellulose and cellulose acetate butyrate, and natural and synthetic polymeric materials such as oils and fats, including linseed oil, tung oil, soybean oil, castor oil and epoxidized oil.

iii-e-f) Method for Producing Coating Composition

The coating composition of the present invention can be produced by mixing the reactive urethane compound (A) and the polymerization initiator (B) at room temperature or under heated conditions using a mixing machine such as a mixer, a ball mill, or a three-roll mill, or by dissolving them by adding a diluent such as a reactive monomer or a solvent.

Specific examples of the solvent used in the present invention include esters such as ethyl acetate, butyl acetate, and isopropyl acetate; ketones such as acetone, methyl ethyl ketone, methyl isobutyl ketone, and cyclohexanone; cyclic ethers such as tetrahydrofuran and dioxane; amides such as N,N-dimethylformamide; aromatic hydrocarbons, such as toluene; halogenated hydrocarbons, such as dichloromethane; ethylene glycols such as ethylene glycol, ethylene glycol methyl ether, ethylene glycol mono-n-propyl ether, ethylene glycol monomethyl ether acetate, diethylene glycol, diethylene glycol monomethyl ether, diethylene glycol monoethyl ether, and diethylene glycol monoethyl ether acetate; and propylene glycols such as propylene glycol, propylene glycol methyl ether, propylene glycol ethyl ether, propylene glycol butyl ether, propylene glycol propyl ether, propylene glycol monomethyl ether acetate, dipropylene glycol, dipropylene glycol monomethyl ether, dipropylene glycol monoethyl ether, and dipropylene glycol monomethyl ether acetate. Of these, ethyl acetate, methyl ethyl ketone, cyclohexanone, toluene, dichloromethane, diethylene glycol monomethyl ether, and propylene glycol monomethyl ether acetate are preferred.

The above solvents can be used singly or in a combination of two or more. The amount of solvent used is preferably 50 to 200 parts by mass, more preferably 50 to 100 parts by mass, based on 100 parts by mass of the curable composition.

iii-e-g) Method for Forming Cured Material

The coating composition of the present invention can be cured by, for example, applying the curable composition onto a substrate and irradiating with activation energy radiation or heating the coating formed thereon. The curing may be performed by both irradiation with activation energy radiation and heating.

Examples of the application method include application using a bar coater, an applicator, a die coater, a spin coater, a spray coater, a curtain coater, or a roll coater, application by screen printing, and application by dipping.

The amount of coating composition of the present invention applied onto the substrate is not particularly limited and can be appropriately adjusted depending on purposes; it is preferably such that the coating subjected to the curing treatment by irradiation with activation energy radiation after the application and drying has a thickness of 1 to 200 µm, more preferably 5 to 100 µm, for evaluation.

The activation energy radiation used for curing is preferably an electron beam or light in the ultraviolet to infrared wavelength range. For ultraviolet light, for example, an ultra-high-pressure mercury light source or a metal halide light source can be used. For visible light, a metal halide light source or a halogen light source can be used. For infrared light, a halogen light source can be used. Other light sources such as a laser and an LED can also be used. The amount of activation energy radiation applied is appropriately determined depending on, for example, the type of light source and the thickness of the coating.

If the above coating composition is composed of the ethylenically-unsaturated-group containing reactive urethane compound (A) and the polymerization initiator (B), the SP of the reactive urethane compound (A) is preferably 10.5 to 11.0, more preferably 10.6 to 10.8.

If the above coating composition contains not only the ethylenically-unsaturated-group containing reactive urethane compound (A) and the polymerization initiator (B), but also the reactive monomer (C), the total SP of the ethylenically-unsaturated-group containing reactive urethane compound (A) and the reactive monomer (C) is preferably 10.5 to 11.0, more preferably 10.6 to 10.8. The total SP of the ethylenically-unsaturated-group containing reactive urethane compound (A) and the reactive monomer (C) is determined by determining the SP of the ethylenically-unsaturated-group containing reactive urethane compound (A) and the SP of the reactive monomer (C) and averaging them based on their respective mixing ratios by mass. Likewise, if the above coating composition further contains a component, such as the multifunctional thiol (F) or the urethane oligomer (I), that can constitute part of the copolymer formed by the curing reaction of the composition, the SP determined by averaging the SP of the individual components based on their respective mixing ratios by mass is preferably 10.5 to 11.0, more preferably 10.6 to 10.8. If the SP deviates from these ranges, a mismatch in wettability with a PET substrate occurs, thus making it difficult to provide superior adhesion strength. The SP is synonymous with the solubility parameter calculated by Fedors method and is represented by the following equation.

$$SP = (\Delta H/V)^{1/2}$$

In the equation, $\Delta H$ is molar heat of vaporization (cal), and V is molar volume (cm$^3$). The values of $\Delta H$ and V used herein can be the sum ($\Delta H$) of the molar heat of vaporization ($\Delta e_i$) and the sum (V) of the molar volume ($\Delta V_i$), respectively, of atomic groups described in pp. 48 to 57 of Yuji Harasaki, "Basic Science of Coating", Maki Shoten, Jun. 30, 1983, first edition.

EXAMPLES

The present invention will be more specifically described with reference to the examples below, although the invention is not limited thereto.

1. Curable Composition (1-1) Synthesis of Ethylenically-Unsaturated-Group Containing Reactive Urethane Compound Methods for synthesizing ethylenically-unsaturated-group containing reactive urethane compounds used in this study will be shown below. Although methods for synthesizing typical compounds are disclosed herein, the invention is not limited thereto, but other urethane(meth)acrylates can be similarly synthesized using various alcohols, amines, and thiols.

Production Example 1

Fed into a reaction vessel equipped with a stirrer, a thermometer and a condenser were 20 g of methylene chloride, serving as a solvent, 2.61 g (10 mmol) of tris(2-hydroxyethyl) isocyanurate (manufactured by Tokyo Chemical Industry Co., Ltd.), serving as a multifunctional alcohol, and 5.97 g (30 mmol) of 2-(isocyanatoethyloxy)ethyl acrylate, and successively 0.02 g of di-t-butylhydroxytoluene and 0.004 g of dibutyltin dilaurate. Next, the temperature inside the reaction vessel was raised to 60° C., and when it started to drop, heating was started again, and stirring was continued at 80° C. The reaction was terminated after confirming that the absorption spectrum (2,250 cm$^{-1}$) of the isocyanate group in an infrared absorption spectrum almost disappeared. After the termination of the reaction, the solvent was removed to yield an ethylenically-unsaturated-group containing reactive urethane compound (M-7) as a viscous transparent liquid.

Production Example 2

Fed into a reaction vessel equipped with a stirrer, a thermometer and a condenser were 20 g of methylene chloride, serving as a solvent, 2.61 g (10 mmol) of tris(2-hydroxyethyl) isocyanurate (manufactured by Tokyo Chemical Industry Co., Ltd.), serving as a multifunctional alcohol, and 5.56 g (30 mmol) of 2-(isocyanatoethyloxy)ethyl methacrylate, and successively 0.02 g of di-t-butylhydroxytoluene and 0.004 g of dibutyltin dilaurate. Next, the temperature inside the reaction vessel was raised to 60° C., and when it started to drop, heating was started again, and stirring was continued at 80° C. The reaction was terminated after confirming that the absorption spectrum (2,250 cm$^{-1}$) of the isocyanate group in an infrared absorption spectrum almost disappeared. After the termination of the reaction, the solvent was removed to yield an ethylenically-unsaturated-group containing reactive urethane compound (M-6) as a viscous transparent liquid.

Comparative Production Example 1

Fed into a reaction vessel equipped with a stirrer, a thermometer and a condenser were 20 g of methylene chloride, serving as a solvent, 2.61 g (10 mmol) of tris(2-hydroxyethyl) isocyanurate (manufactured by Tokyo Chemical Industry Co., Ltd.), serving as a multifunctional alcohol, and 4.65 g (30 mmol) of 2-isocyanatoethyl methacrylate, and successively 0.02 g of di-t-butylhydroxytoluene and 0.004 g of dibutyltin dilaurate. Next, the temperature inside the reaction vessel was raised to 60° C., and when it started to drop, heating was started again, and stirring was continued at 80° C. The reaction was terminated after confirming that the absorption spectrum (2,250 cm$^{-1}$) of the isocyanate group in an infrared absorption spectrum almost disappeared. After the termination of the reaction, the solvent was removed to yield an ethylenically-unsaturated-group containing reactive urethane compound (R-2) as a viscous transparent liquid.

Ethylenically-unsaturated-group containing reactive urethane compounds (M-1) to (M-12) shown in Tables 1-1 and 1-2 below were produced in the same manner as in Production Examples 1 and 2 above. In addition, reactive urethane compounds (R-1) to (R-3) for comparison shown in Table 2 below were produced in the same manner as in Comparative Production Example 1 above. FIGS. 1 to 12 show $^1$H-NMR charts of the resultant ethylenically-unsaturated-group containing reactive urethane compounds (M-1) to (M-12). The NMR measurement was carried out at a frequency of 400 MHz using chloroform-d as a solvent.

TABLE 1-1

Ethylenically-unsaturated-group containing reactive urethane compound

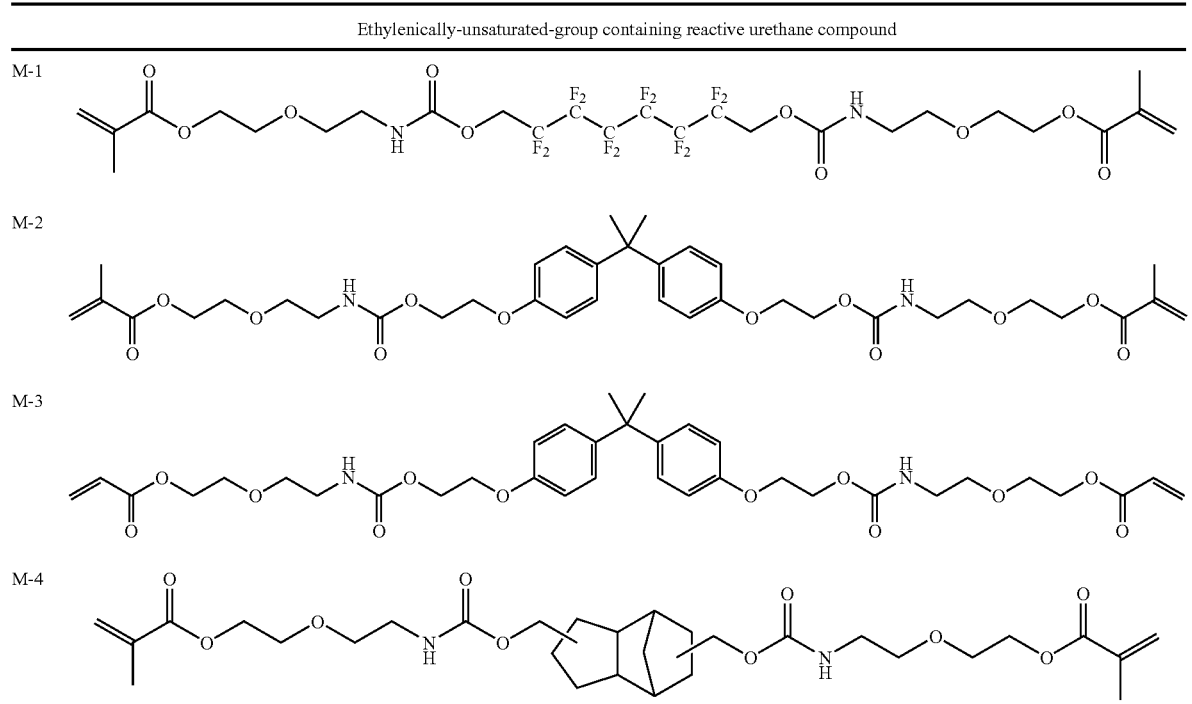

TABLE 1-1-continued
Ethylenically-unsaturated-group containing reactive urethane compound
M-5
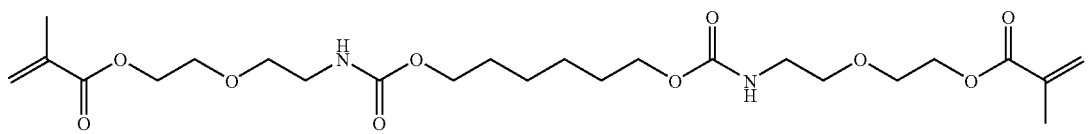 [SMILES: C=C(C)C(=O)OCCOCCNC(=O)OCCCCCCOC(=O)NCCOCCOC(=O)C(=C)C]
M-6
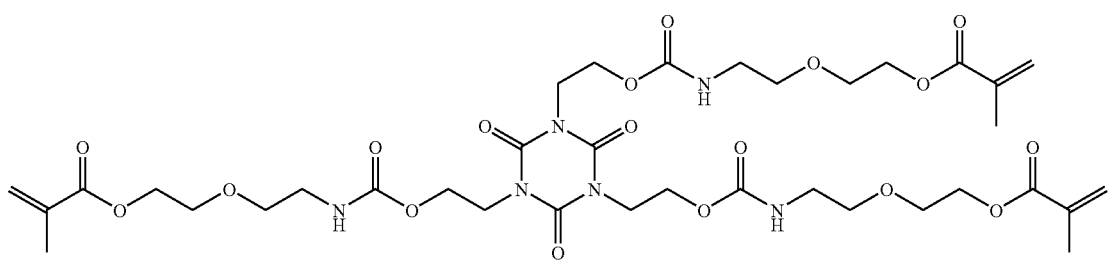 [SMILES: C=C(C)C(=O)OCCOCCNC(=O)OCCn1c(=O)n(CCOC(=O)NCCOCCOC(=O)C(=C)C)c(=O)n(CCOC(=O)NCCOCCOC(=O)C(=C)C)c1=O]
TABLE 1-2
Ethylenically-unsaturated-group containing reactive urethane compound
M-7
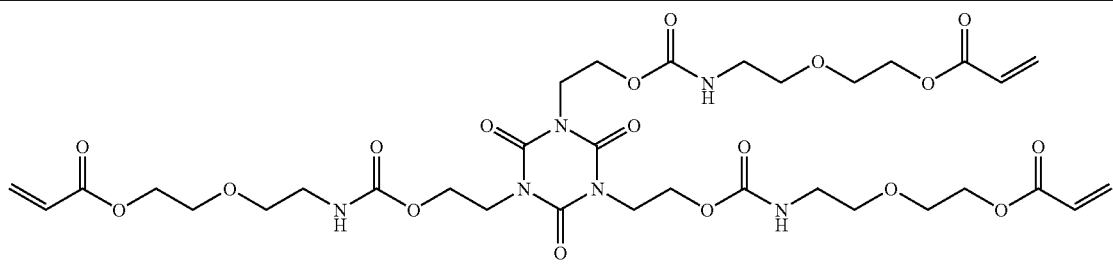
M-8
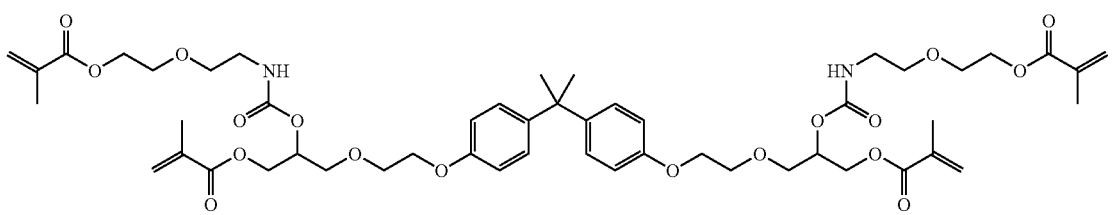 [SMILES: C=C(C)C(=O)OCCOCCNC(=O)OC(COCCOc1ccc(C(C)(C)c2ccc(OCCOCC(COC(=O)C(=C)C)OC(=O)NCCOCCOC(=O)C(=C)C)cc2)cc1)COC(=O)C(=C)C]
M-9
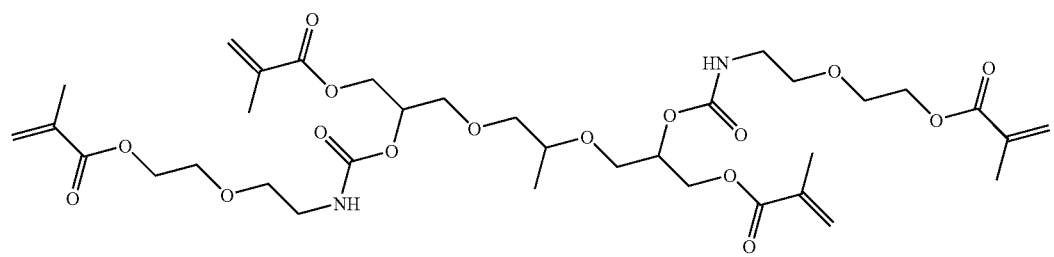 [SMILES: C=C(C)C(=O)OCCOCCNC(=O)OC(COCC(C)OCC(COC(=O)C(=C)C)OC(=O)NCCOCCOC(=O)C(=C)C)COC(=O)C(=C)C]
M-10
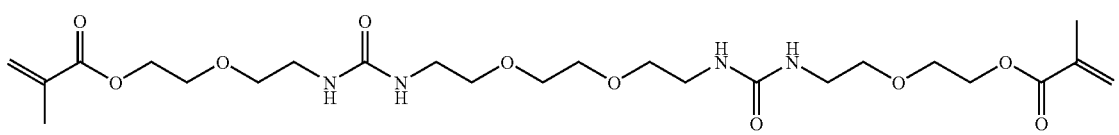 [SMILES: C=C(C)C(=O)OCCOCCNC(=O)NCCOCCOCCNC(=O)NCCOCCOC(=O)C(=C)C]
M-11
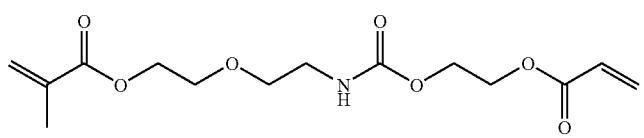 [SMILES: C=CC(=O)OCCOC(=O)NCCOCCOC(=O)C(=C)C]

TABLE 1-2-continued

Ethylenically-unsaturated-group containing reactive urethane compound

M-12

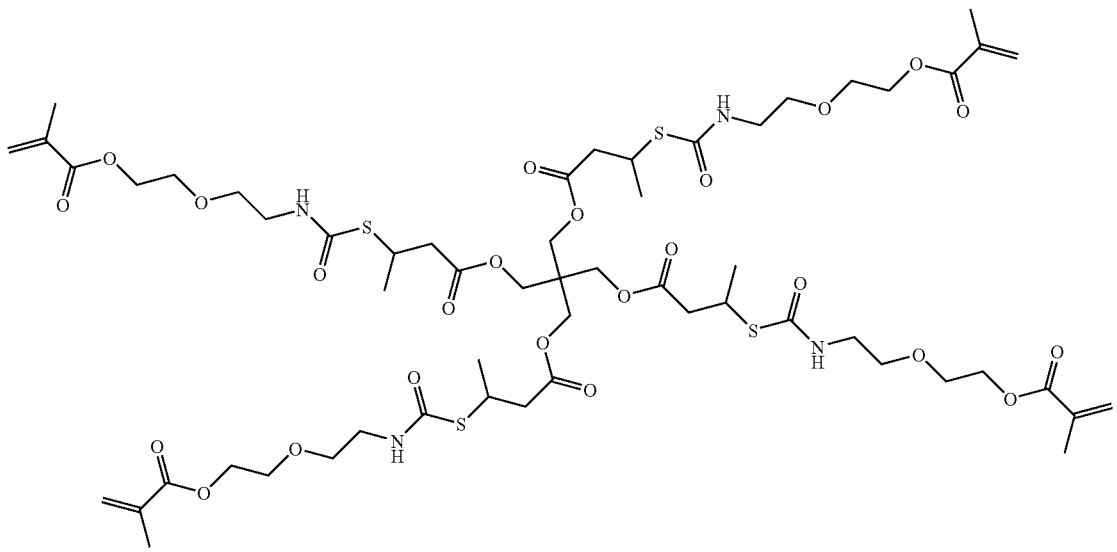 [SMILES: C=C(C)C(=O)OCCOCCNC(=O)SC(C)CC(=O)OCC(COC(=O)CC(C)SC(=O)NCCOCCOC(=O)C(=C)C)(COC(=O)CC(C)SC(=O)NCCOCCOC(=O)C(=C)C)COC(=O)CC(C)SC(=O)NCCOCCOC(=O)C(=C)C]

TABLE 2

Reactive urethane compound for comparison

R-1

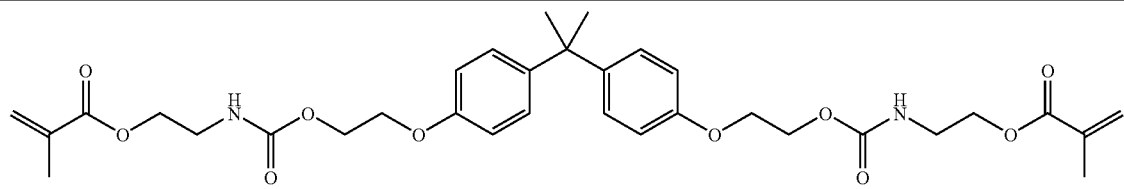

R-2

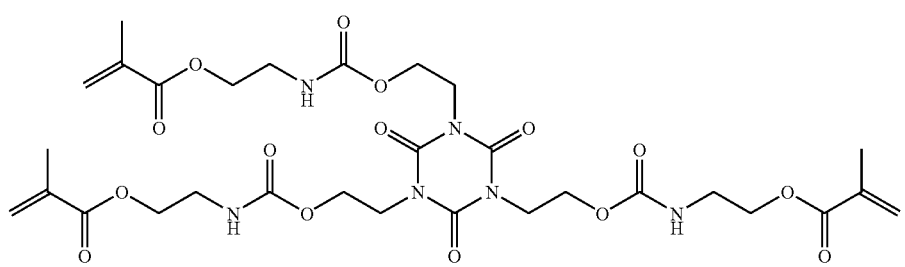 [SMILES: C=C(C)C(=O)OCCNC(=O)OCCn1c(=O)n(CCOC(=O)NCCOC(=O)C(=C)C)c(=O)n(CCOC(=O)NCCOC(=O)C(=C)C)c1=O]

R-3

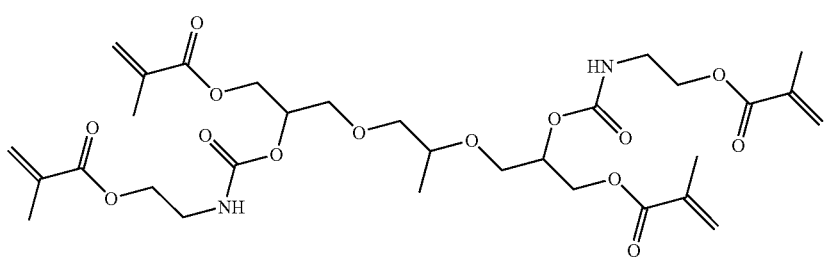 [SMILES: C=C(C)C(=O)OCCNC(=O)OC(COCC(C)OCC(COC(=O)C(=C)C)OC(=O)NCCOC(=O)C(=C)C)COC(=O)C(=C)C]

(1-2) Preparation of Curable Composition and Evaluation Sample

Example 1

A curable composition solution was prepared by mixing and stirring 100 g of the ethylenically-unsaturated-group containing reactive urethane compound (M-1) in Table 1 and 2 g of 1-hydroxycyclohexyl phenyl ketone (Irgacure 184, manufactured by Ciba Specialty Chemicals K.K.), serving as a photoinitiator, in 20 g of dichloromethane (manufactured by Junsei Chemical Co., Ltd.) at room temperature to dissolve them homogeneously. The resultant curable composition solution was then applied onto glass substrates (measuring 50 mm×50 mm) so that the dry-film thickness was about 100 μm, and the solvent was dried at 50° C. for 30 minutes to prepare evaluation samples.

Examples 2 to 12 and Comparative Examples 1 to 3

Curable compositions and evaluation samples were prepared in the same manner as in Example 1 except that the reactive urethane compound (M-1) was replaced with those in Table 3.
(1-3) Evaluation
<Flexibility (Maximum Elongation)>
The evaluation samples prepared in (1-2) above were cured by exposure at 500 mJ/cm$^2$ using an exposure system incorporating an ultrahigh-pressure mercury lamp. The resultant cured materials were cut to a size of 5 mm×30 mm, and the elastic moduli (N/mm$^2$) and maximum elongations (%) thereof were measured using a tensile tester manufactured by Seiko Instruments Inc. The results are shown in Table 3.
<Flexibility (180° Bending Test)>
The evaluation samples prepared in (1-2) above were cured by exposure at 500 mJ/cm$^2$ using an exposure system incorporating an ultrahigh-pressure mercury lamp. The resultant cured materials were cut to a size of 5 mm×30 mm and were bent through 180°. This operation was carried out five times, and the cured materials were evaluated according to the following criteria. The results are shown in Table 3.
A: No crack was found in any sample.
B: A crack occurred in one or more of the five samples.
C: A crack occurred in every sample.
<Adhesion Strength>
The evaluation samples prepared in (1-2) above were cured by exposure at 500 mJ/cm$^2$ using an exposure system incorporating an ultrahigh-pressure mercury lamp. The surfaces of the cured films of the samples were polished with sand paper, and the adhesion strengths thereof were measured using an adhesion tester (Elcometor, manufactured by Elcometer Instrument, Std.) with a jig thereof fixed by curing an epoxy adhesive (HC-1210, manufactured by Mitsui Chemicals, Inc.). The results are shown in Table 3.
<Transmittance>
The evaluation samples prepared in (1-2) above were cured by exposure at 3 J/cm$^2$ using an exposure system incorporating an ultrahigh-pressure mercury lamp. The transmittances at 400 nm of the cured samples were measured using a spectrophotometer (UV3100, manufactured by Jasco Corporation). The results are shown in Table 3.

For flexibility (maximum elongation), a higher elongation was observed in any of Examples 1 to 12 than in Comparative Examples 1 to 3. This is a numerical indication of the flexibility of the ethylene glycol backbone in the urethane compounds. The superiority of the cured materials of Examples 1 to 12 was also demonstrated by the results of the 180° bending test.
As for adhesion strength, the cured materials of Examples 1 to 12 exhibited sufficiently high values as compared with those of Comparative Examples 1 to 3. The reactive urethane compounds (M-1) to (M-12) have an ethylene-glycol-derived ether structure in the molecules thereof; it seems that this facilitated flexibility and stress relaxation, thus improving adhesion strength.
2. Curable Composition for Color Filters
(2-1) Synthesis of Ethylenically-Unsaturated-Group Containing Reactive Urethane Compound Polymer Production Example 3

Figure 13:
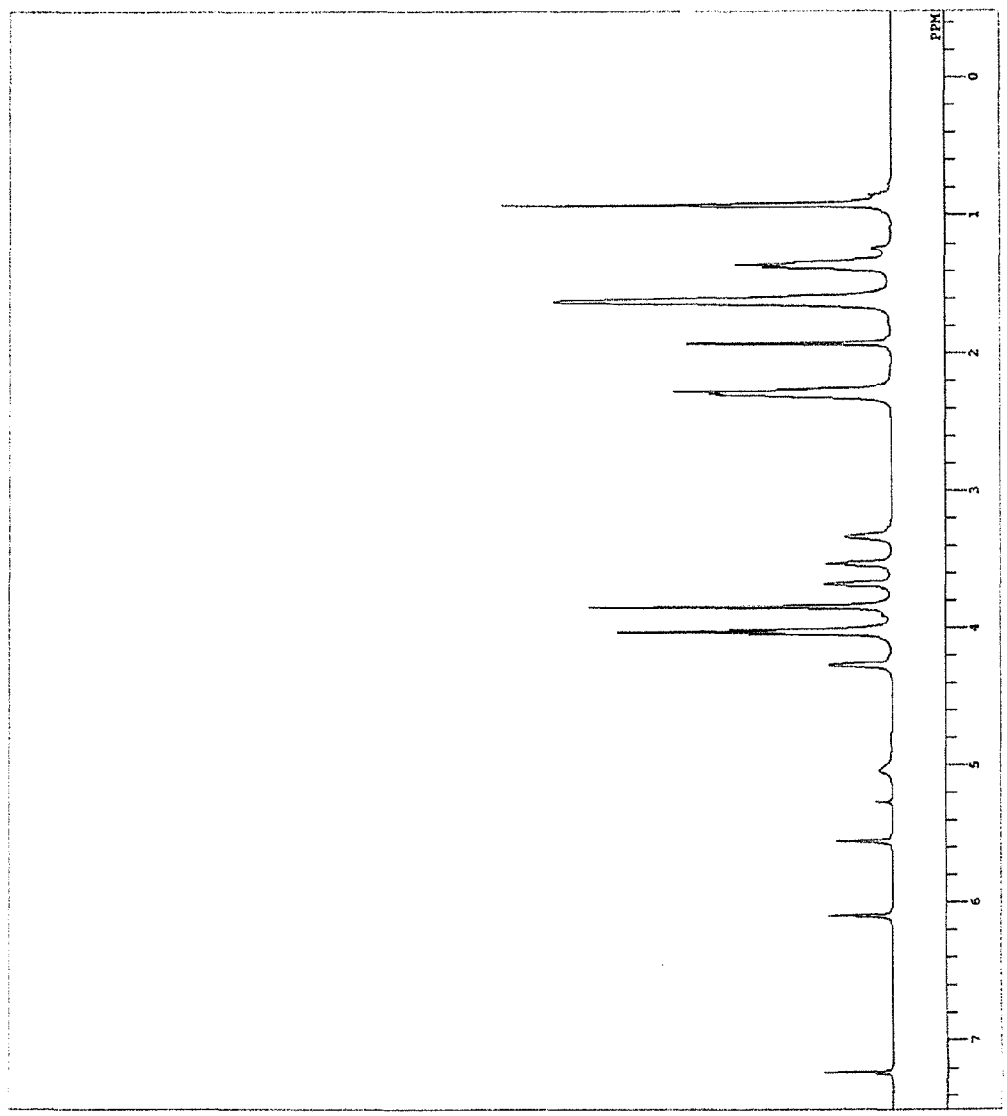
FIG. 13 shows the $^1$H-NMR spectrum of a reactive urethane compound polymer (UB-1) of the present invention synthesized in the examples.

Fed into a reaction vessel equipped with a stirrer, a thermometer and a condenser were 12.5 g (10 mmol) of polycaprolactone diol (PLACCEL 212, manufactured by Daicel Chemical Industries, Ltd.; molecular weight: 1,250), serving as a polyester polyol, and 4.0 g (20 mmol) of 2-(isocyanatoethyloxy)ethyl methacrylate, and successively 0.02 g of p-methoxyphenol and 0.02 g of di-t-butylhydroxytoluene. After the mixture was heated to 60° C. while being stirred, heating was suspended, and 0.004 g of dibutyltin dilaurate was added thereto. Heating was started again when the temperature inside the reaction vessel started to drop, and stirring was continued at 80° C. The reaction was terminated after confirming that the absorption spectrum (2,280 cm$^{-1}$) of the isocyanate group in an infrared absorption spectrum almost disappeared, thus yielding a reactive urethane compound polymer (UB-1) as a viscous liquid. The weight-average molecular weight of the resultant reactive urethane compound polymer (UB-1) measured on a polystyrene basis by GPC was 1,650. FIG. 13 shows a $^1$H-NMR chart of the compound (UB-1). The NMR measurement was carried out at a frequency of 400 MHz using chloroform-d as a solvent.

Production Example 4

A reactive urethane compound polymer (UB-2) was synthesized in the same manner as in Production Example 3 except that the polycaprolactone diol was replaced with 10 g

TABLE 3

| Example | Sample name | Light transmittance (%) 400 nm, 100 μm | Adhesion strength (N/mm$^2$) | Elastic modulus (N/mm$^2$) | Maximum elongation (%) | 180° bending |
|---|---|---|---|---|---|---|
| Ex. 1 | M-1 | 99.6 | 0.6 | 1139 | 14.4 | A |
| Ex. 2 | M-2 | 99.8 | 1.8 | 809 | 6.9 | A |
| Ex. 3 | M-3 | 99.0 | 1.2 | 905 | 7.8 | A |
| Ex. 4 | M-4 | 99.0 | 1.0 | 1334 | 10.3 | A |
| Ex. 5 | M-5 | 97.7 | 0.5 | 832 | 9.1 | A |
| Ex. 6 | M-6 | 98.0 | 1.2 | 1061 | 11.7 | A |
| Ex. 7 | M-7 | 98.2 | 0.9 | 1002 | 9.7 | A |
| Ex. 8 | M-8 | 96.6 | 3.0 | 794 | 7.4 | A |
| Ex. 9 | M-9 | 98.8 | 1.0 | 1920 | 8.8 | A |
| Ex. 10 | M-10 | 98.0 | 0.8 | 883 | 13.8 | A |
| Ex. 11 | M-11 | 96.0 | 1.4 | 1526 | 8.4 | A |
| Ex. 12 | M-12 | 98.1 | 0.9 | 1382 | 9.6 | A |
| Comp. Ex. 1 | R-1 | 98.5 | 0.4 | 1261 | 2.5 | B |
| Comp. Ex. 2 | R-2 | 98.9 | 0.3 | 1926 | 6.7 | C |
| Comp. Ex. 3 | R-3 | 98.1 | 0.4 | 1004 | 6.3 | B |

(10 mmol) of polycarbonate diol (PLACCEL CD210PL, manufactured by Daicel Chemical Industries, Ltd.; average molecular weight: 1,000). The weight-average molecular weight of the resultant reactive urethane compound polymer (UB-2) measured on a polystyrene basis by GPC was 1,400.

Production Example 5

A urethane methacrylate polymer (UB-3) was synthesized in the same manner as in Production Example 3 except that the polycaprolactone diol was replaced with 8.5 g (10 mmol) of polytetramethylene glycol (PTMG-850, manufactured by Hodogaya Chemical Co., Ltd.; molecular weight: 850). The weight-average molecular weight of the resultant reactive urethane compound polymer (UB-3) measured on a polystyrene basis by GPC was 1,250.

Production Example 6

Fed were 5.1 g (6 mmol) of polytetramethylene glycol (PTMG-850, manufactured by Hodogaya Chemical Co., Ltd.; molecular weight: 850), 1.3 g (10 mmol) of dimethylolpropionic acid, 2.7 g (12 mmol) of isophorone diisocyanate and 1.6 g (8 mmol) of 2-(isocyanatoethyloxy)ethyl methacrylate, and successively 0.002 g of p-methoxyphenol and 0.002 g of di-t-butylhydroxytoluene. After the mixture was heated to 60° C. while being stirred, heating was suspended, and 0.002 g of dibutyltin dilaurate was added thereto. Heating was started again when the temperature inside the reaction vessel started to drop, and stirring was continued at 80° C. The reaction was terminated after confirming that the absorption spectrum (2,280 cm$^{-1}$) of the isocyanate group in an infrared absorption spectrum almost disappeared, thus yielding a reactive urethane compound polymer (UB-4) as a viscous liquid. The weight-average molecular weight of the resultant reactive urethane compound polymer (UB-4) measured on a polystyrene basis by GPC was 23,000, and the acid value was 45 mgKOH/g.

Production Example 7

A reactive urethane compound polymer (UB-5) was synthesized in the same manner as in Production Example 3 except that the polycaprolactone diol was replaced with 10 g (10 mmol) of polycarbonate diol (PLACCEL CD210PL, manufactured by Daicel Chemical Industries, Ltd.; average molecular weight: 1,000) and that 3.7 g (20 mmol) of 2-(isocyanatoethyloxy)ethyl acrylate was used. The weight-average molecular weight of the resultant reactive urethane compound polymer (UB-5) measured on a polystyrene basis by GPC was 1,500.

Production Example 8

Figure 14:
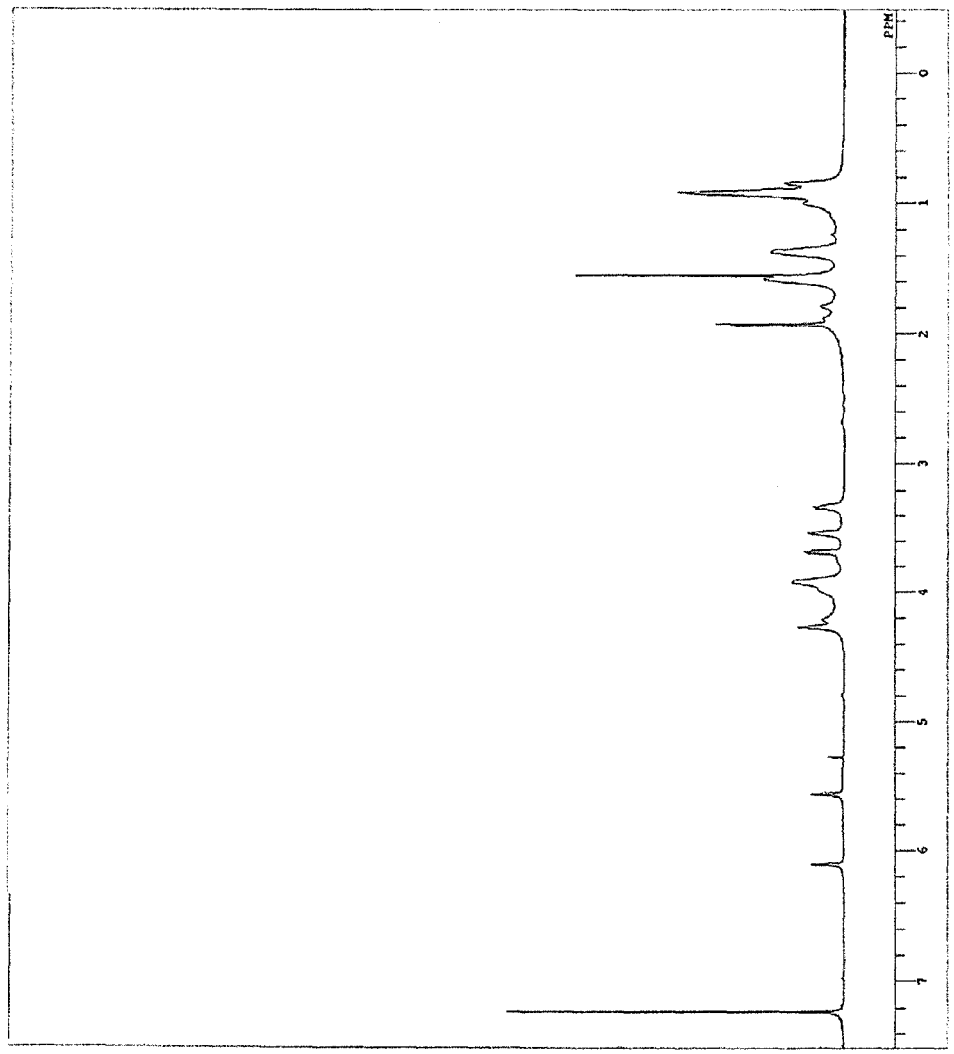
FIG. 14 shows the $^1$H-NMR spectrum of a reactive urethane compound polymer (UB-6) of the present invention synthesized in the examples.

Fed into a four-necked flask equipped with a dropping funnel, a thermometer, a condenser and a stirrer were 6.0 g of methacrylic acid, 3.0 g of 2-hydroxyethyl acrylate and 112.0 g of propylene glycol monomethyl ether acetate, and the four-necked flask was purged with nitrogen for one hour. After the mixture was heated to 90° C. in an oil bath, a mixed solution of 6.0 g of methacrylic acid, 7.0 g of methyl methacrylate, 21.5 g of butyl methacrylate, 3.0 g of 2-hydroxyethyl acrylate, 112.0 g of propylene glycol monomethyl ether acetate and 1.6 g of azobisisobutyronitrile was dropped in one hour. After polymerization was facilitated for three hours, a mixed solution of 0.5 g of azobisisobutyronitrile and 8.0 g of propylene glycol monomethyl ether acetate was added. The solution was further heated to 100° C. to facilitate the polymerization for 1.5 hours and was left standing to cool. Gradually added to this solution was 8.5 g of 2-(isocyanatoethyloxy)ethyl acrylate, and the solution was stirred at 80° C. for four hours, thus synthesizing a reactive urethane compound copolymer (UB-6). The acid value of the resultant reactive urethane compound copolymer (UB-6) was 90 mgKOH/g, and the weight-average molecular weight measured on a polystyrene basis by GPC was 24,000. FIG. 14 shows a $^1$H-NMR chart of the compound (UB-6). The NMR measurement was carried out at a frequency of 400 MHz using chloroform-d as a solvent.

The molecular weight of methacrylic acid is 86.1, and the amount added was 12 g (0.139 mol). The molecular weight of 2-hydroxyethyl acrylate is 130.1, and the amount added was 6 g (0.046 mol). The molecular weight of methyl methacrylate is 100.1, and the amount added was 7 g (0.07 mol). The molecular weight of butyl methacrylate is 142.2, and the amount added was 21.5 g (0.151 mol). Given that these react ideally, a compound having a molecular weight per molecule of 2-hydroxyethyl acrylate of 1,200 is formed. That is, the resultant compound has a double bond equivalent of 1,200, and the value of m in formula (II) above is 20.

Comparative Production Example 2

A reactive urethane compound polymer (R-4) was formed by facilitating reaction in the same manner as in Production Example 3 except that the 2-(isocyanatoethyloxy)ethyl methacrylate in Production Example 3 was replaced with 3.1 g (20 mmol) of 2-methacryloyloxyethyl isocyanate. The weight-average molecular weight of the resultant reactive urethane compound polymer (R-4) measured on a polystyrene basis by GPC was 1,600.

Comparative Production Example 3

A reactive urethane compound polymer (R-5) was formed by facilitating reaction in the same manner as in Production Example 4 except that the 2-(isocyanatoethyloxy)ethyl methacrylate in Production Example 4 was replaced with 3.1 g (20 mmol) of 2-methacryloyloxyethyl isocyanate. The weight-average molecular weight of the resultant reactive urethane compound polymer (R-5) measured on a polystyrene basis by GPC was 1,300.

(2-2) Preparation of Curable Composition for Color Filters

With the above ethylenically-unsaturated-group containing reactive urethane compound polymers (UB-1) to (UB-6) and the above reactive urethane compound polymers (R-4) and (R-5) for comparison, curable resin compositions for color filters were prepared according to the compositions shown in Table 4. As a typical case, a method for preparing Example 13 will be described below. In Table 4, the values of the compositions are all expressed in parts by mass.

Example 13

Mixed with 2.3 g of the reactive urethane compound polymer (UB-1) produced in Production Example 3 were propylene glycol monomethyl ether acetate, a dispersant (FLOWLEN DOPA-33, manufactured by Kyoeisha Chemical Co., Ltd.; solid content: 30%), carbon black (Special Black 4, manufactured by Deggusa AG), HABI, BMK, TMPT, TPMB, and cyclohexanone in the proportions shown in parts by mass in Table 4, and the mixture was left standing overnight. Next, the mixture was stirred for one hour and was passed four times through a three-roll mill (RIII-1RM-2, manufactured by Kodaira Seisakusho Co., Ltd.). Cyclohexanone was further added to the resultant black mixture to adjust the concentration thereof, thus yielding 420 g of a black curable composition having a solid content of 18.0%.

TABLE 4

|  |  | Ex. 13 | Ex. 14 | Ex. 15 | Ex. 16 | Ex. 17 | Ex. 18 | Comp. Ex. 4 | Comp. Ex. 5 |
|---|---|---|---|---|---|---|---|---|---|
| (A) Reactive urethane compound | UB-1 | 28 | 0 | 0 | 0 | 0 | 0 | 0 | 0 |
|  | UB-2 | 0 | 28 | 0 | 0 | 0 | 0 | 0 | 0 |
|  | UB-3 | 0 | 0 | 28 | 0 | 0 | 0 | 0 | 0 |
|  | UB-4 | 0 | 0 | 0 | 28 | 0 | 0 | 0 | 0 |
|  | UB-5 | 0 | 0 | 0 | 0 | 28 | 0 | 0 | 0 |
|  | UB-6 | 0 | 0 | 0 | 0 | 0 | 28 | 0 | 0 |
|  | R-5 | 0 | 0 | 0 | 0 | 0 | 0 | 28 | 0 |
|  | R-6 | 0 | 0 | 0 | 0 | 0 | 0 | 0 | 28 |
| (B) Polymerization initiator | HABI *1 | 3 | 3 | 3 | 3 | 3 | 3 | 3 | 3 |
|  | EMK *2 | 0.5 | 0.5 | 0.5 | 0.5 | 0.5 | 0.5 | 0.5 | 0.5 |
| (C) Reactive monomer | TMPT *3 | 3 | 3 | 3 | 3 | 3 | 3 | 3 | 3 |
| (D) Pigment | CB *4 | 42 | 42 | 42 | 42 | 42 | 42 | 42 | 42 |
| (E) Organic solvent | PMA *5 | 170 | 170 | 170 | 170 | 170 | 170 | 170 | 170 |
|  | CH *6 | 80 | 80 | 80 | 80 | 80 | 80 | 80 | 80 |
| (F) Multifunctional thiol | TPMB *7 | 2 | 2 | 2 | 2 | 2 | 2 | 2 | 2 |
| Dispersant |  | 4.2 | 4.2 | 4.2 | 4.2 | 4.2 | 4.2 | 4.2 | 4.2 |

*1 2,2'-bis(o-chlorophenyl)-4,4',5,5'-tetraphenyl-1,2'-bisimidazole
*2 4,4'-bis(diethylamino)benzophenone
*3 trimethylolpropane triacrylate
*4 carbon black
*5 propylene glycol monomethyl acetate
*6 cyclohexanone
*7 trimethylolpropane tris-3-mercaptobutyrate (2-3) Evaluation The black curable compositions prepared in (2-2) above were filtered through a filter with a pore size of 0.8 μm (Kiriyama filter paper for GFP) and were evaluated for photosensitivity and resist properties (OD (optical density), reflectance and pencil hardness) by the following methods. The results are shown in Table 5. The details of the evaluation methods are as follows.

<Evaluation of Photosensitivity>

The above curable compositions were applied to glass substrates (measuring 100 mm×100 mm) by spin coating, were dried at room temperature for 30 minutes, and were prebaked at 70° C. for 20 minutes. After the thicknesses of the resists were measured using a thickness gauge (SURFCOM 130A, manufactured by Tokyo Seimitsu Co., Ltd.), the resists were optically cured using an exposure system incorporating an ultrahigh-pressure mercury lamp (the trade name MULTI-LIGHT ML-251A/B, manufactured by Ushio Inc.) with varying amounts of exposure. The resists were then subjected to alkali development at 25° C. using an alkali developer (0.1% potassium carbonate aqueous solution, DEVELOPER 9033, manufactured by Shipley Far East Ltd.) for a predetermined period of time. After the alkali development, the glass substrates were rinsed and dried by air spraying, and the thicknesses of the remaining resists were measured. The amount of exposure at which the value (remaining film sensitivity) calculated by the following formula was 95% or higher was determined as the photosensitivity of the curable compositions:

remaining film sensitivity (%)=[(thickness after alkali development)/(thickness before alkali development)]×100.

<Evaluation of Resist Properties>

The above curable compositions were applied to glass substrates (measuring 100 mm×100 mm) by spin coating, were dried at room temperature for 30 minutes, and were prebaked at 70° C. for 20 minutes. The resists were optically cured by the amounts of exposure that were twice the photosensitivity of the compositions using an ultrahigh-pressure mercury lamp and were postbaked at 200° C. for 30 minutes, and the resultant resist-coated glass substrates were subjected to the following evaluations.

OD (Optical Density)

The transmittance at 550 nm of a standard substrate of known OD was measured to prepare a calibration curve. Next, the transmittances at 550 nm of the resist-coated glass substrates of the examples and the comparative examples were measured to calculate the OD thereof.

Flexibility

A mandrel bending test was carried out according to JIS K 5400-5-1. The mandrel used had a diameter of 3 mm, and the evaluation was carried out five times. The evaluation criteria are as follows:
A: No sample was cracked.
B: One or more of the five samples were cracked.
C: All samples were cracked.

Adhesion Strength

A cross-cut adhesion test was carried out according to JIS K 5400-1990 to evaluate the adhesion strengths of the resultant cured coatings. The substrates used were formed of soda glass (manufactured by Hiraoka Glass Industry. Co., Ltd.). A grid of nine squares (3×3) was formed, and the number of remaining squares of the nine squares was counted.

Reflectance

The reflectances of the resists at 550 nm were measured using a spectrophotometer (UV-3100PC, manufactured by Shimadzu Corporation).

TABLE 5

|  | Example 13 | Example 14 | Example 15 | Example 16 | Example 17 | Example 18 | Comparative Example 4 | Comparative Example 5 |
|---|---|---|---|---|---|---|---|---|
| OD | 3.1 | 3.1 | 3.1 | 3.1 | 3.2 | 3.2 | 3.0 | 3.0 |
| Sensitivity (mJ/cm$^2$) | 80 | 80 | 80 | 90 | 80 | 80 | 80 | 80 |

TABLE 5-continued

|  | Example 13 | Example 14 | Example 15 | Example 16 | Example 17 | Example 18 | Comparative Example 4 | Comparative Example 5 |
|---|---|---|---|---|---|---|---|---|
| Flexibility | A | A | A | A | A | A | B | B |
| Adhesion strength | 9/9 | 9/9 | 9/9 | 9/9 | 9/9 | 9/9 | 0/9 | 0/9 |
| Reflectance | 2.0 | 1.9 | 2.0 | 1.8 | 2.0 | 2.0 | 2.0 | 2.0 |

Examples 13 to 18 were comparable in sensitivity, flexibility and reflectance to Comparative Examples 4 and 5, but achieved better results particularly in adhesion. Examples 13 to 18 were also superior in OD, probably because the ethylene-glycol backbone, which is a polar structure, improved the dispersibility of the pigment.

3. Curable Composition for Solder Resists (3-1) Preparation of Curable Composition for Solder Resists Examples 19 to 24 and Comparative Examples 6 and 7

Compositions were prepared by mixing the individual components according to the compositions (parts by mass) shown in Table 6. The thermosetting polymer (G) used was bisphenol-A epoxy resin, namely, EPICLON 860 (manufactured by Dainippon Ink and Chemicals Inc.). The photoinitiators (B') used were 2,4,6-trimethylbenzoylphenylphosphine oxide, namely, TPO (manufactured by BASF Japan Ltd.) and 4,4'-bis(diethylamino)benzophenone, namely, EAB-F (manufactured by Hodogaya Chemical Co., Ltd.). The thermal polymerization catalyst (H) used was melamine, namely, PC-1 (manufactured by Nissan Chemical Industries, Ltd.).

(3-2) Evaluation (Preparation of Curable Composition Coating)

Boards were prepared by adding methylcellosolve acetate to the curable compositions prepared according to the compositions shown in Table 6 to a viscosity of 5,000 mPa·s, applying the compositions by screen printing to a thickness of 30 μm on printed boards having a copper foil, with a thickness of 35 μm, laminated on one side of a polyimide film with a thickness of 50 μm (UPISEL (registered trademark) N, manufactured by Ube Industries, Ltd., which was cleaned with a 1% sulfuric acid aqueous solution, was rinsed, and was dried by airflow), and drying the coatings at 70° C.

(Exposure and Development)

The resultant laminate test pieces were exposed at 500 mJ/cm$^2$ through a negative pattern having a square measuring 1 cm×1 cm in a region measuring 4 cm×6 cm using an exposure system having a metal halide lamp (HMW-680GW, manufactured by Orc Manufacturing Co., Ltd.). Next, the test pieces were subjected to development by spraying a 1% by mass sodium carbonate aqueous solution at 30° C. for 60 seconds to remove unexposed portions and were heated at 150° C. for 30 minutes, thus preparing copper-laminated boards having a copper foil exposed in a square measuring 1 cm×1 cm.

(Gold Plating Resistance)

The above copper-laminated boards were subjected to electroless gold plating by the following process, and the test pieces were evaluated for changes in external appearance and were also evaluated for the degree of peeling of the resists by a peeling test using Cellotape (registered trademark) according to the following criteria. The results are shown in Table 6.

A: The external appearance did not change, and the resist did not peel at all.

B: The external appearance did not change, but the resist peeled slightly.

C: It was found that the resist was curled and that the plating intruded between the resist and the copper foil, and the resist peeled noticeably in the peeling test.

TABLE 6

|  |  | Ex. 19 | Ex. 20 | Ex. 21 | Ex. 22 | Ex. 23 | Ex. 24 | Comp. Ex. 6 | Comp. Ex. 7 |
|---|---|---|---|---|---|---|---|---|---|
| (A) Reactive urethane compound | UB-1 | 80 | 0 | 0 | 0 | 0 | 0 | 0 | 0 |
|  | UB-2 | 0 | 80 | 0 | 0 | 0 | 0 | 0 | 0 |
|  | UB-3 | 0 | 0 | 80 | 0 | 0 | 0 | 0 | 0 |
|  | UB-4 | 0 | 0 | 0 | 80 | 0 | 0 | 0 | 0 |
|  | UB-5 | 0 | 0 | 0 | 0 | 80 | 0 | 0 | 0 |
|  | UB-6 | 0 | 0 | 0 | 0 | 0 | 80 | 0 | 0 |
|  | R-4 | 0 | 0 | 0 | 0 | 0 | 0 | 80 | 0 |
|  | R-5 | 0 | 0 | 0 | 0 | 0 | 0 | 0 | 80 |
| (B) Polymerization initiator | TPO | 2 | 2 | 2 | 2 | 2 | 2 | 2 | 2 |
|  | EMK *2 | 2 | 2 | 2 | 2 | 2 | 2 | 2 | 2 |
| (G) Thermosetting polymer | EPICON860 | 14 | 14 | 14 | 14 | 14 | 14 | 14 | 14 |
| (H) Thermal polymerization catalyst | PC-1 | 2 | 2 | 2 | 2 | 2 | 2 | 2 | 2 |
| Plating resistance |  | A | A | A | A | A | A | B | B |

*2 4,4'-bis(diethylamino)benzophenone

A comparison between Examples 19 to 24 and Comparative Examples 6 and 7 shows that containing the ethylenically-unsaturated-group containing reactive urethane compounds of the present invention improves gold plating resistance.

4. Composition for Coating (4-1) Preparation of Composition for Coating

Examples 25 to 30 and Comparative Examples 8 to 11

As shown in Table 7, reactive urethane compounds (A) and reactive compounds for comparison were mixed with 1-hydroxycyclohexyl phenyl ketone (Irgacure 184, manufactured by Ciba Specialty Chemicals K.K.), serving as the photoinitiator (B'), and were homogeneously dissolved by adding 50 parts by mass of dichloromethane (manufactured by Junsei Chemical Co., Ltd.) and mixing and stirring them at room temperature. Subsequently, dichloromethane was removed by vacuum drying at 40° C., thus yielding curable composition solutions.

Table 8 shows the reactive urethane compounds (A) used and the reactive compounds used for comparison. In addition, as a typical case, Table 9 shows a method for calculating the SP of the reactive urethane compound (M-4) used in Example 26.

(4-2) Evaluation of Curable Composition

<Adhesion Strength>

The curable compositions prepared in (4-1) were applied onto polyethylene terephthalate (PET) substrates (measuring 50 mm×50 mm) so that the dry-film thickness was about 50 μm and were cured by exposure at 500 mJ/cm$^2$ using an exposure system incorporating an ultrahigh-pressure mercury lamp. The PET substrates selected were those having crystalline surfaces and those having noncrystalline surfaces. As the substrates having crystalline surfaces, biaxially stretched PET films, namely, COSMOSHINE A4100 (manufactured by Toyobo Co., Ltd.), were used. Although one side is normally a surface subjected to adhesion-improving treatment for ensuring adhesion, the opposite untreated surface was used as the surface for adhesion. As the substrates having noncrystalline surfaces, PET standard test panels (50 mm×50 mm) manufactured by Nippon Testpanel Co., Ltd. were used. The surfaces of the cured films of the samples were polished with sand paper, and the adhesion strengths thereof were measured using an adhesion tester (Elcometor, manufactured by Elcometer Instrument, Std.) with a jig thereof fixed by curing an epoxy adhesive (HC-1210, manufactured by Mitsui Chemicals, Inc.). The results are shown in Table 7.

<Curling>

The curable compositions prepared in (4-1) were applied onto 3 cm square polyimide films so that the cured films had a thickness of about 30 μm. Subsequently, the coatings were cured by exposure at 1,000 mJ/cm$^2$ using an exposure system incorporating an ultrahigh-pressure mercury lamp. The heights of curled four sides of each cured film were measured on a horizontal stage, and the average height thereof was determined as the value of curling. The results are shown in Table 7.

TABLE 7

| | | Ex. 25 | Ex. 26 | Ex. 27 | Ex. 28 | Ex. 29 | Ex. 30 | Comp. Ex. 8 | Comp. Ex. 9 | Comp. Ex. 10 | Comp. Ex. 11 |
|---|---|---|---|---|---|---|---|---|---|---|---|
| Composition | M-3 | 98 | | | | | | | | | |
| | M-4 | | 98 | | | | | | | | |
| | M-2 | | | 98 | 49 | 29.4 | 19.6 | | | | |
| | M-6 | | | | 49 | 68.6 | 78.4 | | | | |
| | M-1 | | | | | | | 98 | | | |
| | M-7 | | | | | | | | 98 | | |
| | M-8 | | | | | | | | | 98 | |
| | M-9 | | | | | | | | | | 98 |
| | Irgacure184 | 2 | 2 | 2 | 2 | 2 | 2 | 2 | 2 | 2 | 2 |
| Properties | SP | 10.6 | 10.8 | 11 | 10.7 | 10.6 | 10.5 | 11.2 | 11.3 | 11.1 | 11.1 |
| | Curling (mm) | 2.9 | 3.8 | 0.8 | 1.9 | 2.7 | 2.7 | 3.9 | 7.5 | 10.5 | 10.5 |
| | PET film adhesion strength (N/mm$^2$) | 1.5 | 1.3 | 0.9 | 1.0 | 0.9 | 0.9 | 0.8 | 0.6 | 0 | 0 |
| | PET panel adhesion strength (N/mm$^2$) | | | | 1.6 | 1.7 | 1.5 | | | | |

TABLE 8

Ethylenically-unsaturated-group containing reactive urethane compound

M-2 Same as M-2 in Table 1
M-3 Same as M-3 in Table 1
M-4 Same as M-4 in Table 1

Reactive urethane compound for comparison

R-1 Same as R-1 in Table 2

R-6
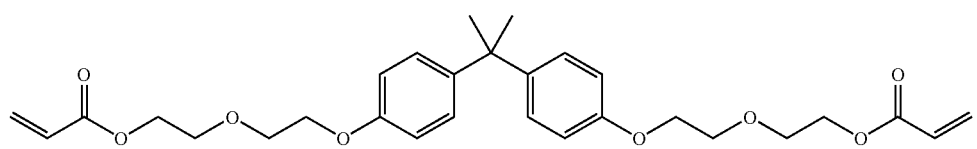 [SMILES: C=CC(=O)OCCOCCOc1ccc(C(C)(C)c2ccc(OCCOCCOC(=O)C=C)cc2)cc1]

TABLE 8-continued

Ethylenically-unsaturated-group containing reactive urethane compound

R-7
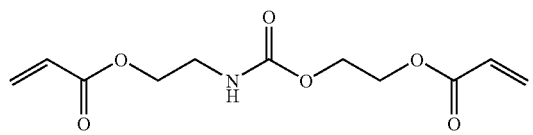 [SMILES: C=CC(=O)OCCNC(=O)OCCOC(=O)C=C]

R-8
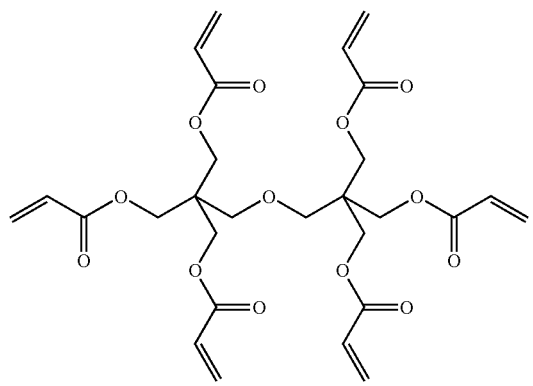 [SMILES: C=CC(=O)OCC(COCC(COC(=O)C=C)(COC(=O)C=C)COC(=O)C=C)(COC(=O)C=C)COC(=O)C=C]

R-9
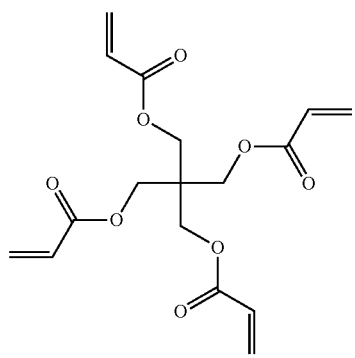 [SMILES: C=CC(=O)OCC(COC(=O)C=C)(COC(=O)C=C)COC(=O)C=C]

TABLE 9

| Atom or group | Evaporation energy Δe cal/mol | Molar volume Δv cal/mol | Number | M-4 Δe$_i$ | Δv$_i$ |
|---|---|---|---|---|---|
| —CH$_3$ | 1125 | 33.5 | 2 | 2250 | 67 |
| —CH$_2$— | 1180 | 16.1 | 14 | 16520 | 225.4 |
| H$_2$C= | 1030 | 28.5 | 2 | 2060 | 57 |
| =C= | 1030 | −5.5 | 2 | 2060 | −11 |
| —CO | 4150 | 10.8 | 4 | 16600 | 43.2 |
| —NH | 2000 | 4.5 | 2 | 4000 | 9 |
| —O— | 800 | 3.8 | 6 | 4800 | 22.8 |
| Σ | | | | 48290 | 413.4 |
| SP δ = (ΣΔe$_i$/Σδv$_i$)$^{1/2}$ | | | | 10.81 | |

(4-3) Evaluation Results of Curable Composition

According to Examples 25 to 30 and Comparative Examples 8 to 11, the strength of adhesion to the PET film substrates was improved as the SP of the ethylenically-unsaturated-group containing reactive urethane compounds approached that of the PET film substrates, namely, about 10.7. In particular, Example 25 had a low value in curling; it seems that this affected the further improvement in adhesion strength.

According to Examples 28 to 30, the adhesion strength could be improved using the reactive urethane compounds (A) of the present invention in combination with an acrylic monomer as the reactive monomer (C) so that the total SP of the reactive urethane compounds approached that of the PET substrates, namely, about 10.7. The above results show that the total SP of the reactive urethane compounds is preferably 10.5 to 11.0. If the SP falls within this range, the strength of adhesion to PET film substrates is 0.9 N/mm² or more.

The invention claimed is:

1. A curable composition containing an ethylenically-unsaturated-group containing reactive urethane compound (A) represented by formula (II) and a polymerization initiator (B):

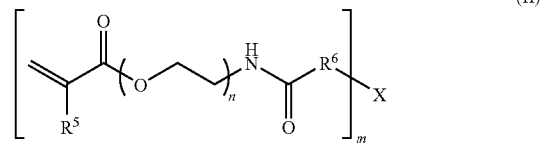

wherein R$^5$ is a hydrogen atom or a methyl group; R$^6$ is an oxygen atom, a sulfur atom, or an imino group; n is 2; m is an integer of 1 to 300; and X is a polymer compound residue that has repeating units containing a functional group having active hydrogen, wherein the functional group having active hydrogen is a hydroxyl group, and the polymer compound is a polyhydroxy compound, wherein the polyhydroxy compound is a polyester polyol compound, a polycarbonate polyol compound, a polyurethane polyol compound, a homopolymer or copolymer of a hydroxyalkyl(meth)acrylate, or an epoxy (meth)acrylate compound.

2. The curable composition according to claim 1, further containing a reactive monomer (C), wherein the reactive monomer (C) is a compound having at least one ethylenically unsaturated group, where the reactive urethane compound (A) of formula (II) is excluded.

3. The curable composition according to claim 2, wherein the ethylenically-unsaturated-group containing reactive urethane compound (A) and the reactive monomer (C) have a total solubility parameter calculated by Fedors method of 10.5 to 11.0.

4. The curable composition according to claim 1, wherein the ethylenically-unsaturated-group containing reactive urethane compound (A) has a solubility parameter calculated by Fedors method of 10.5 to 11.0.

* * * * *